(12) United States Patent
Yang et al.

(10) Patent No.: US 12,347,382 B2
(45) Date of Patent: *Jul. 1, 2025

(54) DISPLAY DEVICE

(71) Applicant: Samsung Display Co., Ltd., Yongin-Si (KR)

(72) Inventors: Jin Wook Yang, Yongin-si (KR); Dong Gyu Lee, Yongin-si (KR); Jae Hyeon Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/621,523

(22) Filed: Mar. 29, 2024

(65) Prior Publication Data

US 2024/0242674 A1 Jul. 18, 2024

Related U.S. Application Data

(63) Continuation of application No. 18/092,400, filed on Jan. 2, 2023, now Pat. No. 11,961,474.

(30) Foreign Application Priority Data

Mar. 25, 2022 (KR) .................... 10-2022-0037630

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *H10D 86/481* (2025.01);
(Continued)

(58) Field of Classification Search
CPC ......... G09G 3/3233; G09G 2300/0852; G09G 3/3266; G09G 2300/0819;
(Continued)

(56) References Cited

U.S. PATENT DOCUMENTS 10,861,393 B2 12/2020 Kim et al.
10,909,918 B2 2/2021 Kim et al.
(Continued)

FOREIGN PATENT DOCUMENTS

EP 1591993 A1 11/2005
EP 3343552 A1 7/2018
(Continued)

OTHER PUBLICATIONS

U.S Final Office Action dated May 1, 2024 issued for the cross-referenced U.S. Appl. No. 18/133,615.
(Continued)

*Primary Examiner* — Muhammad N Edun
(74) *Attorney, Agent, or Firm* — Innovation Counsel LLP

(57) ABSTRACT

A display device is disclosed that includes a pixel. The pixel includes a first transistor connected between a second node and a third node and including a gate electrode connected to a first node. A first capacitor is formed between the first node and a fourth node. A second capacitor is formed between the fourth node and a first power line. A second transistor is connected between a data line and the fourth node. An eighth transistor is connected between the first power line and the second node. A ninth transistor is connected between the second node and a bias power line. A sixth transistor is connected between the third node and a fifth node. A light emitting element is electrically connected between the fifth node and a second power line. A gate electrode of the eighth transistor and a gate electrode of the sixth transistor are connected to different gate lines.

28 Claims, 39 Drawing Sheets

(51) Int. Cl.
*H10D 86/40* (2025.01)
*H10D 86/60* (2025.01)

(52) U.S. Cl.
CPC ..... *H10D 86/60* (2025.01); *G09G 2300/0819* (2013.01); *G09G 2300/0852* (2013.01); *G09G 2300/0861* (2013.01); *G09G 2310/08* (2013.01); *G09G 2320/0233* (2013.01)

(58) Field of Classification Search
CPC ....... G09G 2300/0861; G09G 2310/08; G09G 2320/0233; H01L 27/1255
See application file for complete search history.

(56) References Cited

U.S. PATENT DOCUMENTS

| | | |
|---|---|---|
| 11,049,458 B1 | 6/2021 | Fan et al. |
| 11,056,060 B2 | 7/2021 | Kim et al. |
| 11,158,261 B2 | 10/2021 | Kim et al. |
| 11,185,772 B2 | 11/2021 | Lee et al. |
| 11,217,149 B2 | 1/2022 | In et al. |
| 11,263,976 B2 | 3/2022 | Yang et al. |
| 11,295,673 B2 | 4/2022 | Park et al. |
| 11,417,283 B2 | 8/2022 | Son et al. |
| 11,922,866 B1 | 3/2024 | Sohn et al. |
| 2003/0197473 A1 | 10/2003 | Kitahara |
| 2006/0164359 A1 | 7/2006 | Kimura |
| 2008/0111774 A1 | 5/2008 | Iida et al. |
| 2011/0193855 A1 | 8/2011 | Han |
| 2011/0199357 A1 | 8/2011 | Chung et al. |
| 2014/0192037 A1 | 7/2014 | Chung |
| 2015/0348464 A1 | 12/2015 | In et al. |
| 2016/0055792 A1 | 2/2016 | Lee et al. |
| 2016/0133191 A1 | 5/2016 | Kang et al. |
| 2017/0061876 A1 | 3/2017 | Cho et al. |
| 2017/0124954 A1 | 5/2017 | Park et al. |
| 2017/0199616 A1 | 7/2017 | Kim et al. |
| 2018/0293939 A1 | 10/2018 | Kim et al. |
| 2019/0096330 A1 | 3/2019 | Kim et al. |
| 2019/0147796 A1 | 5/2019 | Rha et al. |
| 2019/0172888 A1 | 6/2019 | Choi et al. |
| 2019/0295470 A1 | 9/2019 | Kim et al. |
| 2020/0036818 A1 | 1/2020 | Fisher et al. |
| 2020/0202771 A1 | 6/2020 | Takasugi |
| 2020/0221554 A1 | 7/2020 | Chiang et al. |
| 2020/0258451 A1 | 8/2020 | Takahara et al. |
| 2020/0302860 A1 | 9/2020 | Kim et al. |
| 2021/0027719 A1 | 1/2021 | Cho et al. |
| 2021/0049958 A1 | 2/2021 | Kim et al. |
| 2021/0049965 A1 | 2/2021 | Jeon et al. |
| 2021/0065619 A1 | 3/2021 | Kim et al. |
| 2021/0065628 A1 | 3/2021 | Kim et al. |
| 2021/0142735 A1 | 5/2021 | Cho et al. |
| 2021/0193040 A1 | 6/2021 | Na |
| 2021/0248961 A1 | 8/2021 | Yang et al. |
| 2021/0375192 A1 | 12/2021 | Jeon et al. |
| 2021/0376041 A1 | 12/2021 | Lee et al. |
| 2022/0270542 A1 | 8/2022 | Park et al. |
| 2024/0096265 A1 | 3/2024 | Sohn et al. |
| 2024/0105104 A1 | 3/2024 | Park et al. |

FOREIGN PATENT DOCUMENTS

| | | | |
|---|---|---|---|
| KR | 10-2010-0072433 A | 7/2010 | |
| KR | 10-2011-0091293 A | 8/2011 | |
| KR | 10-20110122410 A | 11/2011 | |
| KR | 10-1816891 B1 | 1/2018 | |
| KR | 10-2018-0078109 A | 7/2018 | |
| KR | 10-2018-0114981 A | 10/2018 | |
| KR | 10-2019-0034375 A | 4/2019 | |
| KR | 10-2019-0053552 A | 5/2019 | |
| KR | 10-1978798 B1 | 5/2019 | |
| KR | 10-2020-0142646 A | 12/2020 | |
| KR | 10-2021-0019635 A | 2/2021 | |
| KR | 10-2021-0019639 A | 2/2021 | |
| KR | 10-20210045805 A | 4/2021 | |
| KR | 10-2021-0054114 A | 5/2021 | |
| KR | 10-2021-0100785 A | 8/2021 | |
| KR | 10-20210106052 A | 8/2021 | |
| KR | 10-2438199 B1 | 8/2022 | |

OTHER PUBLICATIONS

Korean Notice of Allowance corresponding to Application No. 10-2020-0014326 and issued on Sep. 13, 2024, 6 pages.

Vs = VDD
Vg = VINIT
Va = VREF

FIG. 26
<CASE1>                    <CASE2>
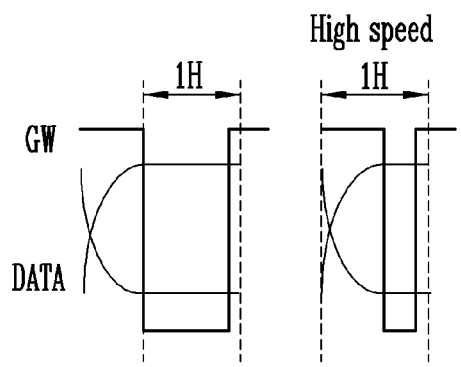 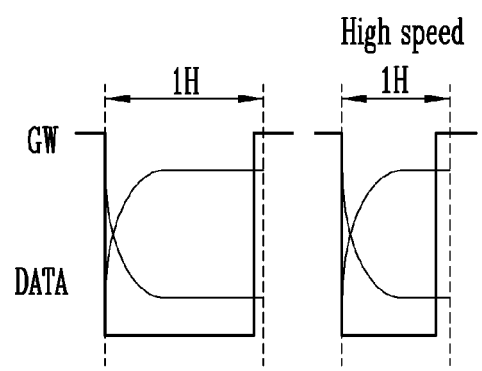
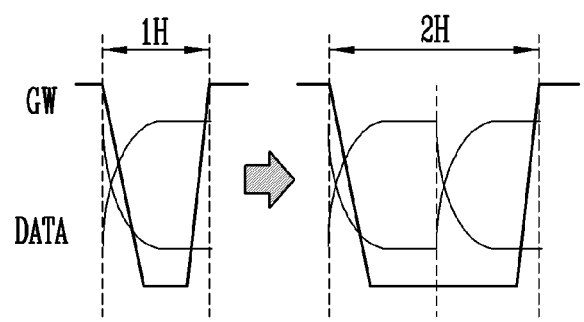
FIG. 27
<CASE3>                    <CASE4>
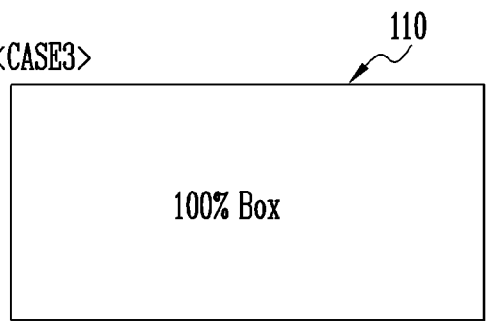 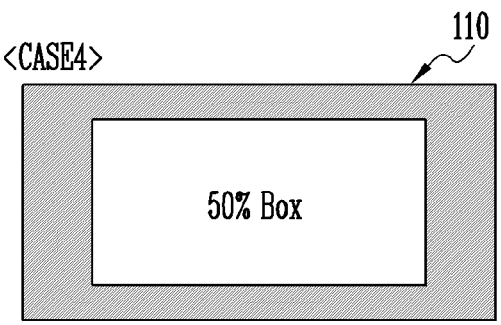

DISPLAY DEVICE

CROSS-REFERENCE TO RELATED APPLICATION

The present application is a continuation of U.S. patent application Ser. No. 18/092,400 filed on Jan. 2, 2023, now U.S. Pat. No. 11,961,474, which claims priority under 35 U.S.C. § 119(a) to Korean patent application No. 10-2022-0037630 filed on Mar. 25, 2022, in the Korean Intellectual Property Office, the entire disclosures of which are incorporated herein by reference.

BACKGROUND

1. Technical Field

The present disclosure generally relates to a display device.

2. Related Art

A display device includes pixels, and each of the pixels includes a light emitting diode emitting light with a luminance corresponding to a driving current and a driving transistor for adjusting the driving current in response to a data voltage. Since a threshold voltage of the driving transistor varies, the display device compensates for a data voltage by the threshold voltage of the driving transistor while writing the data voltage to the pixel during a data writing period.

Meanwhile, as the resolution and driving frequency (or refresh rate of an image) of the display device increases, the width of the data writing period becomes narrow, and therefore, the data voltage may not be appropriately compensated during the data writing period. Accordingly, various techniques for compensating for a data voltage, corresponding to an increase in resolution and driving frequency of the display device, have been researched.

SUMMARY

Embodiments may provide a display device capable of sufficiently compensating for a data voltage by considering a threshold voltage of a driving transistor.

Embodiments may also provide a display device capable of displaying an image with a constant luminance even when a driving frequency is changed.

In accordance with an embodiment of the present disclosure, there is provided a display device including a pixel, wherein the pixel includes: a first transistor including a gate electrode electrically connected to a first node, a first electrode electrically connected to a second node, and a second electrode electrically connected to a third node; a first capacitor formed between the first node and a fourth node; a second capacitor formed between the fourth node and a first power line; a second transistor including a gate electrode electrically connected to a first gate line, a first electrode electrically connected to a data line, and a second electrode electrically connected to the fourth node; an eighth transistor including a gate electrode electrically connected to a fourth gate line, a first electrode electrically connected to the first power line, and a second electrode electrically connected to the second node; a ninth transistor including a gate electrode electrically connected to a sixth gate line, a first electrode electrically connected to the second node, and a second electrode electrically connected to a bias power line; a sixth transistor including a gate electrode electrically connected to a fifth gate line, a first electrode electrically connected to the third node, and a second electrode electrically connected to a fifth node; and a light emitting element electrically connected between the fifth node and a second power line, and wherein the fifth gate line is different from the fourth gate line.

The display device may further include: a third transistor including a gate electrode electrically connected to a third gate line, a first electrode electrically connected to the first node, and a second electrode electrically connected to the third node; and a fourth transistor including a gate electrode electrically connected to a second gate line, a first electrode electrically connected to the first node, and a second electrode electrically connected to a first initialization power line.

The display device may further include a fifth transistor including a gate electrode electrically connected to the third gate line, a first electrode electrically connected to the fourth node, and a second electrode electrically connected to a third power line.

The first power line and the third power line may be operable to provide power voltages equal to or different from each other.

The display device may further include a seventh transistor including a gate electrode electrically connected to the sixth gate line, a first electrode electrically connected to the fifth node, and a second electrode electrically connected to a second initialization power line.

At least one of the second transistor, the third transistor, the fourth transistor, and the fifth transistor may be implemented as a dual gate transistor including a plurality of sub-transistors connected in series.

The display device may further include a gate driver. The gate driver may be operable to alternately provide a gate-on voltage to the second gate line and the third gate line in a non-emission period of one frame, and provide the gate-on voltage to the third gate line twice or more in the non-emission period.

The gate driver may provide a second emission control signal having a gate-off voltage to the fifth gate line in the non-emission period, provide a compensation gate signal having a pulse of the gate-on voltage to the third gate line in each of a second period and a fourth period, provide an initialization gate signal having the pulse of the gate-on voltage to the second gate line in a third period, and provide a write gate signal having the pulse of the gate-on voltage to the first gate line in a fifth period. The non-emission period may include a first period, the second period, the third period, the fourth period, the fifth period, and a sixth period, which do not overlap with each other and are sequentially arranged.

The gate driver may be operable to provide the initialization gate signal having the pulse of the gate-on voltage to the second gate line in the first period.

A pulse width of the compensation gate signal and a pulse width of the initialization gate signal may be the same. A pulse width of the write gate signal may be smaller than the pulse width of the compensation gate signal.

The gate driver may be operable to provide a first emission control signal having the gate-on voltage to the fourth gate line in the first to fourth periods, and provide the first emission control signal having the gate-off voltage to the fourth gate line in the fifth period and the sixth period.

The gate driver may provide a bias control signal having the pulse of the gate-on voltage to the sixth gate line in the sixth period.

A pulse width of the bias control signal may be greater than the pulse width of the write gate signal.

The bias control signal may have a plurality of pulses in the sixth period.

A pulse width of the write gate signal may be greater than 1 horizontal period.

A pulse width of the compensation gate signal and a pulse width of the initialization gate signal may be different from each other.

The display device may further include a seventh transistor including a gate electrode electrically connected to a bypass control line different from the sixth gate line, a first electrode electrically connected to the fifth node, and a second electrode electrically connected to a second initialization power line.

The display device may further include a seventh transistor including a gate electrode electrically connected to the sixth gate line, a first electrode electrically connected to the fifth node, and a second electrode electrically connected to the first initialization power line.

The display device may further include a fifth transistor including a gate electrode electrically connected to the third gate line, a first electrode electrically connected to the fourth node, and a second electrode electrically connected to the second node.

The display device may further include a seventh transistor including a gate electrode electrically connected to the sixth gate line, a first electrode electrically connected to the fifth node, and a second electrode electrically connected to a second initialization power line.

The display device may further include a seventh transistor include a gate electrode electrically connected to the sixth gate line, a first electrode electrically connected to the fifth node, and a second electrode electrically connected to the first initialization power line.

In accordance with another embodiment of the present disclosure, there is provided a display device including a pixel, wherein the pixel includes: a first transistor including a gate electrode electrically connected to a first node, a first electrode electrically connected to a second node, and a second electrode electrically connected to a third node; a first capacitor formed between the first node and a fourth node; a second capacitor formed between the fourth node and a first power line; a second transistor including a gate electrode electrically connected to a first gate line, a first electrode electrically connected to a data line, and a second electrode electrically connected to the fourth node; a third transistor including a gate electrode electrically connected to a third gate line, a first electrode electrically connected to the first node, and a second electrode electrically connected to the third node; a fourth transistor including a gate electrode electrically connected to a second gate line, a first electrode electrically connected to the first node, and a second electrode electrically connected to a first initialization power line; an emission transistor including a gate electrode electrically connected to a fifth gate line, a first electrode electrically connected to the third node, and a second electrode electrically connected to a fifth node; a seventh transistor including a gate electrode electrically connected to a bypass control line, a first electrode electrically connected to the fifth node, and a second electrode electrically connected to a second initialization power line; and a light emitting element electrically connected between the fifth node and a second power line, and wherein the second initialization power line is different from the first initialization power line.

The display device may further include a fifth transistor including a gate electrode electrically connected to the third gate line, a first electrode electrically connected to the fourth node, and a second electrode electrically connected to a third power line.

The first power line and the third power line may be operable to receive power voltages equal to or different from each other.

The display device may further include a fifth transistor including a gate electrode electrically connected to the third gate line, a first electrode electrically connected to the fourth node, and a second electrode electrically connected to the second node.

In accordance with yet another embodiment of the present disclosure, there is provided a display device including a pixel, wherein the pixel includes: a first transistor including a gate electrode electrically connected to a first node, a first electrode electrically connected to a second node, and a second electrode electrically connected to a third node; a first capacitor formed between the first node and a first power line; a second transistor including a gate electrode electrically connected to a first gate line, a first electrode electrically connected to a data line, and a second electrode electrically connected to the second node; a third transistor including a gate electrode electrically connected to a third gate line, a first electrode electrically connected to the first node, and a second electrode electrically connected to the third node; a fourth transistor including a gate electrode electrically connected to a second gate line, a first electrode electrically connected to the first node, and a second electrode electrically connected to a first initialization power line; a fifth transistor including a gate electrode electrically connected to a fourth gate line, a first electrode electrically connected to the first power line, and a second electrode electrically connected to the second node; a sixth transistor including a gate electrode electrically connected to a fifth gate line, a first electrode electrically connected to the third node, and a second electrode electrically connected to a fifth node; and a light emitting element electrically connected between the fifth node and a second power line, and wherein the fifth gate line is different from the fourth gate line.

The display device may further include a seventh transistor including a gate electrode electrically connected to a sixth gate line, a first electrode electrically connected to the fifth node, and a second electrode electrically connected to a second initialization power line.

The display device may further include a gate driver. The gate driver may provide a second emission control signal having a gate-off voltage to the fifth gate line in the non-emission period, provide an initialization gate signal having a pulse of a gate-on voltage to the second gate line and provides a first emission control signal having the gate-on voltage to the fourth gate line in the first period, and provide a compensation gate signal having the pulse of the gate-on voltage to the third gate line, provides a write gate signal having the pulse of the gate-on voltage to the first gate line, and provides the first emission control signal having the gate-off voltage to the fourth gate line in the second period. The non-emission period of a frame may include the first period, the second period, and a third period, which do not overlap with each other and are sequentially arranged.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 23, 24, 25, 26, 27, 28, 29, and 30 are diagrams illustrating effects of the display device in accordance with the embodiments of the present disclosure.

DETAILED DESCRIPTION

Figure 1:
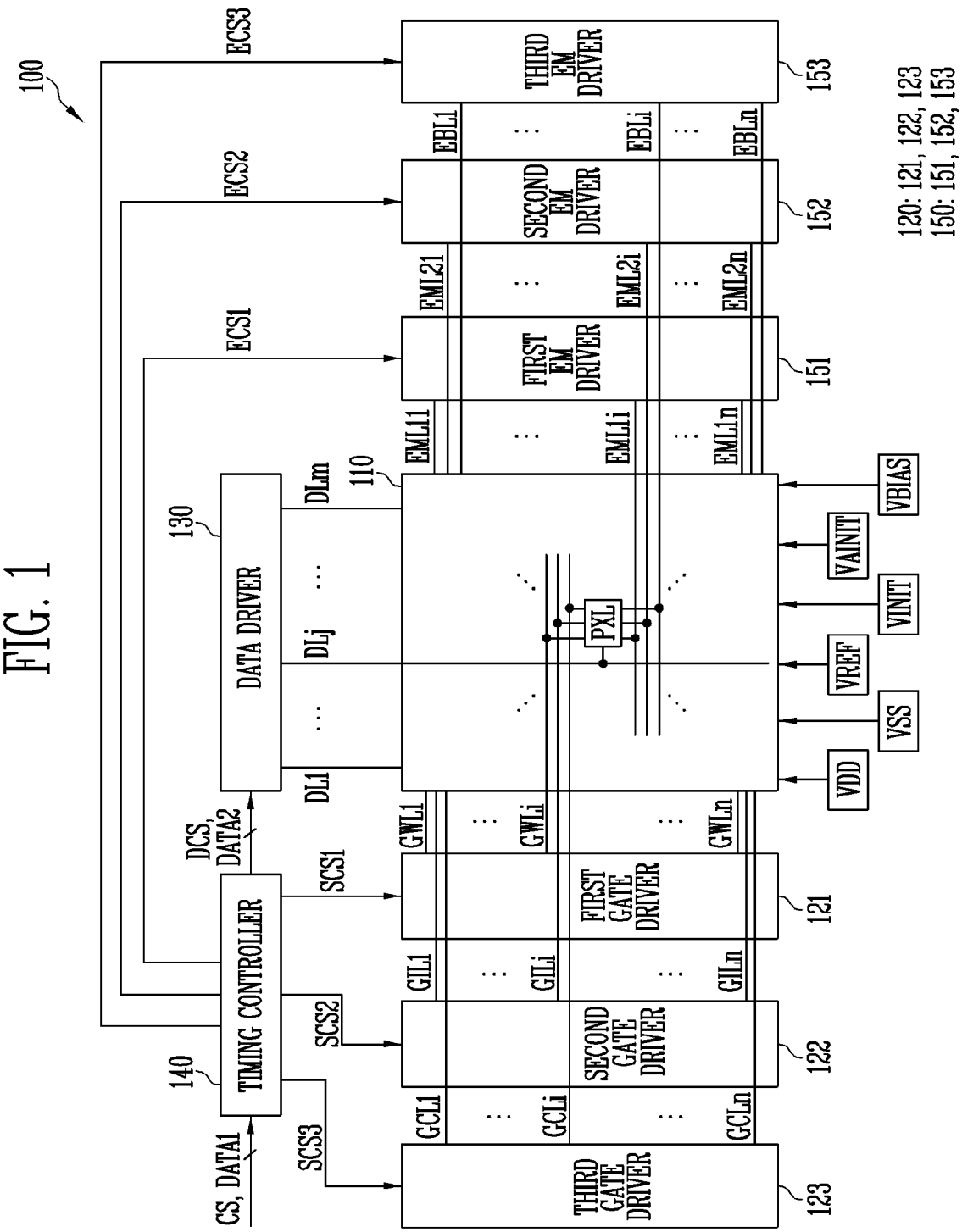
FIGS. 1 and 2 are diagrams illustrating a display device in accordance with embodiments of the present disclosure.

The present disclosure may apply various changes and different forms, therefore only illustrate in details with particular examples.

As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

Some embodiments are described in the accompanying drawings in relation to functional blocks, units, or modules. Those skilled in the art will understand that these blocks, units, or modules are physically implemented by logic circuits, individual components, microprocessors, hard wire circuits, memory elements, line connection, and other electronic circuits. This may be formed by using semiconductor-based manufacturing techniques or other manufacturing techniques. In the case of blocks, units, or modules implemented by microprocessors or other similar hardware, the blocks, units, or modules are programmed and controlled by using software, to perform various functions discussed in the present disclosure, and may be selectively driven by firmware or software. In addition, each block, each unit, or each module may be implemented by dedicated hardware or by a combination of a dedicated hardware to perform some functions of the block, the unit, or the module and a processor (e.g., one or more programmed microprocessors and associated circuitry) to perform other functions of the block, the unit, or the module. In some embodiments, the blocks, the units, or the modules may be physically separated into two or more individual blocks, two or more individual units, or two or more individual modules without departing from the scope of the present disclosure. Also, in some embodiments, the blocks, the units, or the modules may be physically combined into more complex blocks, more complex units, or more complex modules without departing from the scope of the present disclosure.

Meanwhile, the present disclosure is not limited to embodiments disclosed below, and may be implemented in various forms. Each embodiment disclosed below may be independently embodied or be combined with at least another embodiment prior to being embodied.

In the following embodiments and the attached drawings, elements not directly related to the present disclosure are omitted from depiction, and dimensional relationships among individual elements in the attached drawings are illustrated only for ease of understanding but not to limit the actual scale. It should note that in giving reference numerals to elements of each drawing, like reference numerals refer to like elements even though like elements are shown in different drawings.

Figure 2:
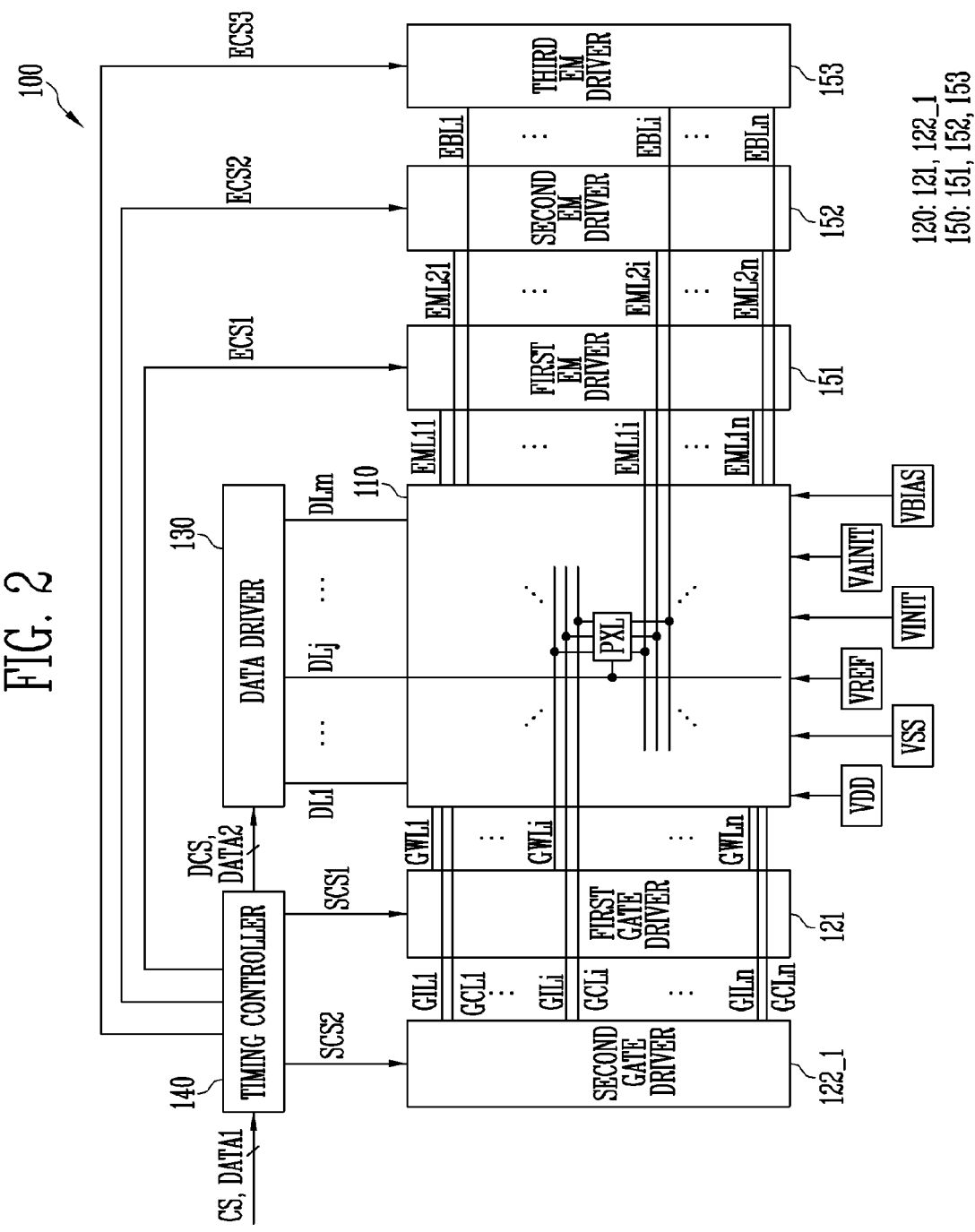

FIGS. 1 and 2 are diagrams illustrating a display device in accordance with embodiments of the present disclosure.

First, referring to FIG. 1, the display device 100 may include a display unit 110 (or display panel), a gate driver 120 (or scan driver or scan gate driver), a data driver 130 (or source driver), a timing controller 140, and an emission (EM) driver 150 (or emission gate driver).

The display unit 110 may include write gate lines GWL1 to GWLn (n is a positive integer) (or first gate lines), initialization gate lines GIL1 to GILn (or second gate lines), compensation gate lines GCL1 to GCLn (or third gate lines), first emission control lines EML11 to EML1n (or first emission gate lines or fourth gate lines), second emission control lines EML21 to EML2n (or second emission gate lines or fifth gate lines), bias control lines EBL1 to EBLn (or bias gate lines, bypass control lines or sixth gate lines), data lines DL1 to DLm (m is a positive integer), and pixels PXL. The write gate lines GWL to GWLn, the initialization gate lines GIL1 to GILn, the compensation gate lines GCL1 to GCLn, the first emission control lines EML11 to EML1n, the second emission control lines EML21 to EML2n, and the bias control lines EBL1 to EBLn (or bypass control line) are merely named while being distinguished from each other according to the purpose of a signal transmitted thereto, and all the lines may be signal transmission lines substantially identical or similar to each other.

The pixels PXL may be disposed in areas (e.g., pixel areas) partitioned by the write gate lines GWL1 to GWLn and the data lines DL1 to DLm.

The pixel PXL may be connected to one of the write gate lines GWL1 to GWLn, one of the initialization gate lines GIL1 to GILn, one of the compensation gate lines GCL1 to GCLn, one of the first emission control lines EML11 to EML1n, one of second emission control lines EML21 to EML2n, one of the bias control lines EBL1 to EBLn, and one of the data lines DL1 to DLm. In description of the embodiments of the present disclosure, the term "connection" may inclusively mean physical or electrical connection. For example, a pixel PXL disposed on an ith pixel row and a jth pixel column may be connected to a write gate line GWLi, an initialization gate line GILi, a compensation gate line GCLi, a first emission control line EML1$i$, a second emission control line EML2$i$, a bias control line EBLi, and a data line DLj. Here, i is a positive integer smaller than or equal to n, and j is a positive integer smaller than or equal to m.

The pixel PXL may perform an initialization operation in which the pixel PXL is initialized in response to an initialization gate signal provided through the initialization gate line GILi, and perform a compensation operation in which a threshold voltage of an internal transistor (e.g., a first transistor T1 shown in FIG. 3) is sampled or compensated in response to a compensation gate signal provided through the compensation gate line GCLi. In some embodiments, the pixel PXL may perform the compensation operation at least twice. Also, the pixel PXL may store or record a data signal provided through the data line DLj in response to a write gate signal. The pixel PXL may initialize an anode electrode of a light emitting element in the pixel PXL in response to a bias control signal provided through the bias control line EBLi. Also, the pixel PXL may apply a constant on-bias voltage to the internal transistor (e.g., the first transistor T1 shown in FIG. 3) in response to the bias control signal. The pixel PXL may emit light with a luminance corresponding to the stored data signal in response to a second emission control signal (or second emission gate signal) provided through a second emission control line EML2$i$. A configuration and an operation of the pixel PXL will be described in detail later with reference to FIGS. 3 and 4.

A first power voltage VDD, a second power voltage VSS, a reference voltage VREF, a first initialization voltage VINIT, a second initialization voltage VAINIT, and a bias voltage VBIAS may be provided to the display unit 110. The first power voltage VDD, the second power voltage VSS, the reference voltage VREF, the first initialization voltage VINIT, the second initialization voltage VAINIT, and the bias voltage VBIAS are voltages that may be provided for operation of the pixel PXL, and may be provided to the display unit 110 from a separate power supply (e.g., PM IC). The first power voltage VDD may have a voltage level higher than a voltage level of the second power voltage VSS. The reference voltage VREF may be a DC voltage which has a voltage level equal to the voltage level of the first power voltage VDD or have a specific voltage level. The first initialization voltage VINIT and the second initialization voltage VAINIT may have a voltage level lower than a voltage level of the data signal. The first initialization voltage VINIT and the second initialization voltage VAINIT may have voltage levels equal to or different from each other. The bias voltage VBIAS is a voltage for maintaining a transistor in the pixel PXL to be in a specific on-bias state. For example, the bias voltage VBIAS may have a voltage level capable of shifting a threshold voltage (e.g., a threshold voltage shifted in a positive direction while the pixels PXL emits light) of the transistor in a negative direction.

The gate driver 120 may generate a write gate signal (or a first gate signal), an initialization gate signal (or second gate signal), and a compensation gate signal (or third gate signal), based on scan control signals SCS1 to SCS3. The gate driver 120 may sequentially provide the write gate signal to the write gate lines GWL1 to GWLn, sequentially provide the initialization gate signal to the initialization gate lines GIL1 to GILn, and sequentially provide the compensation gate signal to the compensation gate lines GCL1 to GCLn.

In some embodiments, the gate driver 120 may include a first gate driver 121, a second gate driver 122, and a third gate driver 123.

The first gate driver 121 may generate a write gate signal, based on a first scan control signal SCS1, and sequentially provide the write gate signal to the write gate lines GWL1 to GWLn. The first scan control signal SCS1 may include a first scan start signal, first scan clock signals, and the like, and be provided from the timing controller 140. For example, the first gate driver 121 may include a shift register (or stage) which sequentially generates and outputs write gate signals in a pulse form, which correspond to the first scan start signal in a pulse form, by using the first scan clock signals.

Similarly to the first gate driver 121, the second gate driver 122 may generate an initialization gate signal, based on a second scan control signal SCS2, and sequentially provide the initialization gate signal to the initialization gate lines GIL1 to GILn. The third gate driver 123 may generate a compensation gate signal, based on a third scan control signal SCS3, and sequentially provide the compensation gate signal to the compensation gate lines GCL1 to GCLn. Each of the second scan control signal SCS2 and the third scan control signal SCS3 may be similar to the first scan control signal SCS1, and each of the second gate driver 122 and the third gate driver 123 may have the substantially same structure (e.g., a shift register having the same structure) as the first gate driver 121.

Meanwhile, although a case where the first gate driver 121, the second gate driver 122, and the third gate driver 123 are implemented independently from one another is illustrated in FIG. 1, the present disclosure is not limited thereto. For example, as shown in FIG. 2, the second gate driver 122 and the third gate driver 123, which are shown in FIG. 1, may be implemented as one second gate driver 122_1. The second gate driver 122_1 may sequentially provide the initialization gate signal to the initialization gate lines GIL1 to GILn, and sequentially provide the compensation gate signal to the compensation gate lines GCL1 to GCLn.

The data driver 130 may generate data signals, based on image data DATA2 and a data control signal DCS, which are provided from the timing controller 140, and provide the data signals to the display unit 110 (or the pixels PXL). The data control signal DCS is a signal for controlling an operation of the data driver 130, and may include a load signal (or data enable signal) indicating an output of a valid data signal, a vertical synchronization signal, a horizontal synchronization signal, and the like.

The timing controller 140 may receive input image data DATA1 and a control signal CS from the outside (e.g., a graphic processor), generate the scan control signals SCS1 to SCS3 and the data control signal DCS, based on the control signal CS, and generate the image data DATA2 by converting the input image data DATA1. For example, the timing controller 140 may convert the input image data DATA1 in an RGB format into the image data DATA2 in an RGB format, which accords with a pixel arrangement in the display unit 110.

The emission driver 150 may generate a first emission control signal (or fourth gate signal), a second emission control signal (or a fifth gate signal), and a bias control signal (or sixth gate signal), based on emission driving control signals ECS1 to ECS3. The emission driver 150 may sequentially provide the first emission control signal to the first emission control lines EML11 to EML1n, sequentially provide the second emission control signal to the second emission control lines EML21 to EML2n, and sequentially provide the bias control signal to the bias control lines EBL1 to EBLn.

In some embodiments, the emission driver 150 may include a first emission driver 151, a second emission driver 152, and a third emission driver 153.

The first emission driver 151 may generate the first emission control signal, based on a first emission driving control signal ECS1, and sequentially provide the first emission control signal to the first emission control lines EML11 to EML1n. The first emission driving control signal ECS1 may include a first emission start signal, first emission clock signals, and the like, and be provided from the timing controller 140. For example, the first emission driver 151 may include a shift register (or stage) which sequentially generates and outputs first emission control signals in a pulse form, which correspond to the first emission start signal in a pulse form, by using the first emission clock signals.

Similarly to the first emission driver 151, the second emission driver 152 may generate the second emission control signal, based on a second emission driving control signal ECS2, and sequentially provide the second emission control signal to the second emission control lines EML21 to EML2n. The third emission driver 153 may generate the bias control signal, based on a third emission driving control signal ECS3, and sequentially provide the bias control signal to the bias control lines EBL1 to EBLn. Each of the second emission driving control signal ECS2 and the third emission driving control signal ECS3 may be similar to the first emission driving control signal ECS1. Each of the second emission driver 152 and the third emission driver 153 may have the substantially same structure (e.g., a shift register having the same structure) as the first emission driver 151.

Meanwhile, at least one of the gate driver 120, the data driver 130, the timing controller 140, and the emission driver 150 may be formed in the display unit 110, or be implemented as an integrated circuit (IC) to be connected to the display unit 110 through a flexible circuit board. In addition, at least two of the gate driver 120, the data driver 130, the timing controller 140, and the emission driver 150 may be implemented as one IC. For example, the emission driver 150 may be included in the gate driver 120.

Figure 3:
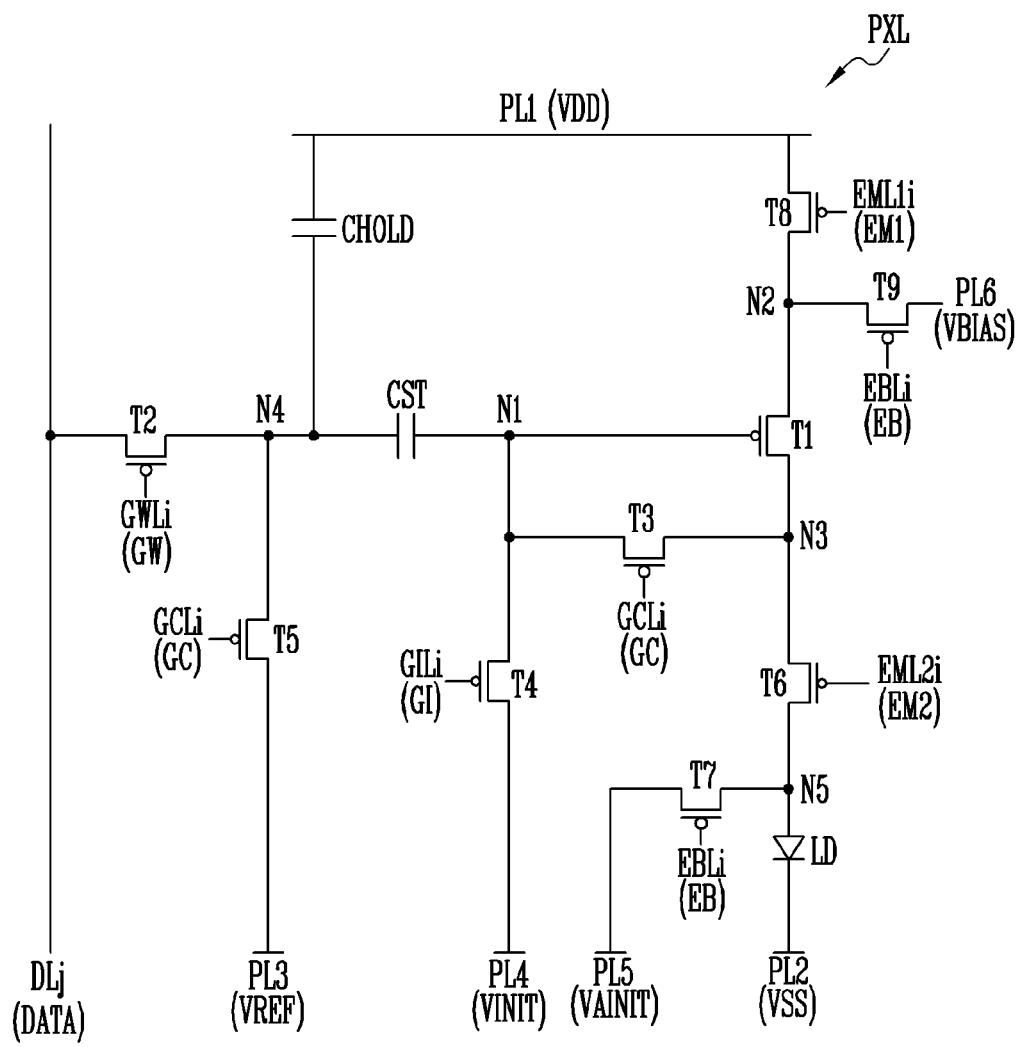
FIG. 3 is a circuit diagram illustrating an example of a pixel included in the display device shown in FIG. 1.
Figure 4:
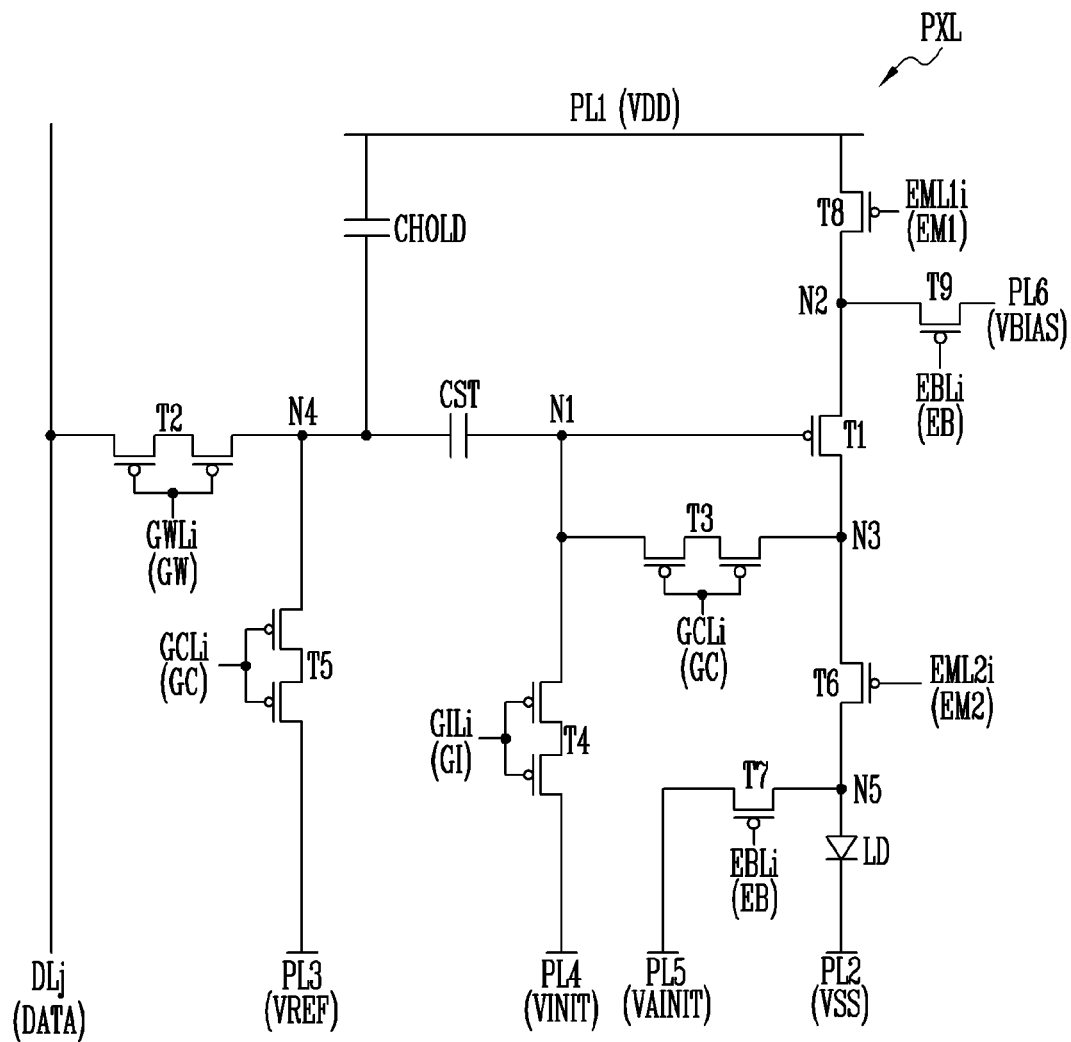
FIG. 4 is a circuit diagram illustrating another example of the pixel included in the display device shown in FIG. 1.

FIG. 3 is a circuit diagram illustrating an example of the pixel included in the display device shown in FIG. 1. FIG. 4 is a circuit diagram illustrating another example of the pixel included in the display device shown in FIG. 1. In FIGS. 3 and 4, a pixel PXL located on an ith pixel row and a jth pixel column is exemplarily illustrated.

First, refereeing to FIGS. 1 to 3, the pixel PXL may include a light emitting element LD and a pixel circuit (or pixel driving circuit) for controlling an amount of current flowing through the light emitting element LD.

The light emitting element LD may be connected between a fifth node N5 and a second power line PL2. An anode electrode of the light emitting element LD may be connected to the fifth node N5. A cathode electrode of the light emitting element LD may be connected to the second power line PL2. The light emitting element LD may emit light with a luminance corresponding to a driving current provided from the pixel circuit.

The first power voltage VDD may be applied to a first power line PL1, and the second power voltage VSS may be applied to the second power line PL2. The first power voltage VDD and the second power voltage VSS may have a potential difference which enables the light emitting element LD to emit light. For example, the first power voltage VDD may be a high-potential pixel power source, and the second power voltage VSS may be a low-potential pixel power source having a potential lower by a threshold voltage or higher of the light emitting element LD than the first power voltage VDD.

The light emitting element LD may be made of several types of light emitting materials.

For example, the light emitting element LD may be an inorganic light emitting diode or include an inorganic light emitting material. Or, for example, the light emitting element LD may be an organic light emitting diode including an organic light emitting layer. In another example, the light emitting element LD may include a GaN- or AlGaInP-based inorganic material, and be configured as an inorganic light emitting diode such as a micro LED (light emitting diode) or a quantum dot light emitting diode. In yet another example, the light emitting element LD may be configured as a light emitting diode made of a combination of organic and inorganic materials. In FIG. 3, it is illustrated that the pixel PXL includes a single light emitting element LD. However, in another embodiment, the pixel PXL may include a plurality of light emitting elements, and the plurality of light emitting elements may be connected in series, parallel or a combination of series and parallel.

The pixel circuit may include at least one transistor and at least one capacitor. For example, the pixel circuit may include transistors T1 to T9, a hold capacitor CHOLD (or second capacitor), and a storage capacitor CST (or first capacitor).

Each of the transistors T1 to T9 may be a P-type thin film transistor, and include a poly-silicon semiconductor. However, the present disclosure is not limited thereto. For example, at least some of the transistors T1 to T9 may include an oxide semiconductor, or be implemented with an N-type semiconductor or a P-type semiconductor.

A first transistor T1 (or driving transistor) may include a first electrode connected to a second node N2, a second electrode connected to a third node N3, and a gate electrode connected to a first node N1. The first electrode of the first transistor T1 may be one of a source electrode and a drain electrode, and the second electrode of the first transistor T1 may be the other of the source electrode and the drain electrode. For example, the first electrode of the first transistor T1 may be the source electrode, and the second electrode of the first transistor T1 may be the drain electrode. The first transistor T1 may control an amount of driving current flowing through the light emitting element LD. The first node N1, the second node N2, and the third node N3 may respectively mean the gate electrode, the first electrode, and the second electrode of the first transistor T1.

The storage capacitor CST may be connected or formed between the first node N1 and a fourth node N4. The storage capacitor CST may store a voltage provided to the first node N1 and the fourth node N4. The hold capacitor CHOLD may be connected or formed between the first power line PL1 and the fourth node N4. The hold capacitor CHOLD may store the voltage of the fourth node N4, and stabilize the voltage of the fourth node N4.

A second transistor T2 (or switching transistor) may include a first electrode connected to a data line DLj, a second electrode connected to the fourth node N4, and a gate electrode connected to a write gate line GWLi. A data signal DATA may be provided to the data line DLj, and a write gate signal GW (or first gate signal) may be provided to the write gate line GWLi. The second transistor T2 may be turned on in response to the write gate signal GW having a gate-on voltage level (or gate-on voltage, turn-on voltage level or logic low level), and provide data signal DATA (or data voltage) to the fourth node N4. The gate-on voltage level may allow a corresponding transistor to be turned on or allow the corresponding transistor to be operated as a turned-on switch.

A third transistor T3 (or compensation transistor) may include a first electrode connected to the first node N1, a second electrode connected to the third node N3, and a gate electrode connected to a compensation gate line GCLi. A compensation gate signal GC (or third gate signal) may be provided to the compensation gate line GCLi. The third transistor T3 may be turned on in response to the compensation gate signal GC having the gate-on voltage level, and connect the first node N1 and the third node N3 to each other. The first transistor T1 may be turned on in a diode form by the third transistor T3, and a voltage corresponding to a difference between a voltage of the second node N2 (e.g., the first power voltage VDD) and a threshold voltage of the first transistor T1 may be sampled.

A fourth transistor T4 (or initialization transistor) may include a first electrode connected to the first node N1, a second electrode connected to a fourth power line PL4 (or first initialization power line), and a gate electrode connected an initialization gate line GILi. The first initialization voltage VINIT may be applied to the fourth power line PL4, and an initialization gate signal GI (or second gate signal) may be applied to the initialization gate line GILi. The fourth transistor T4 may be turned on in response to the initialization gate signal GI having the gate-on voltage level, and provide the first initialization voltage VINIT to the first node N1. The first initialization voltage VINIT may be set lower than a voltage of the data signal DATA. For example, the first initialization voltage VINIT may be set lower than a minimum voltage of the data signal DATA. That is, the fourth transistor T4 may allow the first node N1 to be initialized to the first initialization voltage VINIT.

A fifth transistor T5 may include a first electrode connected to the fourth node N4, a second electrode connected to a third power line PL3 (or reference power line), and a gate electrode connected to a compensation gate line GCLi. The reference voltage VREF may be applied to the third power line PL3. The fifth transistor T5 may be turned on in response to a compensation gate signal GC having the gate-on voltage level, and provide the reference voltage VREF to the fourth node N4. The reference voltage VREF may be equal to or different from the first power voltage VDD. For example, the reference voltage VREF may be a DC voltage having a specific voltage level. That is, the fifth transistor T5 may allow the fourth node N4 to be initialized to the reference voltage VREF.

A sixth transistor T6 (or second emission transistor) may include a first electrode connected to the third node N3, a second electrode connected to the anode electrode of the light emitting element LD, and a gate electrode connected to a second emission control line EML2i (or second emission gate line). A second emission control signal EM2 (or second emission gate signal or fifth gate signal) may be provided to the second emission control line EML2i. The sixth transistor T6 may be turned on in response to the second emission control signal EM2 having the gate-on voltage level, and form a current flowing path between the third node N3 and the light emitting element LD. That is, when the sixth transistor T6 is turned on (or when an eighth transistor T8 is turned on), a driving current may be provided to the light emitting element LD, and the light emitting element LD may emit light with a luminance corresponding to the driving current. When the sixth transistor T6 is turned off, the current flowing path of the driving current may be blocked, and the light emitting element LD may emit no light.

A seventh transistor T7 (or bypass transistor) may include a first electrode connected to the anode electrode of the light emitting element LD, a second electrode connected to a fifth power line PL5, and a gate electrode connected to a bias control line EBLi (or bypass gate line). The second initialization voltage VAINIT may be applied to the fifth power line PL5, and a bias control signal EB (or bias gate signal, bypass gate signal or sixth gate signal) may be provided to the bias control line EBLi. The seventh transistor T7 may be turned on in response to the bias control signal EB having the gate-on voltage level, and provide the second initialization voltage VAINIT to the anode electrode of the light emitting element LD. Charges charged in a parasitic capacitor formed in the light emitting element LD (i.e., a parasitic capacitor occurring due to a structure of the light emitting element LD) may be initialized by the second initialization voltage VAINIT. When the second initialization voltage VAINIT is transferred to the anode electrode of the light emitting element LD before an emission period in which the light emitting element LD emits light, influence caused by the parasitic capacitor may be excluded or reduced, so that the pixel PXL can exhibit a more uniform luminance characteristic with respect to the data signal DATA.

The eighth transistor T8 (or first emission transistor) may include a first electrode connected to the first power line PL1, a second electrode connected to the second node N2, and a gate electrode connected to a first emission control line EML1i (or first emission gate line). A first emission control signal EM1 (or first emission gate signal or fourth gate signal) may be provided to the first emission control line EML1i. The eighth transistor T8 may be turned on in response to the first emission control signal EM1 having the gate-on voltage level, and connect the first power line PL1 and the second node N2 to each other or form a current flowing path between the first power line PL1 and the second node N2.

A ninth transistor T9 (or bias transistor) may include a first electrode connected to the second node N2, a second electrode connected to a sixth power line PL6 (or bias power line), and a gate electrode connected to a bias control line EBLi. The bias voltage VBIAS may be applied to the sixth power line PL6. A bias control signal EB may be provided to the bias control line EBLi. The ninth transistor T9 may be turned on in response to the bias control signal EB having the gate-on voltage level, and connect the second node N2 and the sixth power line PL6 to each other. When the bias voltage VBIAS is cyclically applied to the first electrode (or source electrode) of the first transistor T1, the first transistor T1 may continuously maintain a specific on-bias state, and substantially constantly control the amount of driving current flowing through the light emitting element LD.

Meanwhile, although a case where the gate electrode of the ninth transistor T9 is connected to the bias control line EBLi is illustrated in FIG. 3, the present disclosure is not limited thereto. For example, the gate electrode of the ninth transistor T9 may be connected to a control line formed separately from the bias control line EBLi, and the bias control signal EB (or another control signal) may be applied through the control line.

In an embodiment, the transistors T1 to T9 may be formed as transistors having structures and sizes, which are similar to each other. In another embodiment, at least one of the transistors T1 to T9 may be formed as a transistor having a structure and a size, which are different from a structure and a size of the other transistors.

In an embodiment, at least one of the second transistor T2, the third transistor T3, the fourth transistor T4, and the fifth transistor T5 may be implemented with a dual gate transistor (or transistor including a plurality of sub-transistors connected in series). As shown in FIG. 4, each of the second transistor T2, the third transistor T3, the fourth transistor T4, and the fifth transistor T5 may be implemented as a dual gate transistor, and include two sub-transistors connected in series to each other. In a turn-off sate of each of the third transistor T3 and the fourth transistor T4, a leakage current flowing through the third transistor T3 and the fourth transistor T4 can be reduced. In addition, a leakage current flowing through the second transistor T2 and the fifth transistor T5 can be reduced, and a voltage fluctuation of each of the fourth node N4 and the first node N1 (i.e., the first node N1 capacitor-coupled to the fourth node N4) can be decreased.

Meanwhile, the pixel PXL shown in FIG. 3 is merely an example, and the circuit configuration of the pixel PXL may be variously modified.

Figure 5:
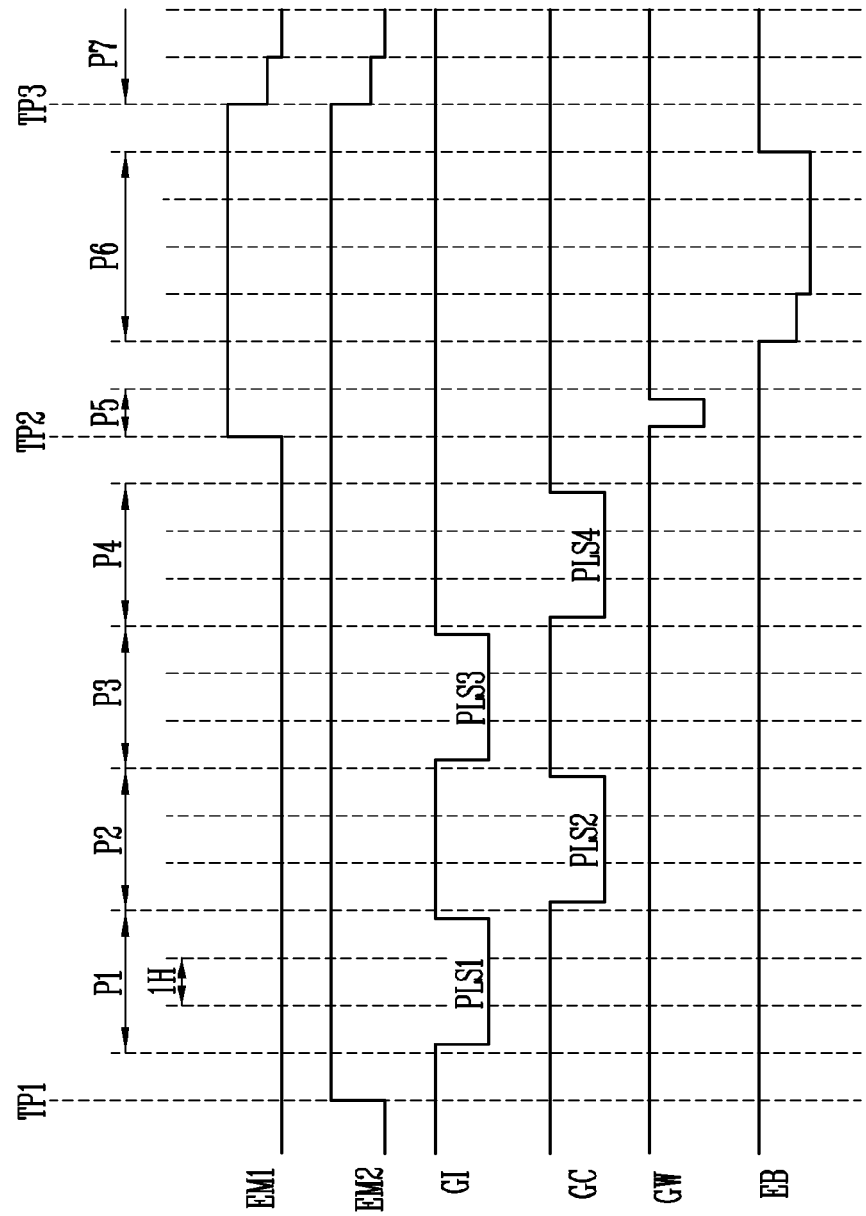
FIG. 5 is a waveform diagram illustrating an example of signals provided to the pixel shown in FIG. 3 in a first mode.

FIG. 5 is a waveform diagram illustrating an example of signals provided to the pixel shown in FIG. 3 in a first mode. FIGS. 6 to 12 are circuit diagrams illustrating operations of the pixel shown in FIG. 3. In FIGS. 6 to 12, sequential operations of the pixel shown in FIG. 3 according to the signals shown in FIG. 5 are illustrated.

First, referring to FIGS. 3 and 5, the first emission control signal EM1, the second emission control signal EM2, the initialization gate signal GI, the compensation gate signal GC, the write gate signal GW, and the bias control signal EB are illustrated in FIG. 5. As described with reference to FIG. 3, the first emission control signal EM1 may be provided through the first emission control line EML1$i$, the second emission control signal EM2 may be provided through the second emission control line EML2$i$, the initialization gate signal GI may be provided through the initialization gate line GILi, the compensation gate signal GC may be provided through the compensation gate line GCLi, the write gate signal GW may be provided through the write gate line GWLi, and the bias control signal EB may be provided through the bias control line EBLi or a separate control line.

Hereinafter, operations of the pixel PXL shown in FIG. 3 will be described with respect to one frame or one subframe.

The second emission control signal EM2 may have a gate-off voltage level (or gate-off voltage, turn-off voltage level or logic high level) in a period between a first time TP1 and a third time TP3, and the period may be defined as a non-emission period of the pixel PXL. The gate-off voltage level may allow a corresponding transistor to be turned off or allow the corresponding transistor to be operated as a turned-off switch. The second emission control signal EM2 may have the gate-on voltage level in the other period except the period, and the other period may be defined as an emission period of the pixel PXL.

One non-emission period may include first to sixth periods P1 to P6. The first to sixth periods P1 to P6 do not overlap with each other but may be sequentially arranged. One emission period may include a seventh period P7.

In a period between the first time TP1 and a second time TP2 (or the first to fourth periods P1 to P4) and the seventh period P7, the first emission control signal EM1 may have the gate-on voltage level. In the fifth to sixth periods P5 to P6, the first emission control signal EM1 may have the gate-off voltage level.

During the first period P1, the initialization gate signal G1 may have the gate-on voltage level. That is, in the first period P1, the initialization gate signal G1 may have a first pulse PLS1 having the gate-on voltage level. A pulse width of the first pulse PLS1 may be greater than or equal to 3 horizontal times (i.e., 3×1 horizontal time 1 H), but the present disclosure is not limited thereto. The 1 horizontal time 1 H may mean a time interval between timings at which pixel rows are sequentially scanned, or be a time allocated to apply a data signal to one pixel row. For example, when the display device 100 (see FIG. 1) reproduces an image at a frequency of 240 Hz, the 1 horizontal time 1 H may be about 1.84 us or less. The compensation gate signal GC, the write gate signal GW, and the bias control signal EB may have the gate-off voltage level.

Figure 6:
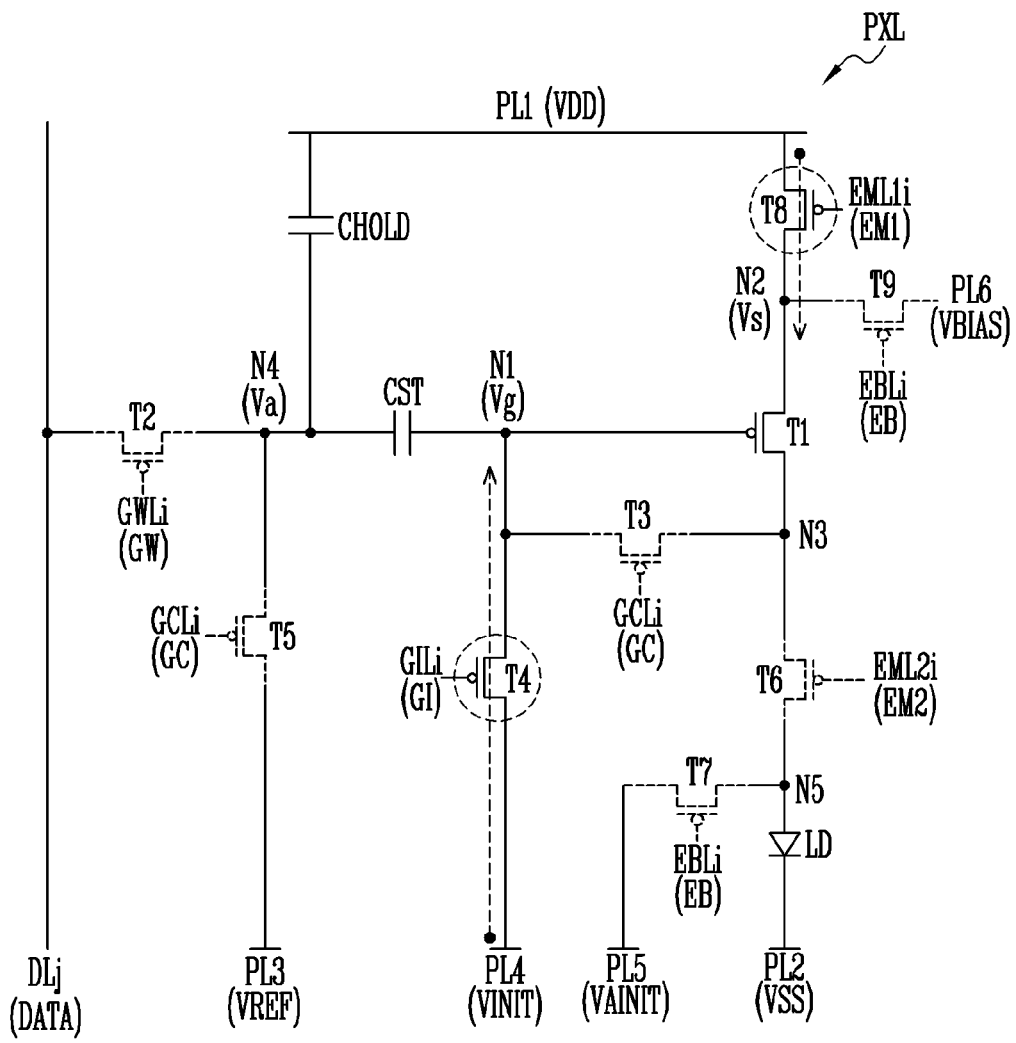
FIGS. 6, 7, 8, 9, 10, 11, and 12 are circuit diagrams illustrating operations of the pixel shown in FIG. 3.

Referring to FIG. 6, the eighth transistor T8 may maintain a turn-on state in response to the first emission control signal EM1 having the gate-on voltage level, and the first power voltage VDD may be provided to the second node N2. That is, a voltage Vs of the second node N2 (or a voltage of the first electrode of the first transistor T1) may be equal to the first power voltage VDD.

In addition, the fourth transistor T4 may be turned on in response to the initialization gate signal G1 (or the first pulse PLS1) having the gate-on voltage level, and the first initialization voltage VINIT may be primarily provided to the first node N1. That is, the first node N1 may be initialized to the first initialization voltage VINIT, and a voltage Vg of the first node N1 (or a voltage of the gate electrode of the first transistor T1) may become equal to the first initialization voltage VINIT.

Meanwhile, a voltage Va of the fourth node N4 may have a previous data signal (i.e., a data voltage of a previous frame) due to the hold capacitor CHOLD.

That is, in the first period P1, the first node N1 (or the gate electrode of the first transistor T1) may be initialized by the first initialization voltage VINIT.

Figure 28:
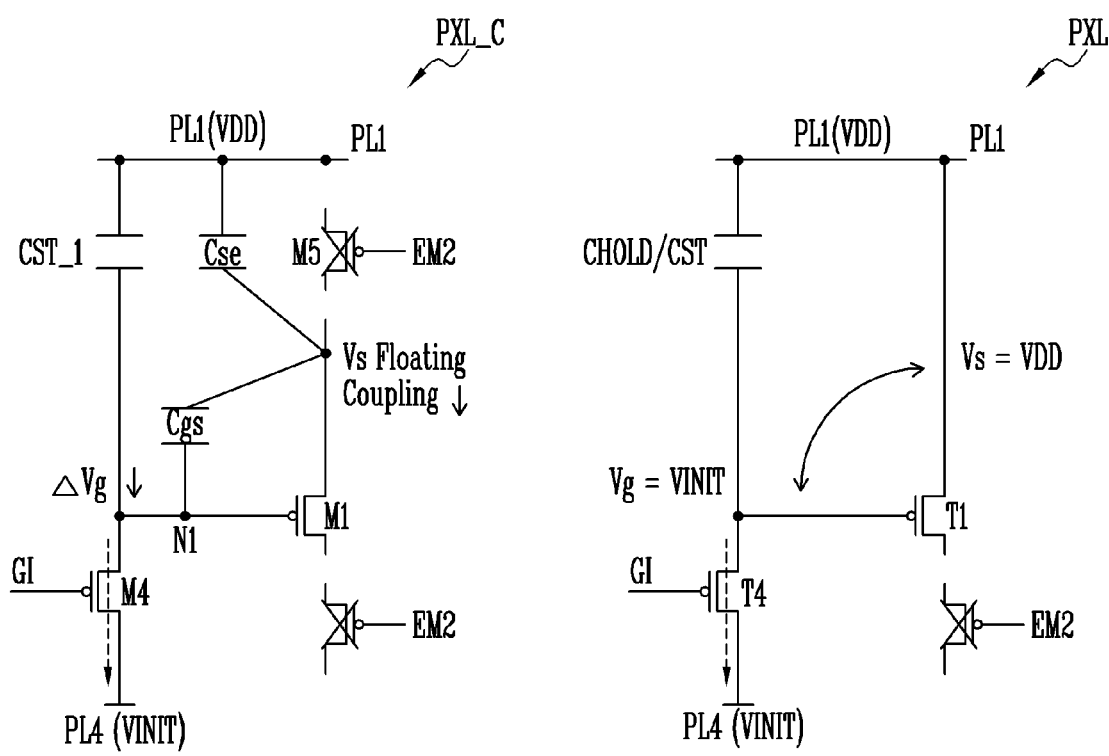

Although it is described that the eighth transistor T8 is turned on in the first period P1, the present disclosure is not limited thereto. However, when the eighth transistor T8 is turned on in the first period P1, an on-bias voltage of the first transistor T1 increases, and step efficiency can be improved or enhanced. This will be described later with reference to FIG. 28.

Referring back to FIG. 5, during the second period P2, the compensation gate signal GC may have the gate-on voltage level. That is, in the second period P2, the compensation gate signal GC may have a second pulse PLS2 having the gate-on voltage level. The compensation gate signal GC may have a waveform shifted by the first period P1 from the initialization gate signal GI, but the present disclosure is not limited thereto. For example, like the pulse width of the first pulse PLS1, a pulse width of the second pulse PLS2 may be greater than or equal to 3 horizontal times. The initialization gate signal GI, the write gate signal GW, and the bias control signal EB may have the gate-off voltage level.

Figure 7:
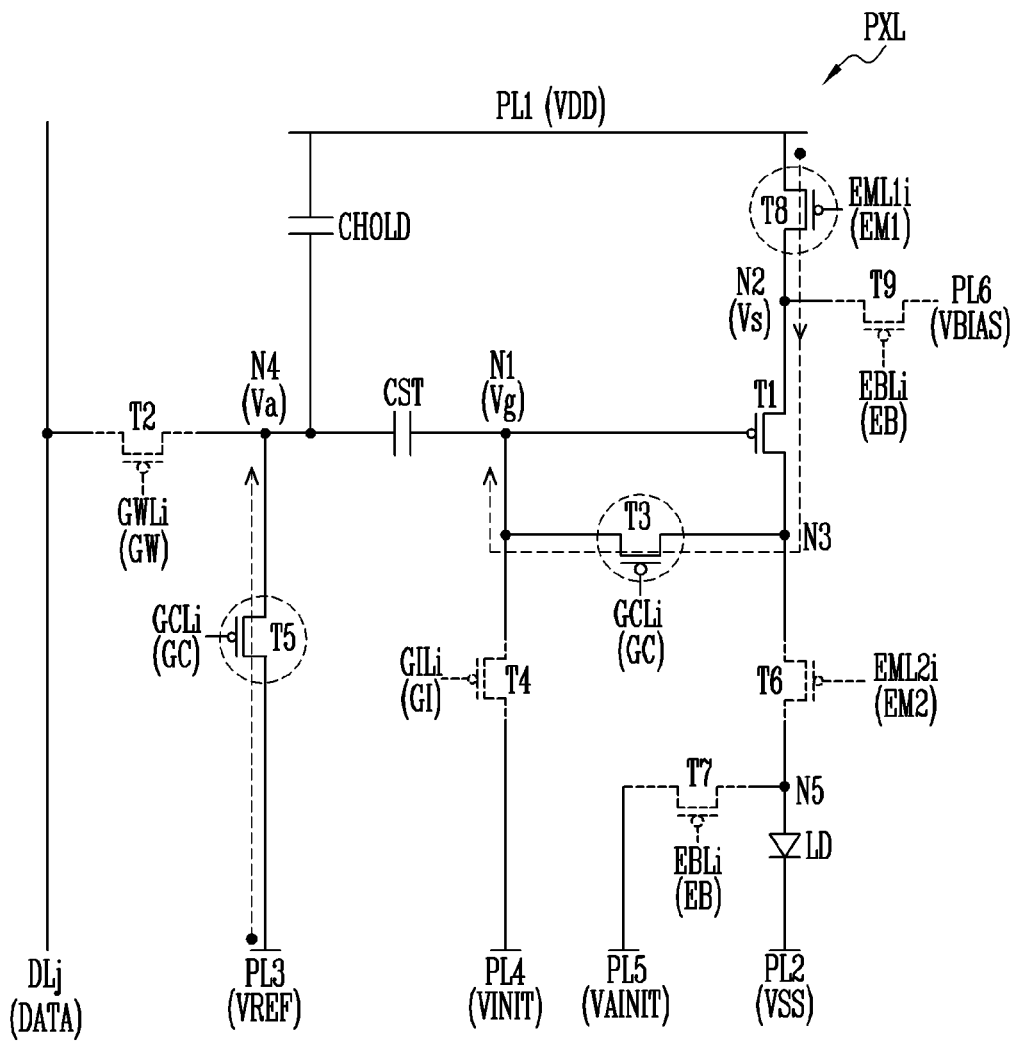

Referring to FIG. 7, the fifth transistor T5 may be turned on in response to the compensation gate signal GC (or the second pulse PLS2) having the gate-on voltage level, and the reference voltage VREF may be primarily provided to the fourth node N4. That is, the fourth node N4 may be initialized to the reference voltage VREF, and the voltage Va of the fourth node N4 may be changed to become equal to the reference voltage VREF.

In addition, the third transistor T3 may be turned on in response to the compensation gate signal GC (or the second pulse PLS2) having the gate-on voltage level, and the gate electrode and the second electrode (e.g., the drain electrode) of the first transistor T1 may be connected to each other. That is, the first transistor T1 may be diode-connected. A voltage corresponding to a difference (or voltage difference) between the first power voltage VDD and the threshold voltage of the first transistor T1 may be sampled at the first node N1. The voltage Vg of the first node N1 is similar to the voltage corresponding to the difference between the first power voltage VDD and the threshold voltage of the first transistor T1, but may be different from the difference between the first power voltage VDD and the threshold voltage of the first transistor T1. For example, the voltage Vg of the first node N1 may be expressed as "VDD–Vth+α." Here, Vth may be a threshold voltage of the first transistor T1, and α may be a component of the previous data signal due to a capacitor coupling of the storage capacitor CST.

Since the voltage Va of the fourth node N4 is changed from the voltage of the previous data signal to the reference voltage VREF, a variation of the voltage Va of the fourth node N4 may be transferred to the first node N1 through the capacitor coupling of the storage capacitor CST. Therefore, unlike an ideal sampling voltage (e.g., "VDD–Vth"), the voltage Vg of the first node N1 may further include the component of the previous data signal (i.e., the variation of the voltage Va of the fourth node N4).

Meanwhile, when the compensation gate signal GC is 3 horizontal times or more (e.g., about 3.2 μs or more), the threshold voltage of the first transistor T1 is more accurately sampled. Thus, the threshold voltage of the first transistor T1 can be accurately reflected to the data signal DATA.

Referring back to FIG. 5, during the third period P3, the initialization gate signal GI may have the gate-on voltage level. That is, in the third period P3, the initialization gate signal GI may have a third pulse PLS3 having the gate-on voltage level. A pulse width of the third pulse PLS3 (or a width of the third period P3) may be equal to the pulse width of the first pulse PLS1 (or a width of the first period P1). The compensation gate signal GC, the write gate signal GW, and the bias control signal EB may have the gate-off voltage level.

Figure 8:
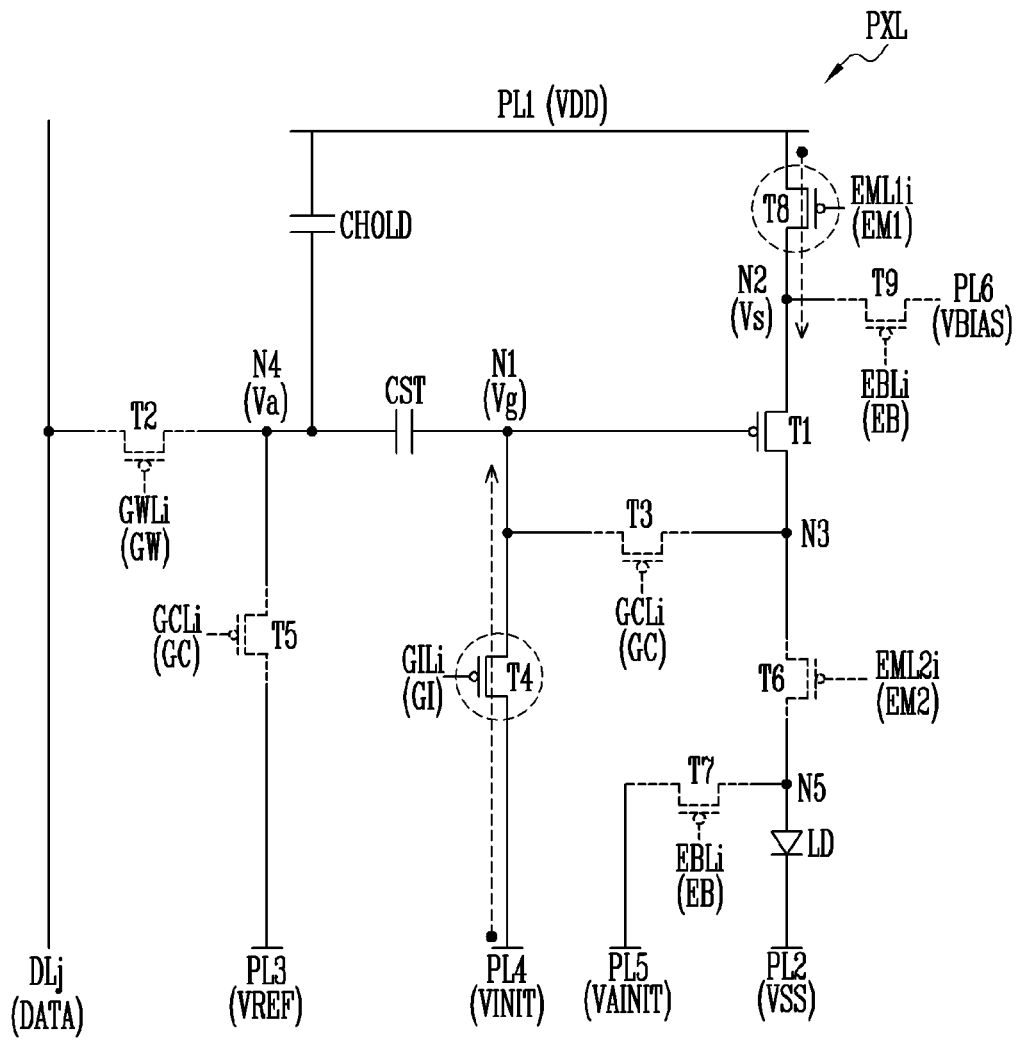

Referring to FIG. 8, similarly to the operation of the pixel PXL, which is described with reference to FIG. 6, the fourth transistor T4 may be turned on in response to the initialization gate signal GI (or the third pulse PLS3) having the gate-on voltage level, and the first initialization voltage VINIT may be secondarily provided to the first node N1. That is, in the third period P3, the first node N1 (or the gate electrode of the first transistor T1) may be initialized by the first initialization voltage VINIT.

Meanwhile, the voltage Va of the fourth node N4 may be maintained equal to the reference voltage VREF applied in the second period P2 by the reference voltage VREF.

Referring back to FIG. 5, during the fourth period P4, the compensation gate signal GC may have the gate-on voltage level. That is, in the fourth period P4, the compensation gate signal GC may have a fourth pulse PLS4 having the gate-on voltage level. A pulse width of the fourth pulse PLS4 (or a width of the fourth period P4) may be equal to the pulse width of the second pulse PLS2 (or a width of the second period P2). The initialization gate signal GI, the write gate signal GW, and the bias control signal EB may have the gate-off voltage level.

Figure 9:
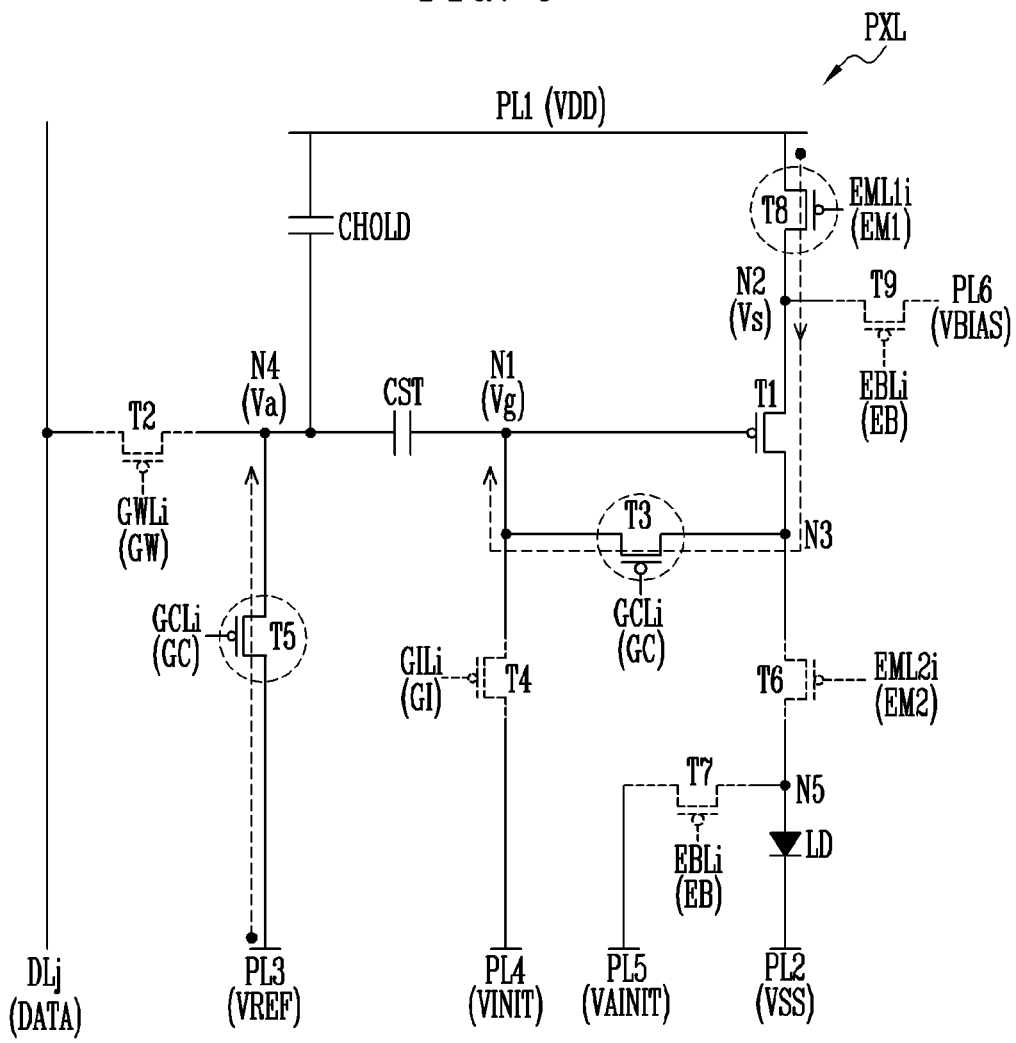

Referring to FIG. 9, similarly to the operation of the pixel PXL, which is described with reference to FIG. 7, the fifth transistor T5 may be turned on in response to the compensation gate signal GC (or the fourth pulse PSL4) having the gate-on voltage level, and the reference voltage VREF may be secondarily provided to the fourth node N4. In addition, the third transistor T3 may be turned on in response to the compensation gate signal GC (or the fourth pulse PLS4) having the gate-on voltage level, and the gate electrode and the second electrode of the first transistor T1 may be connected to each other.

The voltage corresponding to the difference (or voltage difference) between the first power voltage VDD and the threshold voltage of the first transistor T1 may be sampled at the first node N1. The voltage Vg of the first node N1 may be equal to the difference (i.e., "VDD–Vth") between the first power voltage VDD and the threshold voltage of the first transistor T1.

Since the voltage Va of the fourth node N4 is maintained as the reference voltage VREF, the component of the previous data signal may be removed from the voltage Vg of the first node N1. Thus, the voltage Vg of the first node N1 can be normally compensated.

Referring back to FIG. 5, during the fifth period P5, the write gate signal GW may have the gate-on voltage level. That is, in the fifth period P5, the write gate signal GW may have a pulse having the gate-on voltage level. A width of the pulse of the write gate signal GW (or a width of the fifth period P5) may be 1 horizontal time 1 H, but the present disclosure is not limited thereto. When the width of the pulse of the write gate signal GW is 1 horizontal time 1 H (e.g., 1.84 μs), the display device 100 (see FIG. 1) may be operated at a high driving frequency or be implemented to have high resolution, as compared with when the width of the pulse of the write gate signal GW is relatively large (e.g., when the width of the pulse of the write gate signal GW is equal to the width of the pulse of the compensation gate signal GC). The initialization gate signal GI, the compensation gate signal GC, and the bias control signal EB may have the gate-off voltage level. The first emission control signal EM1 may have the gate-off voltage level, but the present disclosure is not limited thereto.

Figure 10:
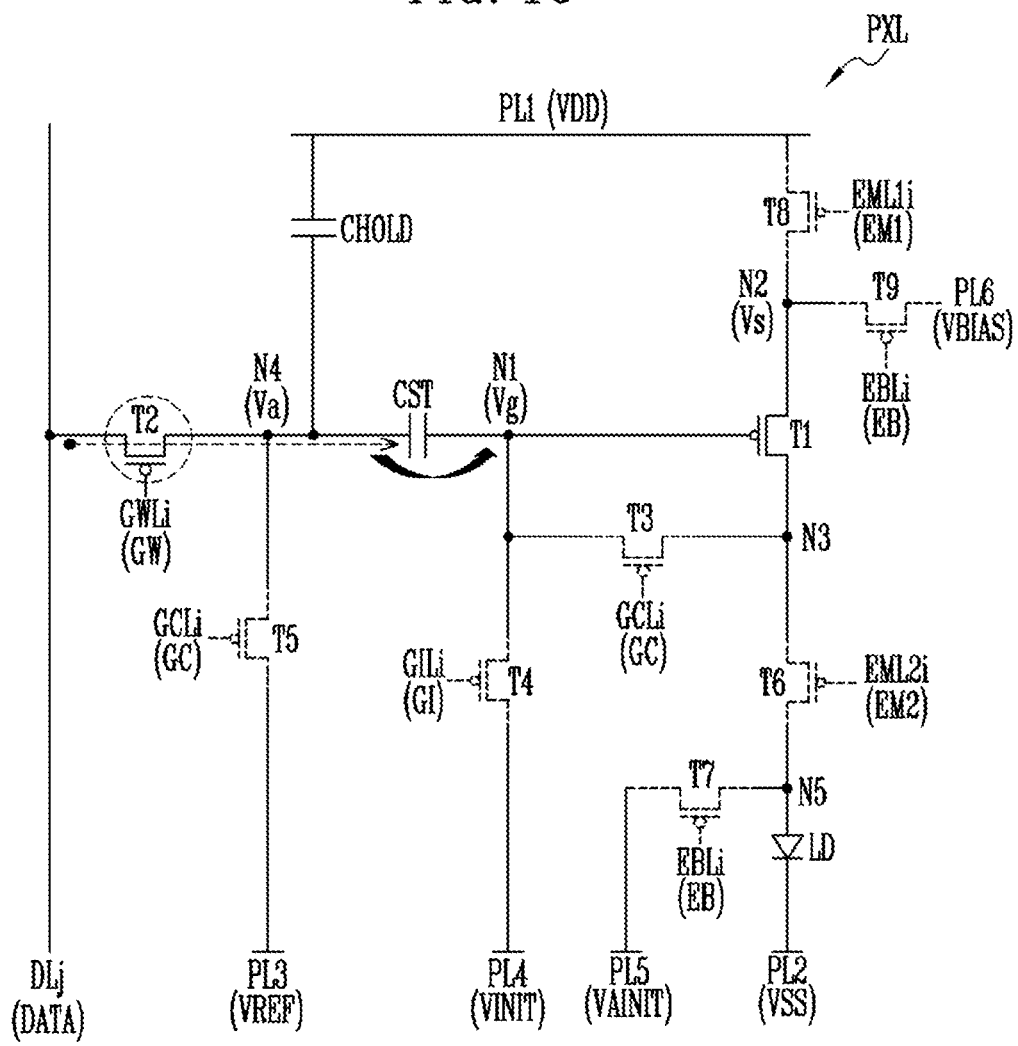

Referring to FIG. 10, the second transistor T2 may be turned on in response to the write gate signal GW having the gate-on voltage level, and the data signal DATA may be provided to the fourth node N4. The voltage Va of the fourth node N4 may be changed to the voltage of the data signal DATA.

Since the first node N1 is connected to the fourth node N4 by the storage capacitor CST, the variation (i.e., "DATA–VREF") of the voltage Va of the fourth node N4 may be reflected to the first node N1. Therefore, the voltage Vg of the first node N1 may be changed to "VDD–Vth+(DATA–VREF)."

Referring back to FIG. 5, during the sixth period P6, the bias control signal EB may have the gate-on voltage level. That is, in the sixth period P6, the bias control signal EB may have a pulse having the gate-on voltage level. A width of the pulse of the bias control signal EB (or a width of the sixth period P6) may be 4 horizontal times, but the present disclosure is not limited thereto.

The first emission control signal EM1, the initialization gate signal GI, the compensation gate signal GC, and the write gate signal GW may have the gate-off voltage level.

Figure 11:
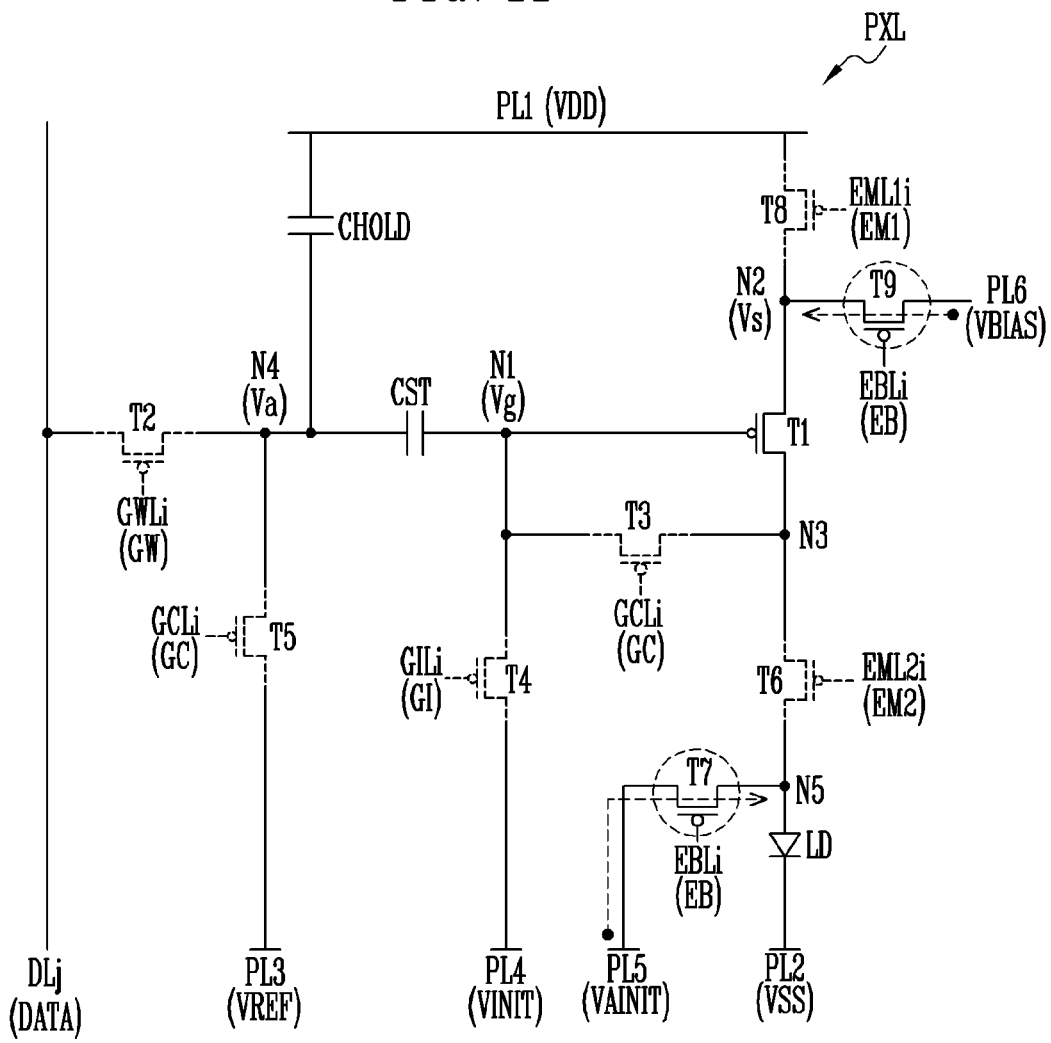

Referring to FIG. 11, the seventh transistor T7 may be turned on in response to the bias control signal EB having the gate-on voltage level, and the second initialization voltage VAINIT may be provided to the fifth node N5 (or the anode electrode of the light emitting element LD). The charges charged in the parasitic capacitor formed in the light emitting element LD (i.e., the parasitic capacitor occurring due to the structure of the light emitting element LD) are initialized by the second initialization voltage VAINIT, and the pixel PXL can exhibit a more uniform luminance characteristic.

In addition, the ninth transistor T9 may be turned on in response to the bias control signal EB having the gate-on voltage level, and the bias voltage VBIAS may be provided to the second node N2 (or the first electrode of the first transistor T1). The first transistor T1 may be in a specific on-bias state corresponding to the bias voltage VBIAS. The threshold voltage of the first transistor T1 may be shifted according to light emission or a light emission condition, and a voltage-current characteristic of the first transistor T1 may be changed. The luminance of the pixel PXL may be changed as the voltage-current characteristic of the first transistor T1 is changed while the pixel PXL emits light. As will be described later with reference to FIGS. 29 and 30, when the bias voltage VBIAS is applied to the first transistor T1, the first transistor T1 may be changed to have a specific voltage-current characteristic. When the bias voltage VBIAS is cyclically applied to the first transistor T1, the change in the voltage-current characteristic of the first transistor T1 is reduced, and the luminance of the pixel PXL is not changed even when time elapses.

Referring back to FIG. 5, in the seventh period P7, the first emission control signal EM1 and the second emission control signal EM2 may have the gate-on voltage level, and the initialization gate signal GI, the compensation gate signal GC, the write gate signal GW, and the bias control signal EB may have the gate-off voltage level.

Figure 12:
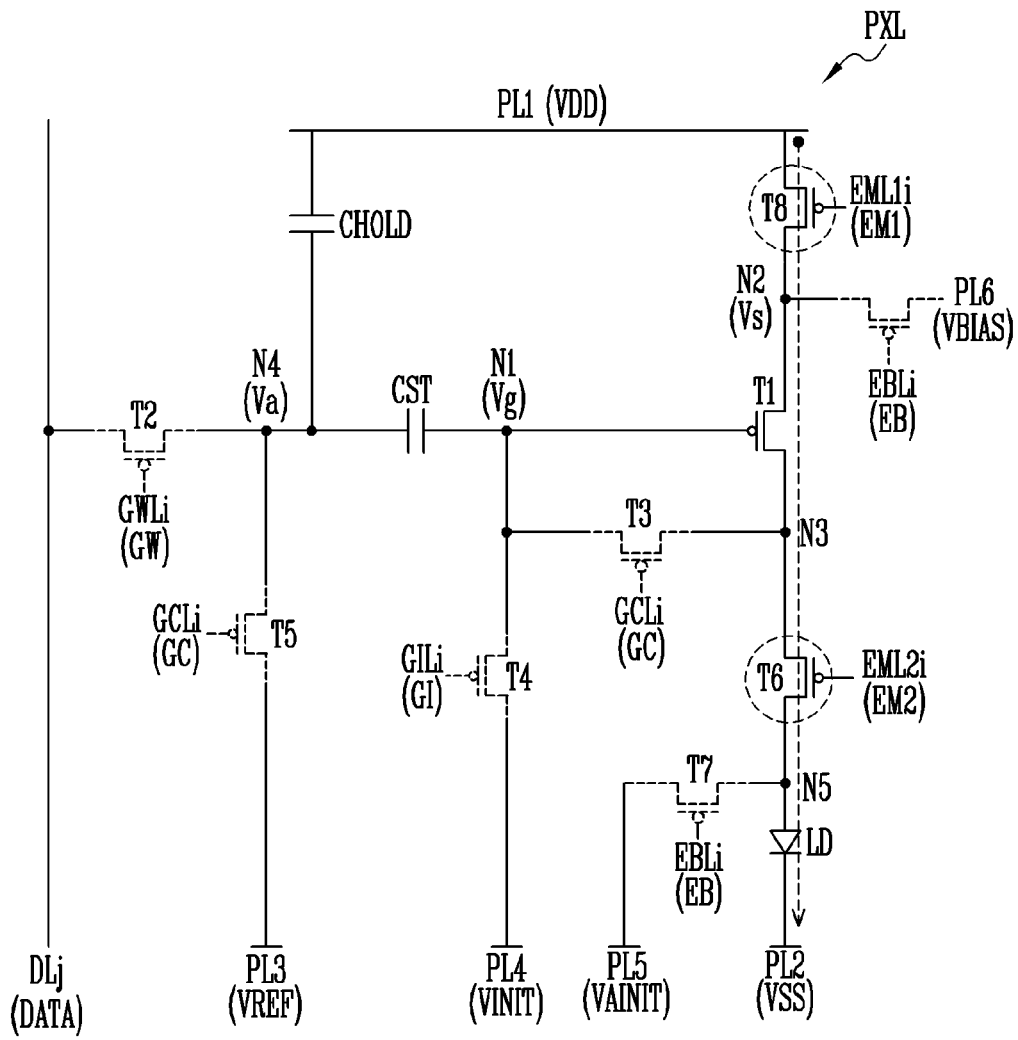

Referring to FIG. 12, the eighth transistor T8 is turned on in response to the first emission control signal EM1, the sixth transistor T6 may be turned on in response to the second emission control signal EM2, and a current flowing path may be formed between the first power line PL1 and the second power line PL2. A driving current corresponding to a gate-source voltage of the first transistor T1 may be provided to the light emitting element LD, and the light emitting element LD may emit light with a luminance corresponding to the driving current.

Since the eighth transistor T8 is in the turn-on state, the voltage Vs of the first electrode of the first transistor T1 may be equal to the first power voltage VDD. The gate-source voltage (i.e., "Vg−Vs") of the first transistor T1 is equal to "Vth−DATA+VREF," and the driving current may be expressed as shown in the following Equation 1.

$$Id = K(Vgs - Vth)^2 = K(VREF - DATA)^2 \quad \text{Equation 1}$$

Id may be a driving current, K may be a constant according to a characteristic (e.g., a channel width/length, or the like) of the first transistor T1, and Vgs may be a gate-source voltage.

That is, the light emitting element LD may emit light with a luminance corresponding to a difference between the reference voltage VREF and the data signal DATA.

As described above, a compensation operation (i.e., an operation according to the compensation gate signal GC) on the pixel PXL and a data writing operation (i.e., an operation according to the write gate signal GW) on the pixel PXL are separated from each other, and the width of a compensation period (i.e., the second period P2 and the fourth period P4) is relatively increased. Thus, a more accurate compensation operation is performed, and the width of a write period (or data writing period) (i.e., the fifth period P5) is relatively decreased. Accordingly, the display device 100 (see FIG. 1) can be driven at a higher frequency.

In addition, the compensation operation may be repeated plural times (e.g., twice). Thus, the component (or influence) of the previous data signal can be removed from the voltage Vg of the first node N1, and the threshold voltage of the first transistor T1 can be more accurately compensated to the voltage Vg of the first node N1 (or the voltage of the gate electrode of the first transistor T1).

Effects in accordance with the embodiments of the present disclosure will be described later with reference to FIGS. 23 to 30.

Figure 13:
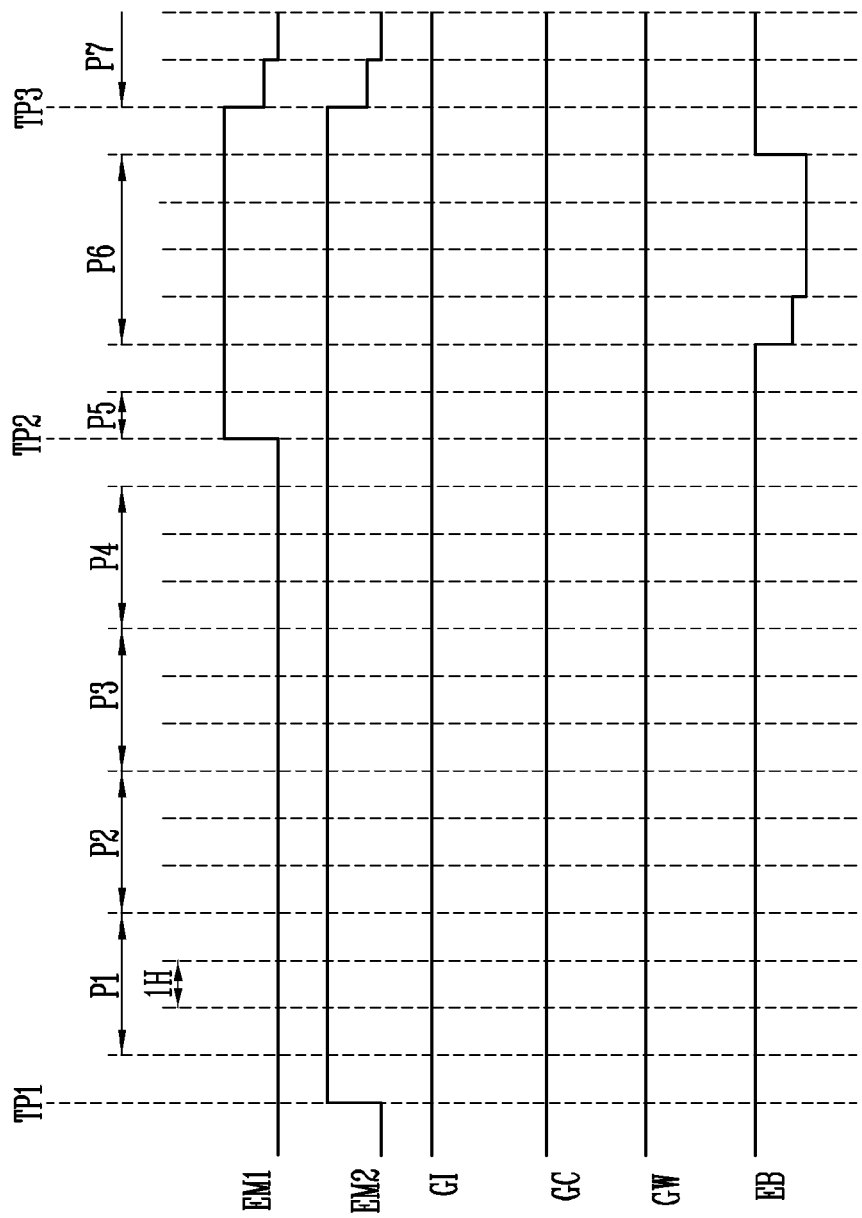
FIG. 13 is a waveform diagram illustrating an example of signals provided to the pixel shown in FIG. 3 in a second mode.

FIG. 13 is a waveform diagram illustrating an example of the signals provided to the pixel shown in FIG. 3 in a second mode.

Referring to FIGS. 3, 5, and 13, while the data signal DATA is updated in the first mode shown in FIG. 5, the data signal DATA is not updated, and the data signal previously updated in the first mode may be maintained in the second mode shown in FIG. 13. Accordingly, a data writing operation and an initialization/compensation operation performed before the data writing operation may be skipped.

Accordingly, as shown in FIG. 13, the initialization gate signal GI, the compensation gate signal GC, and the write gate signal GW may be maintained at the gate-off voltage level in a non-emission period of the second mode.

During a sixth period P6 of the second mode, the bias control signal EB may have the gate-on voltage level. An operation (see FIG. 11) of the pixel PXL in the sixth period P6 of the second mode may be substantially identical to the operation of the pixel PXL in the sixth period P6 of the first mode.

Meanwhile, while the pixel PXL emits light during the seventh period P7 of the first mode, the threshold voltage of the first transistor T1 may be shifted, and the voltage-current characteristic of the first transistor T1 may be changed. As the seventh period P7 of the second mode becomes longer according to low frequency driving, the voltage-current characteristic of the first transistor T1 may be changed, and the luminance of the pixel PXL may be changed according to a lapse of time. In order to prevent this, the bias voltage VBIAS may be applied to the first transistor T1 in the second mode (or frame) in which the data signal DATA is not updated. The bias voltage VBIAS is cyclically applied to the first transistor T1, so that the change in the voltage-current characteristic of the first transistor T1 can be reduced. In addition, the luminance of the pixel PXL is not changed even when time elapses.

FIGS. 14 to 20 are waveform diagrams illustrating another example of the signals provided to the pixel shown in FIG. 3 in the first mode.

Referring to FIGS. 3, 5, and 14 to 20, a first emission control signal EM1, a second emission control signal EM2, an initialization gate signal GI, a compensation gate signal GC, a write gate signal GW, and a bias control signal EB, which are shown in FIGS. 14 to 20, may be respectively substantially identical or similar to the first emission control signal EM1, the second emission control signal EM2, the initialization gate signal GI, the compensation gate signal GC, the write gate signal GW, and the bias control signal EB, which are shown in FIG. 5, except waveforms and pulse widths of some signals. Therefore, overlapping descriptions will not be repeated.

Figure 14:
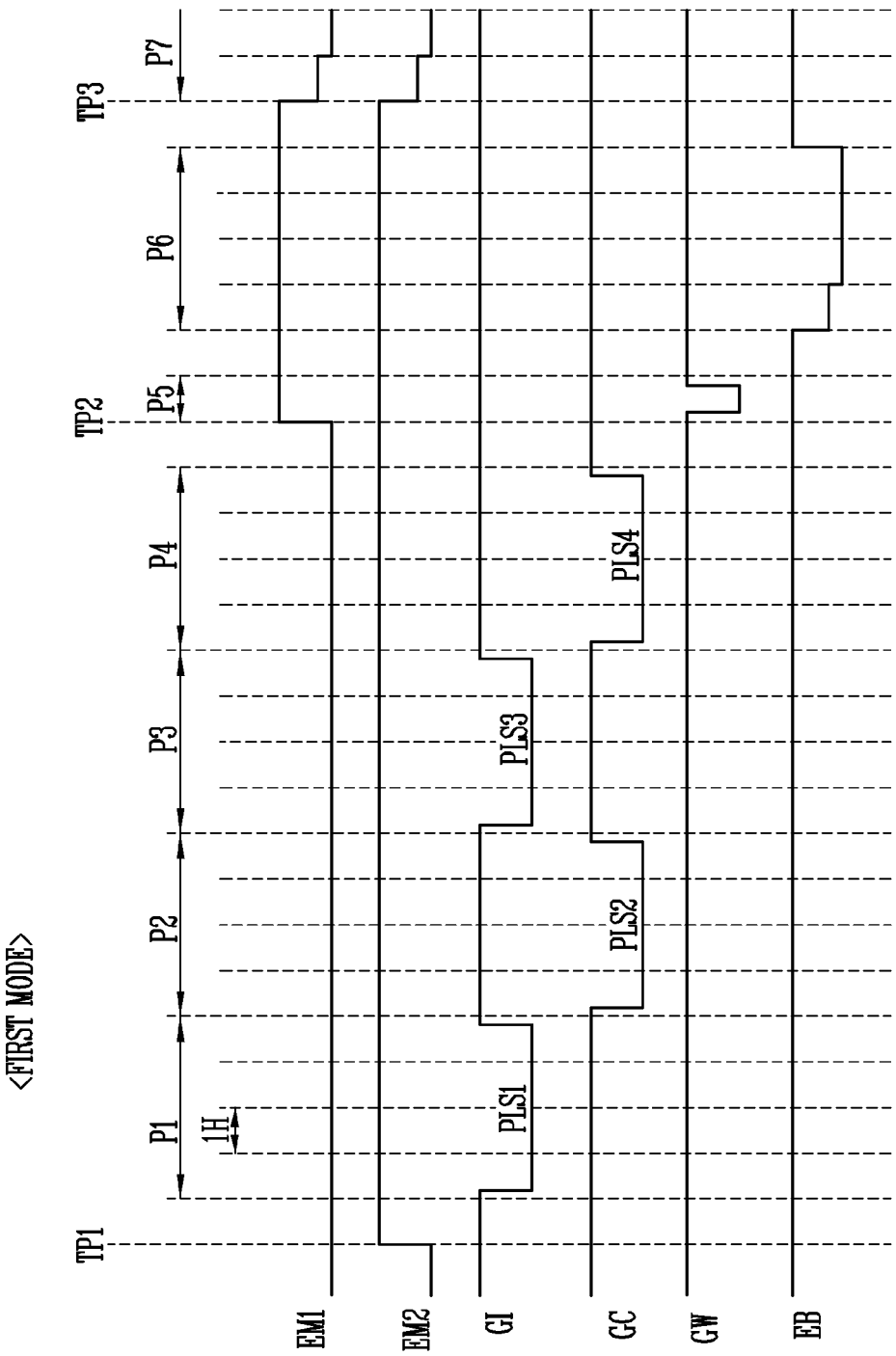
FIGS. 14, 15, 16, 17, 18, 19, and 20 are waveform diagrams illustrating another example of the signals provided to the pixel shown in FIG. 3 in the first mode.

In an embodiment, the pulse width of the compensation gate signal GC may be greater than 3 horizontal times. As shown in FIG. 14, the pulse width of the compensation gate signal GC may be 4 horizontal times. As a compensation period (i.e., the second period P2 and the fourth period P4) according to the compensation gate signal GC becomes longer, the threshold voltage of the first transistor T1 can be more accurately sampled or compensated. In some embodiments, the pulse width of the compensation gate signal GC may be greater than 4 horizontal times.

The pulse width of the initialization gate signal G1 may also be 4 horizontal times, corresponding to the compensation gate signal GC, but the present disclosure is not limited thereto.

Figure 15:
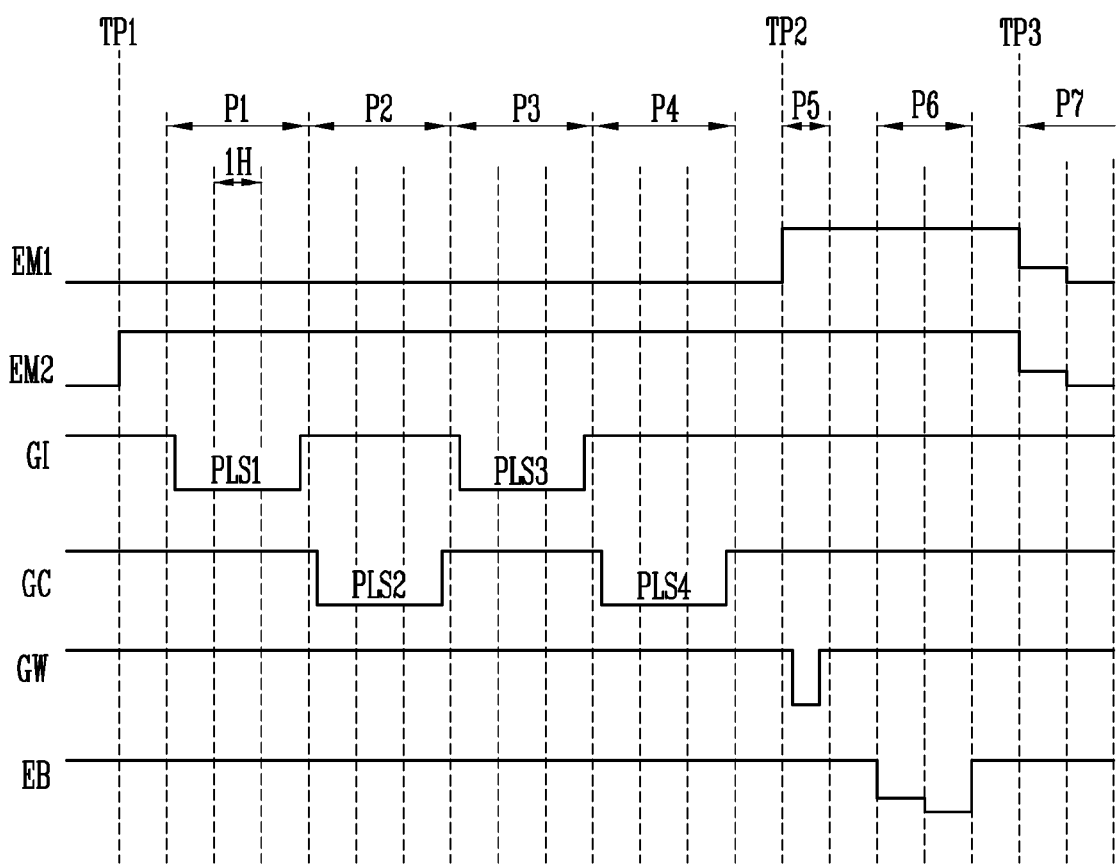

In an embodiment, the pulse width of the bias control signal EB may be greater or smaller than 4 horizontal times. As shown in FIG. 15, the pulse width of the bias control signal EB may be 2 horizontal times. The pulse width of the bias control signal EB may be variously changed by considering a characteristic of the pixel PXL according to a variable refresh rate (VRR), e.g., a luminance change or luminance deviation in the first mode and the second mode. The pulse width of the first emission control signal EM1 may be variously changed corresponding to the bias control signal EB.

Figure 16:
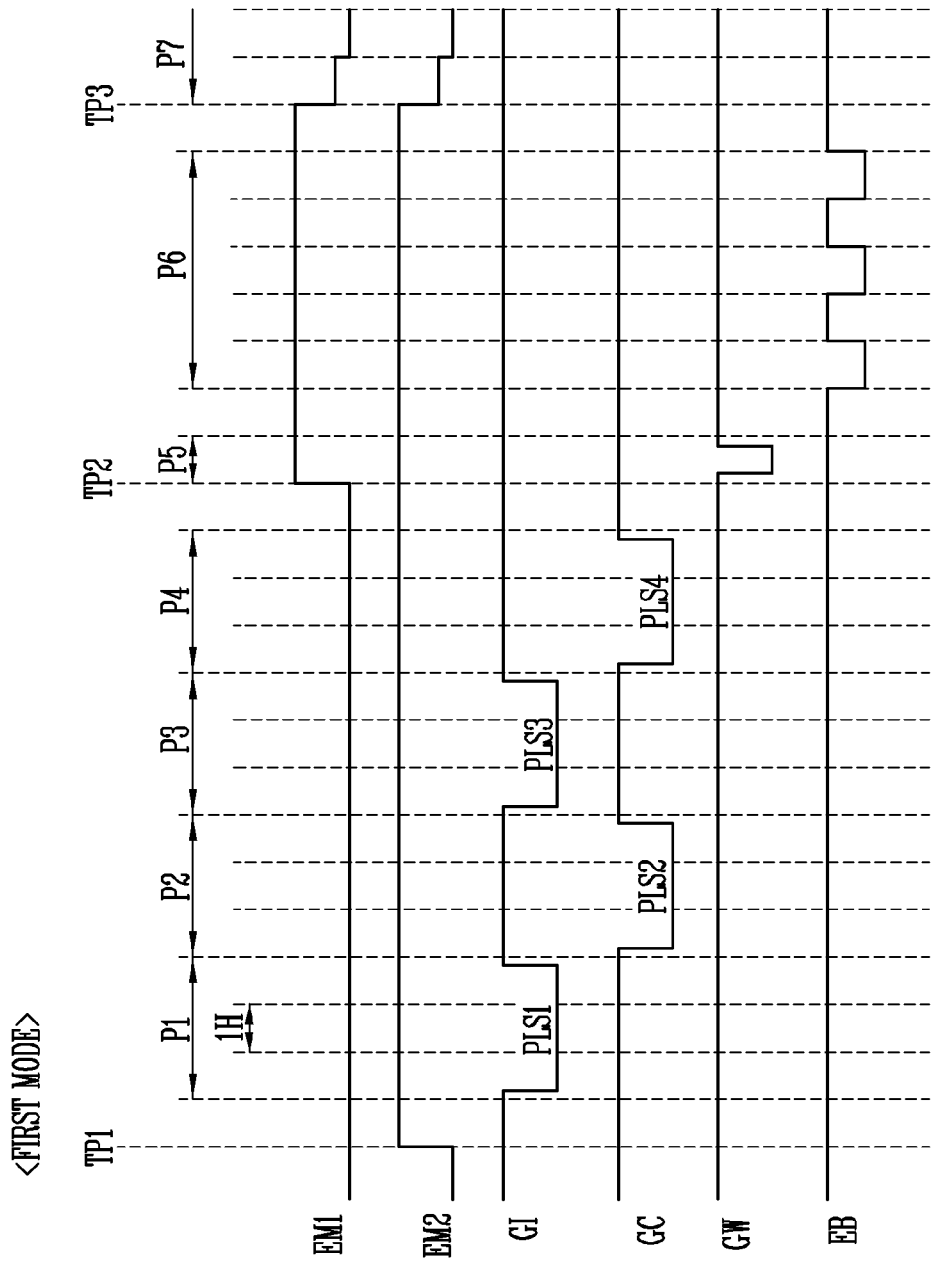

In an embodiment, the bias control signal EB may include a plurality of pulses. As shown in FIG. 16, the bias control signal EB may include three pulses. However, the present disclosure is not limited thereto, and the bias control signal EB may include two or four or more pulses.

Figure 17:
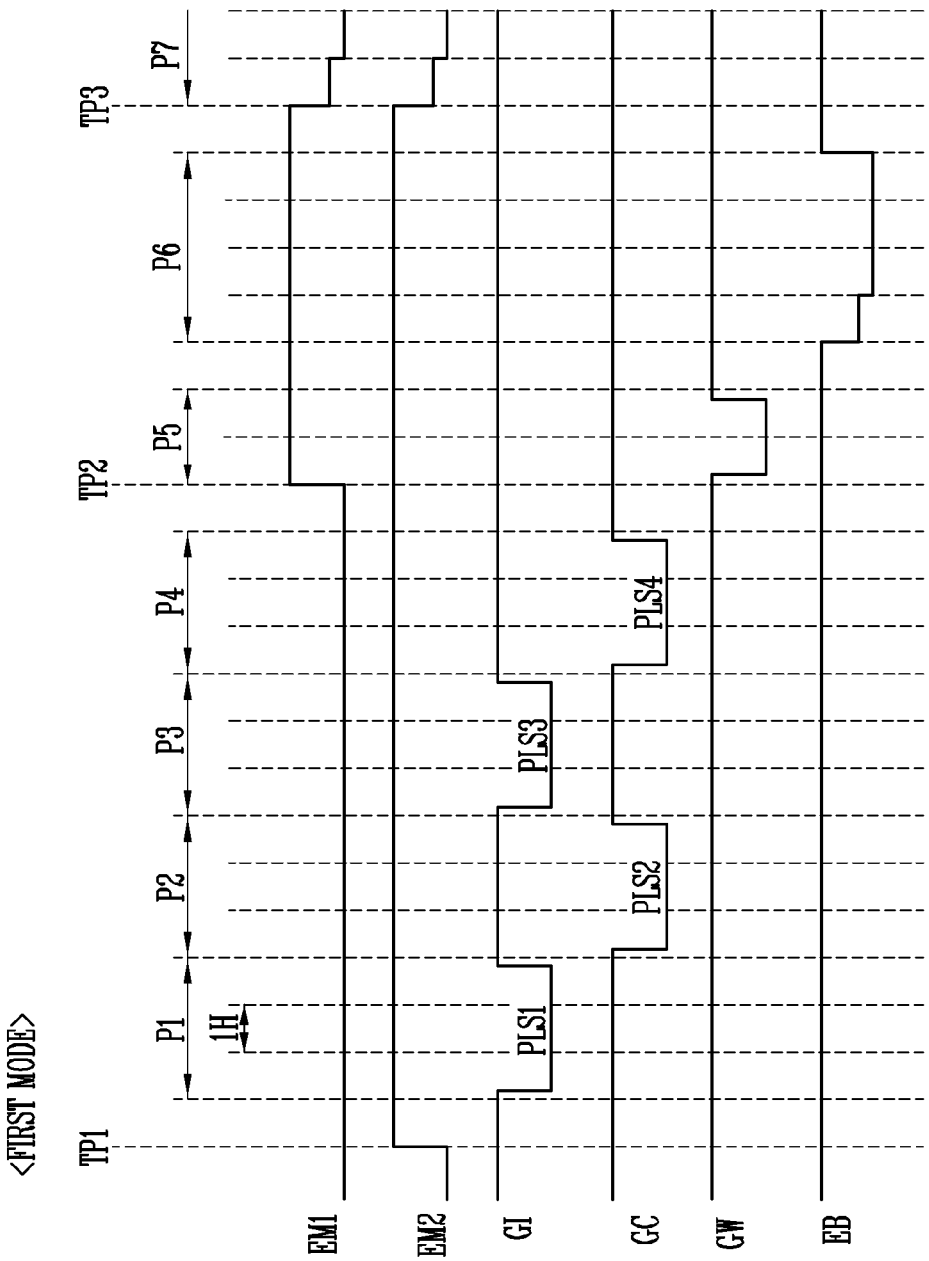

In an embodiment, the pulse width of the write gate signal GW may be greater than 1 horizontal time 1 H. As shown in FIG. 17, the pulse width of the write gate signal GW may be 2 horizontal times. A slew rate of the write gate signal GW may be changed according to a load of the write gate line GWLi (see FIG. 3), and the pulse width of the write gate signal GW may be variously changed by considering the slew rate of the write gate signal GW.

Figure 18:
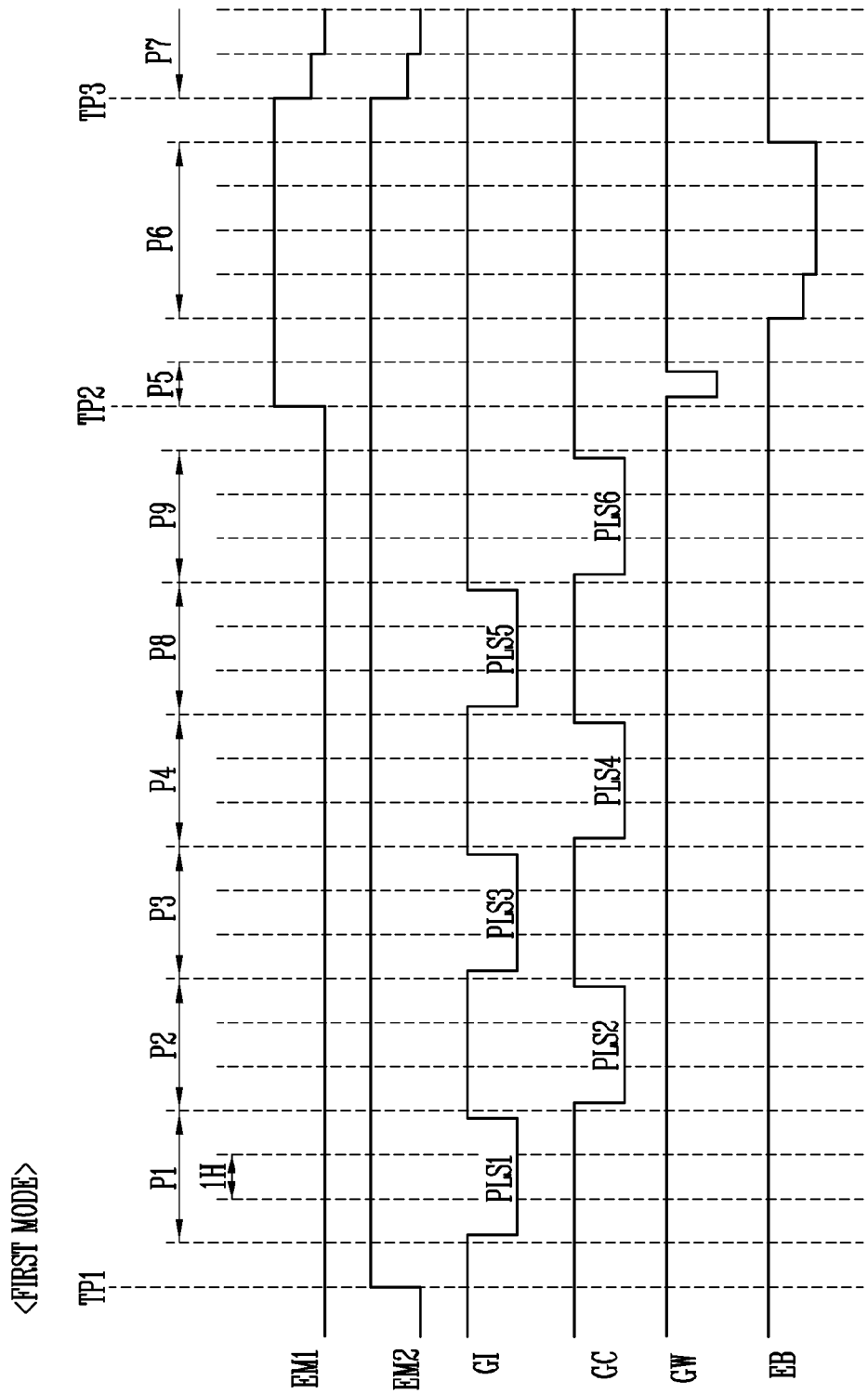

In embodiments, at least one of the initialization gate signal G1 and the compensation gate signal GC may include three or more pulses. In an embodiment, as shown in FIG. 18, the compensation gate signal GC may further include a sixth pulse PLS6 having the gate-on voltage level in a ninth period P9. The ninth period P9 may be allocated between the fourth period P4 (or an eighth period P8) and the fifth period P5. That is, a compensation operation on the pixel PXL may be performed three times. However, the present disclosure is not limited thereto, and the compensation operation may be performed four times or more.

In an embodiment, similarly to the compensation gate signal GC, the initialization gate signal G1 may further include a fifth pulse PLS5 having the gate-on voltage level in the eighth period P8. The eighth period P8 may be allocated between the fourth period P4 and the fifth period P5 (or the ninth period P9). That is, an initialization operation on the pixel PXL may be performed three times. However, the present disclosure is not limited thereto, and the initialization operation may be performed four times or more.

That is, the initialization operation and the compensation operation on the pixel PXL may be alternately repeatedly performed three times or more.

In embodiments, the initialization gate signal G1 and the compensation gate signal GC may have different waveforms.

Figure 19:
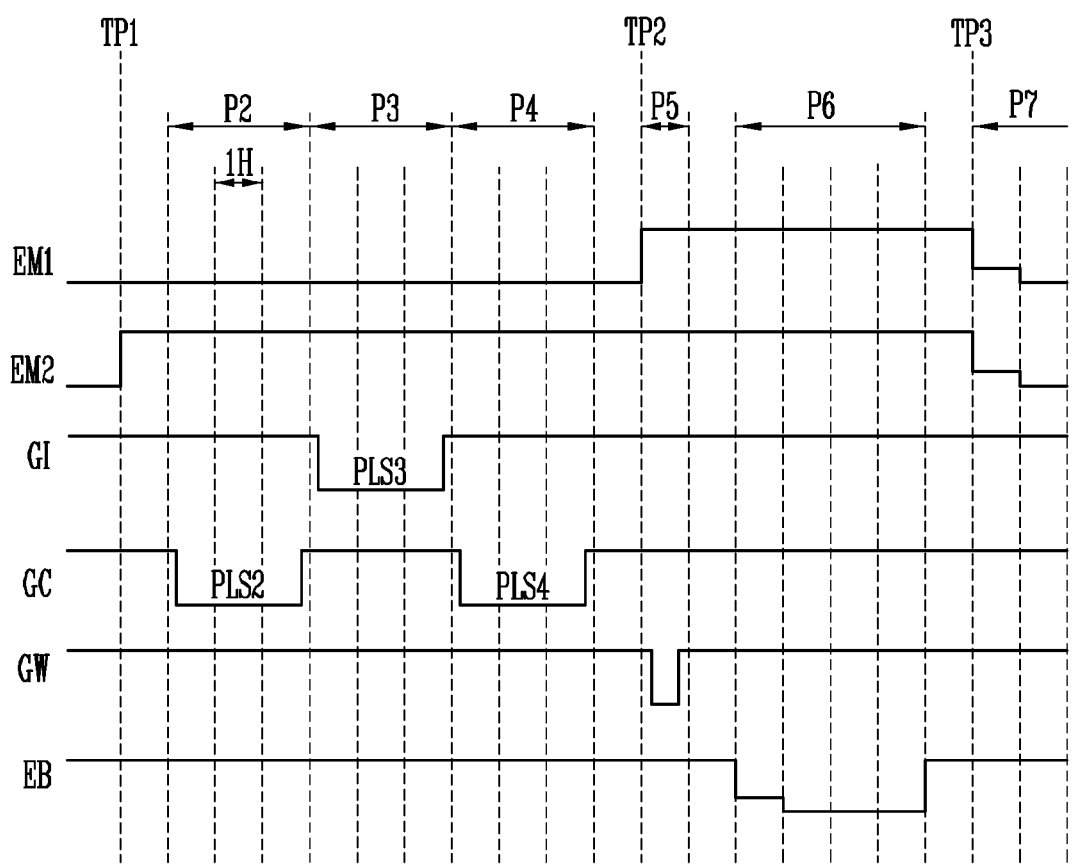

In an embodiment, as shown in FIG. 19, the compensation gate signal GC may have the second pulse PLS2 having the gate-on voltage level in the second period P2, the initialization gate signal G1 may have the third pulse PLS3 having the gate-on voltage level in the third period P3, and the compensation gate signal GC may have the fourth pulse PLS4 having the gate-on voltage level in the fourth period P4. That is, the first period P1 shown in FIG. 5 may be omitted. In other words, the compensation operation on the pixel PXL may be performed earlier than the initialization operation on the pixel PXL. Accordingly, a number of pulses of the compensation gate signal GC may be different from a number of pulses of the initialization gate signal GI. For example, the number of pulses of the compensation gate signal GC may be greater than the number of pulses of the initialization gate signal GI.

Meanwhile, although a case where the initialization gate signal G1 has only one pulse is illustrated in FIG. 19, the present disclosure is not limited thereto. For example, when the embodiments shown in FIGS. 18 and 19 are combined, the initialization gate signal G1 may have two or more pulses, and the compensation gate signal GC may have three or more pulses.

Figure 20:
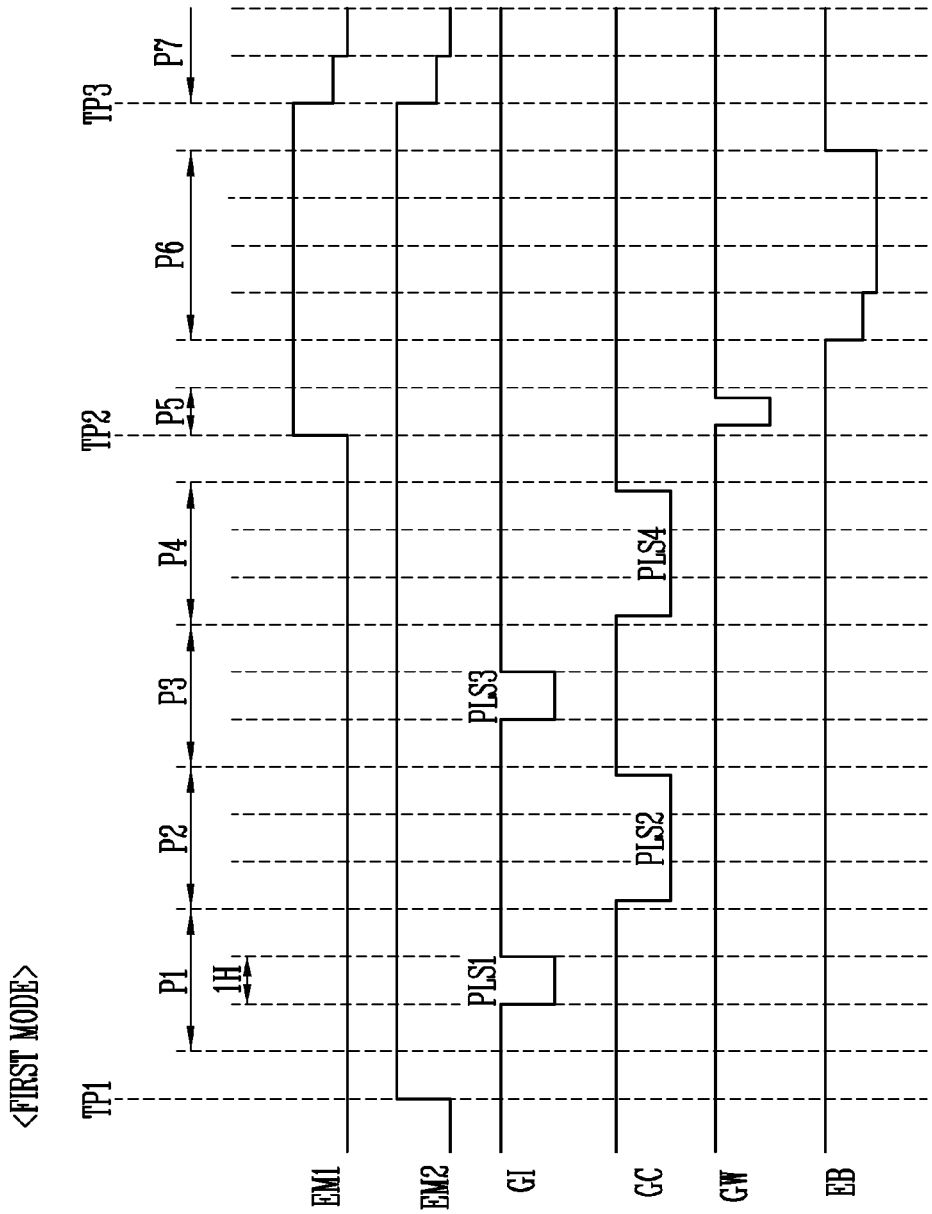

In an embodiment, the pulse width of the compensation gate signal GC may be different from the pulse width of the initialization gate signal GI. As shown in FIG. 20, the width of the pulse (i.e., the second pulse PLS2 and the fourth pulse PLS4) of the compensation gate signal GC may be 3 horizontal times, and the width of the pulse (i.e., the first pulse PLS1 and the third pulse PLS3) of the initialization gate signal G1 may be 1 horizontal time. A compensation period (i.e., the second period P2 and the fourth period P4, in which the compensation gate signal GC has the gate-on voltage level) may be set sufficiently long, such as 3 horizontal times, such that the compensation operation can be sufficiently performed, and an initialization period (i.e., the first period P1 and the third period P3, in which the initialization gate signal G1 has the gate-on voltage level) for the initialization operation may be set independently from the compensation period.

As described above, the waveforms of the initialization gate signal GI, the compensation gate signal GC, the write gate signal GW, and the bias control signal EB may be variously changed. By combining the embodiments shown in FIGS. 5, and 14 to 20, the waveforms of the initialization gate signal GI, the compensation gate signal GC, the write gate signal GW, and the bias control signal EB may be more variously changed. In addition, the above-described embodiments may be applied to the embodiment (i.e., the signals in the second mode) shown in FIG. 13.

As shown in FIG. 1, when the second gate driver 122 and the third gate driver 123 are implemented independently from each other, the initialization gate signal G1 and the compensation gate signal GC may have different waveforms. Alternatively, when the second gate driver 122_1 shown in FIG. 2 generates the initialization gate signal G1 and the compensation gate signal GC, the initialization gate signal G1 and the compensation gate signal GC may have the same waveform as shown in FIG. 5.

Figure 21:
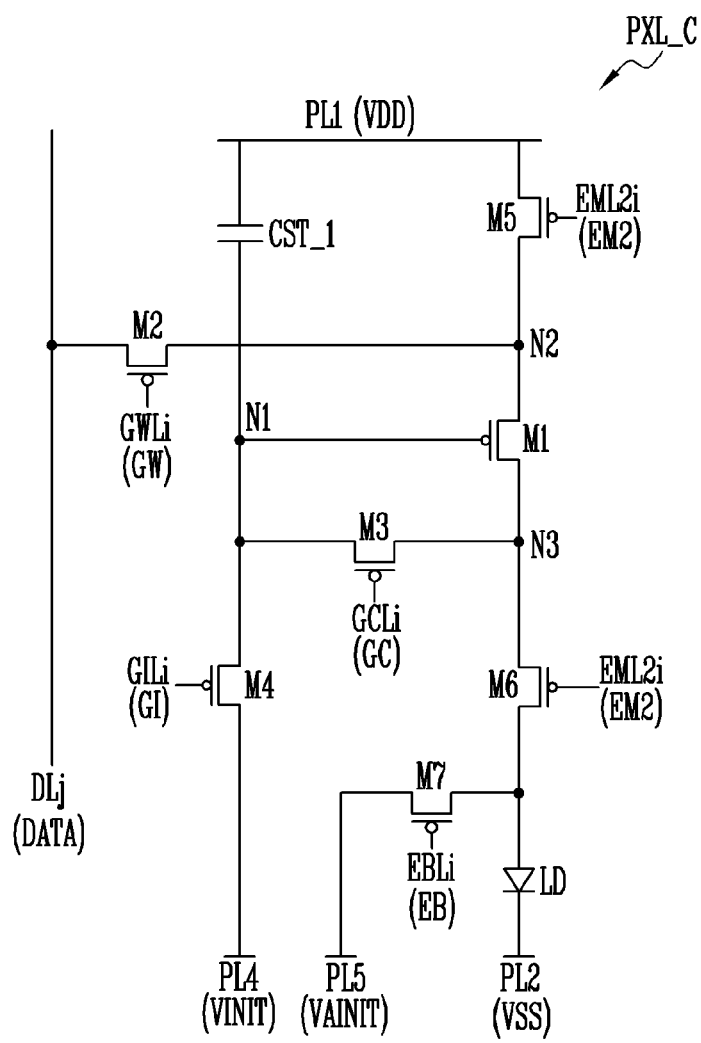
FIG. 21 is a circuit diagram illustrating an example of a pixel in accordance with a comparative embodiment.
Figure 22:
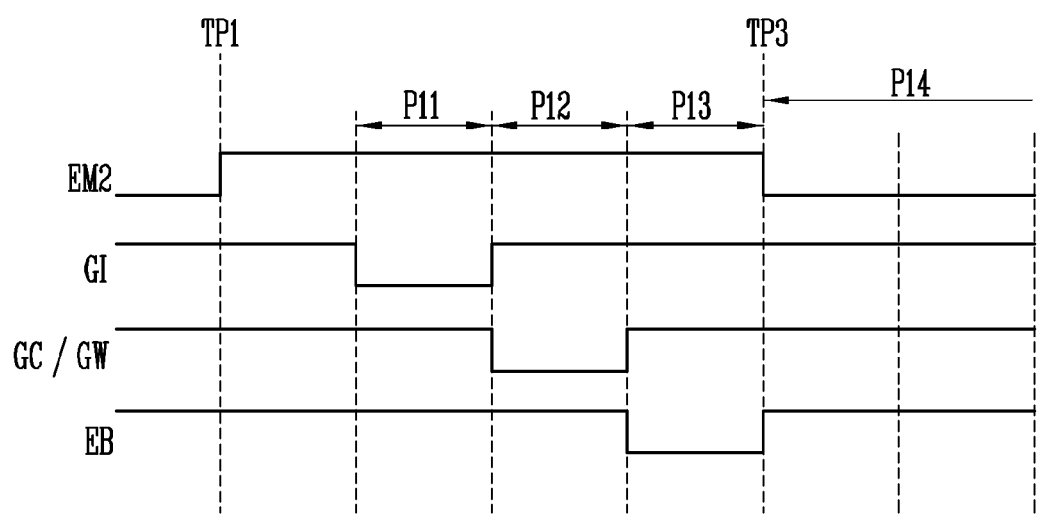
FIG. 22 is a waveform diagram illustrating an operation of the pixel shown in FIG. 21.
Figure 23:
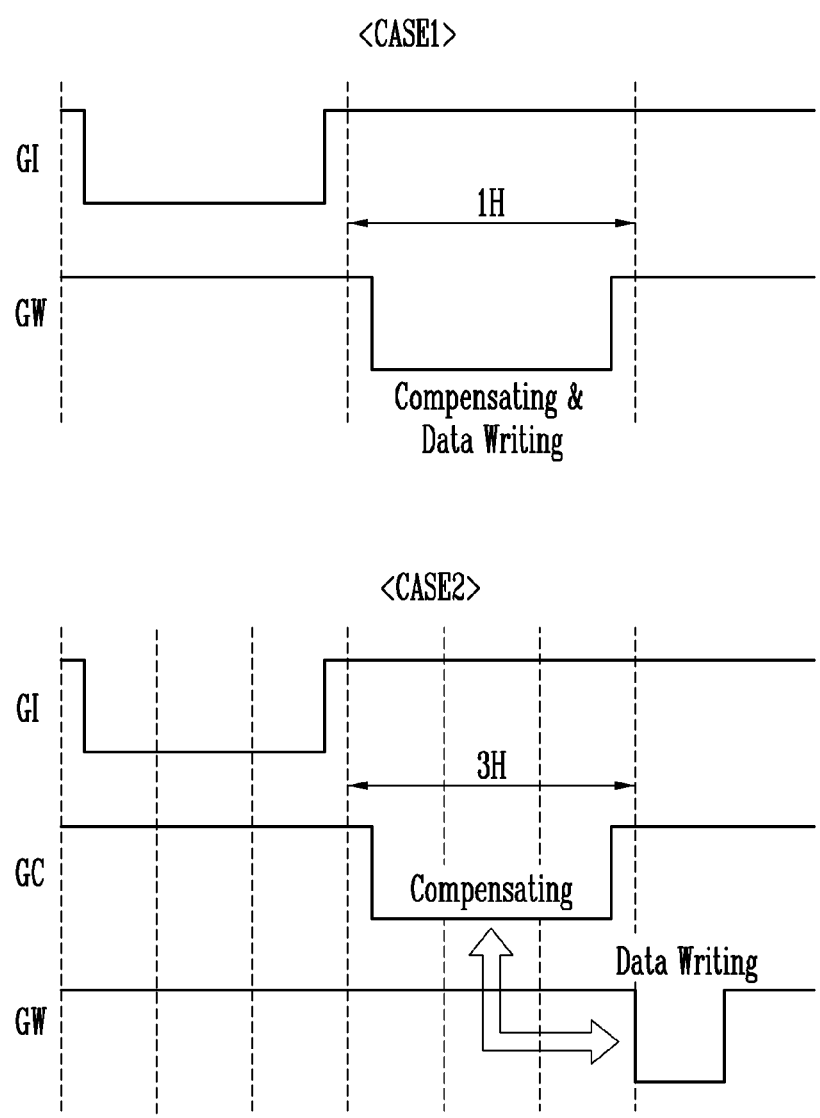
Figure 24:
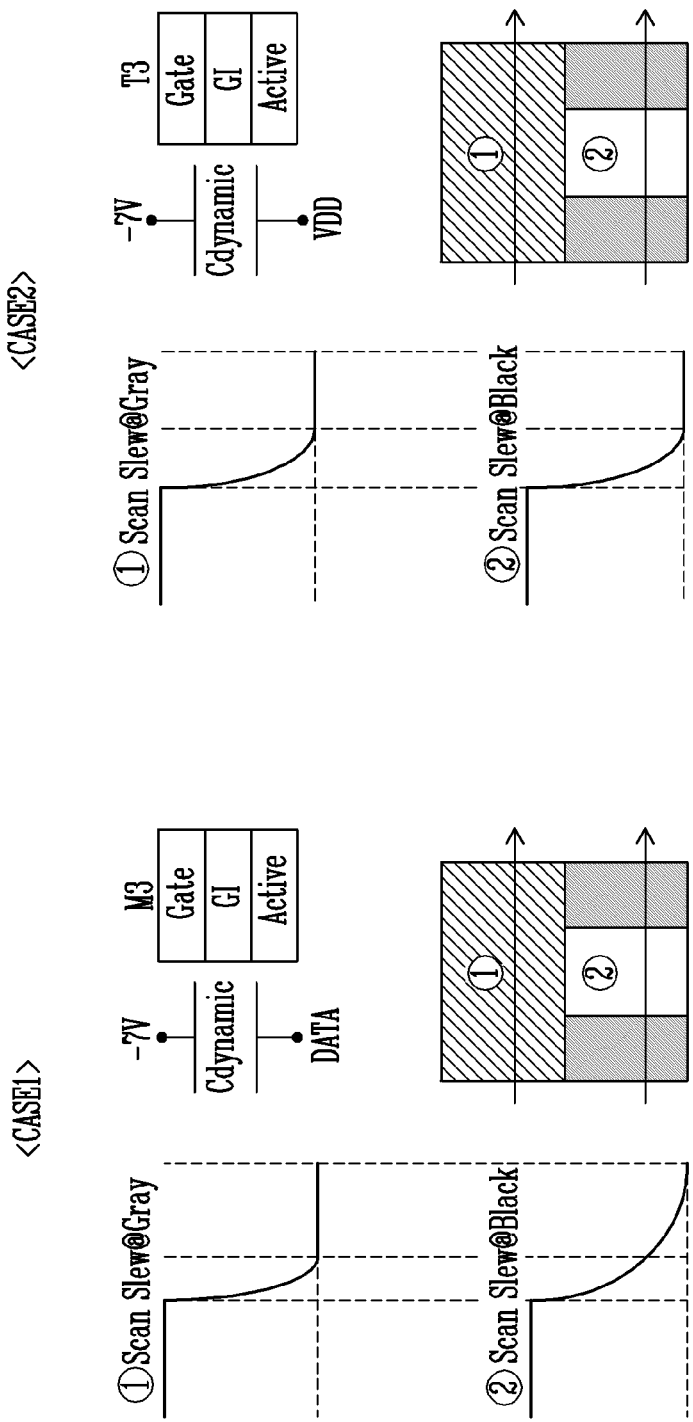

FIG. 21 is a circuit diagram illustrating an example of a pixel in accordance with a comparative embodiment. In FIG. 21, a comparative embodiment of a pixel PXL_C located on an ith pixel row ad a jth pixel column is illustrated. FIG. 22 is a waveform diagram illustrating an operation of the pixel shown in FIG. 21.

Referring to FIGS. 1, 21, and 22, the pixel PXL_C may include a light emitting element LD and a pixel circuit, and the pixel circuit may include thin film transistors M1 to M7 and a storage capacitor CST_1. The pixel PXL_C shown in FIG. 21 may be similar to the pixel PXL shown in FIG. 3, except the pixel circuit. Therefore, overlapping descriptions will not be repeated.

A first electrode of a first thin film transistor M1 may be connected to a second node N2, a second electrode of the first thin film transistor M1 may be connected to a third node N3, and a gate electrode of the first thin film transistor M1 may be connected to a first node N1. The first thin film transistor M1 may be referred to as a driving transistor.

The first thin film transistor M1 may control an amount of driving current flowing from a first power line PL1 to a second power line PL2 via a light emitting element LD, corresponding to a voltage of the first node N1.

A first electrode of a second thin film transistor M2 may be connected to a data line DLj, a second electrode of the second thin film transistor M2 may be connected to the first electrode of the first thin film transistor M1 (or the second node N2), and a gate electrode of the second thin film transistor M2 may be connected to a write gate line GWLi. The second thin film transistor M2 may be referred to as a switching transistor.

The second thin film transistor M2 may be turned on when a write gate signal GW is supplied to the write gate line GWLi, to electrically connect the data line DLj and the first electrode of the first thin film transistor M1 to each other.

A first electrode of the third thin film transistor M3 may be connected to the gate electrode of the first thin film transistor M1 (or the first node N1), a second electrode of the third thin film transistor M3 may be connected to the second electrode of the first thin film transistor M1 (or the third node N3), and a gate electrode of the third thin film transistor M3 may be connected to a compensation gate line GCLi. The third thin film transistor M3 may be referred to as a compensation transistor.

The third thin film transistor M3 may be turned on when a compensation gate signal GC is supplied to the compensation gate line GCLi, to electrically connect the first node N1 and the third node N3 to each other. Therefore, when the third thin film transistor M3 is turned on, the first thin film transistor M1 may be connected in a diode form.

A first electrode of a fourth thin film transistor M4 may be connected to the gate electrode of the first thin film transistor M1 (or the first node N1), a second electrode of the fourth thin film transistor M4 may be connected to a fourth power line PL4 (or first initialization power line), and a gate electrode of the fourth thin film transistor M4 may be connected to an initialization gate line GILi. The fourth thin film transistor M4 may be referred to as an initialization transistor.

The fourth thin film transistor M4 may be turned on when an initialization gate signal G1 is supplied to the initialization gate line GILi, to electrically connect the first node N1 to the fourth power line PL4.

A first electrode of the fifth thin film transistor M5 may be connected to the first power line PL1, a second electrode of the fifth thin film transistor M5 may be connected to the first electrode of the first thin film transistor M1 (or the second node N2), and a gate electrode of the fifth thin film transistor M5 may be connected to a second emission control line EML2i. The fifth thin film transistor M5 may be referred to as a first emission transistor.

A first electrode of a sixth thin film transistor M6 may be connected to the second electrode of the first thin film transistor M1 (or the third node N3), a second electrode of the sixth thin film transistor M6 may be connected to a first electrode (or anode electrode) of the light emitting element LD, and a gate electrode of the sixth thin film transistor M6 may be connected to a second emission control line EML2i. The sixth thin film transistor M6 may be referred to as a second emission transistor.

The fifth thin film transistor M5 and the sixth thin film transistor M6 may be turned off when a second emission control signal EM2 having the gate-off voltage level is supplied to the second emission control line EML2i, and be turned on when the second emission control signal EM2 having the gate-on voltage level is supplied to the second emission control line EML2i.

A first electrode of a seventh thin film transistor M7 may be connected to the first electrode of the light emitting element LD, a second electrode of the seventh thin film transistor M7 may be connected to a fifth power line PL5 (or second initialization power source line), and a gate electrode of the seventh thin film transistor M7 may be connected to a bias control line EBLi. The seventh thin film transistor M7 may be referred to as a bypass transistor.

The seventh thin film transistor M7 may be turned on when a bias control signal EB is supplied to the bias control line EBLi, to electrically connect the first electrode of the light emitting element LD to the fifth power line PL5.

The storage capacitor CST_1 may be formed or connected between the first power line PL1 and the gate electrode of the first thin film transistor M1 (or the first node N1). For example, a first electrode of the storage capacitor CST_1 may be connected to the first power line PL1, and a second electrode of the storage capacitor CST_1 may be connected to the gate electrode of the first thin film transistor M1. The storage capacitor CST_1 may store a voltage corresponding to a data voltage and a threshold voltage of the first thin film transistor M1 (e.g., a voltage obtained by reflecting the threshold voltage of the first thin film transistor M1 to the data voltage).

The first electrode (or anode electrode) of the light emitting element LD may be connected to the second electrode of the sixth thin film transistor M6, and a second electrode (or cathode electrode) of the light emitting element LD may be connected to the second power line PL2. The light emitting element LD may generate light with a predetermined luminance, corresponding to a current supplied from the first thin film transistor M1.

The thin film transistors M1 to M7 may be implemented with a P-type transistor, but the present disclosure is not limited thereto. For example, at least some of the thin film transistors M1 to M7 may include an oxide semiconductor or be implemented with an N-type semiconductor or a P-type semiconductor.

Referring to FIGS. 21 and 22, the pixel PXL_C may be supplied with signals for image display in a non-emission period between a first time TP1 and a third time TP3, and emit light, based on the signals, in the other period (i.e., an emission period) except the non-emission period in one frame.

The non-emission period may include an eleventh period P11, a twelfth period P12, and a thirteenth period P13, and the emission period may include a fourteenth period P14.

In the non-emission period, the second emission control signal EM2 may have the gate-off voltage level. The fifth and sixth thin film transistors M5 and M6 may be turned off, and the pixel PXL_C may emit no light.

In the eleventh period P11, the initialization gate signal G1 may have the gate-on voltage level. The fourth thin film transistor M4 may be turned on, and a voltage applied to the fourth power line PL4, i.e., the first initialization voltage VINIT may be supplied to the first node N1.

In the twelfth period P12, the compensation gate signal GC may have the gate-on voltage level. The third thin film transistor M3 may be turned on, the first thin film transistor M1 may be connected in a diode form, and the threshold voltage of the first thin film transistor M1 may be compensated.

In addition, the write gate signal GW may have the gate-on voltage level. The second thin film transistor M2 may be turned on, the data signal DATA from the data line DLj may be supplied to the second node N2. Since the first node N1 is initialized to the first initialization voltage VINIT lower than a voltage of the data signal DATA (e.g., the first node N1 is initialized to the on-bias state), the first thin film transistor M1 may be in the turn-on state.

The data signal DATA supplied to the second node N2 may be supplied to the first node N1 via the first thin film transistor M1 connected in the diode form. Then, a voltage corresponding to the data signal DATA and the threshold voltage of the first thin film transistor M1 may be applied to the first node N1. The voltage of the first node N1 may be stored in the storage capacitor CST_1.

In the thirteenth period P13, the bias control signal EB may have the gate-on voltage level. The seventh thin film transistor M7 may be turned on, and a voltage applied to the fifth power line PL5, i.e., the second initialization voltage VAINIT may be supplied to the first electrode of the light emitting element LD. Accordingly, a residual voltage remaining in a parasitic capacitor of the light emitting element LD may be discharged.

In the fourteenth period P14, the second emission control signal EM2 may have the gate-on voltage level. The fifth and sixth thin film transistors M5 and M6 may be turned on. The first thin film transistor M1 may control an amount of driving current flowing through the light emitting element LD, corresponding to the voltage of the first node N1. Then, the light emitting element LD may generate light with a luminance corresponding to the driving current.

FIGS. 23 to 30 are diagrams illustrating effects of the display device in accordance with the embodiments of the present disclosure. With respect to the pixel PXL_C in accordance with the comparative embodiment shown in FIGS. 21 and 22, effects of the pixel PXL in accordance with the embodiments (e.g., the embodiments shown in FIGS. 3 to 5 and 13 to 20) of the present disclosure will be described. Hereinafter, a first case CASE1 may represent an operation of the pixel PXL_C (see FIG. 21) in accordance with the comparative embodiment, and a second case CASE2 may represent an operation of the pixel PXL in accordance with the embodiments of the present disclosure.

First, referring to FIGS. 3, 5, 21, 22, and 23, the pixel PXL_C may simultaneously perform a compensation operation according to the compensation gate signal GC and a data writing operation according to the write gate signal GW. When the pulse width of the compensation gate signal GC becomes large so as to sufficiently perform the compensation operation, the pulse width of the write gate signal GW cannot help but become large. That is, the pulse width of the write gate signal GW becomes greater than 1 horizontal time 1 H, or the absolute magnitude of 1 horizontal time 1 H becomes large. Therefore, high speed driving of a display device according to the first case CASE1 may be impossible.

Meanwhile, the pixel PXL may perform a compensation operation according to the compensation gate signal GC and a data writing operation according to the write gate signal GW to be separated from each other. Therefore, regardless of the pulse width of the write gate signal GW, the pulse width of the compensation gate signal GC can be infinitely extended. For example, the pulse width of the compensation gate signal GC may be set equal to or greater than 3 horizontal times in a state in which the pulse width of the write gate signal GC is fixed to 1 horizontal time. Thus, high speed driving of the display device 100 (see FIG. 1) can be possible while the compensation operation on the pixel PXL is sufficiently performed.

Further, as described with reference to FIGS. 5, 7, and 9, the compensation operation is repeatedly performed twice or more while being separated from the data writing operation, so that influence of a previous data signal can be removed, and the compensation operation can be more accurately performed.

Referring to FIGS. 3, 5, 21, 22, and 24, the third thin film transistor M3 of the pixel PXL_C and the third transistor T3 of the pixel PXL in a process of performing the compensation operation are illustrated. Each of the third thin film transistor M3 of the pixel PXL_C and the third transistor T3 of the pixel PXL may have a capacitor component Cdynamic caused by stacking of a gate electrode Gate, an insulating layer GI, and an active layer Active (semiconductor layer or channel). The capacitance of the capacitor component Cdynamic may vary according to a voltage applied to the active layer Active, and the slew rate (e.g., "Scan Slew") of the compensation gate signal GC may be determined or changed according to the capacitance.

Referring to the first case CASE1, in the twelfth period P12 shown in FIG. 22, the compensation gate signal GC may have the gate-on voltage level (e.g., −7V), and a data signal DATA may be applied to the active layer Active of the third thin film transistor M3. For example, when the data signal DATA corresponds to a gray color, the capacitor component Cdynamic of the third thin film transistor M3 may correspond to about 3V. In another example, when the data signal DATA corresponds to a black color, the capacitor component Cdynamic of the third thin film transistor M3 may correspond to about 6.5V. The capacitor component Cdynamic according to the data signal of the black color may become relatively large. The slew rate of the compensation gate signal GC may become low, or a longer time may be taken in transition of the compensation gate signal GC. That is, a voltage of the active layer Active of the third thin film transistor M3 may vary according to the data signal DATA, and a difference in slew rate may occur according to a pattern (e.g., black→gray→black) of the data signal DATA. When the slew rate becomes low, the high speed driving of the display device may be impossible.

Meanwhile, referring to the second case CASE2, in the second period P2 shown in FIG. 5, the compensation gate signal GC may have the gate-on voltage level (e.g., −7V), and the first power voltage VDD may be applied to the active layer Active of the third transistor T3 of the pixel PXL (see FIG. 8). That is, regardless of the data signal DATA, a voltage of the active layer Active of the third transistor T3 may have the first power voltage VDD, and any difference in slew rate according to a pattern (e.g., black→gray→black) of the data signal DATA may not occur.

Figure 25:
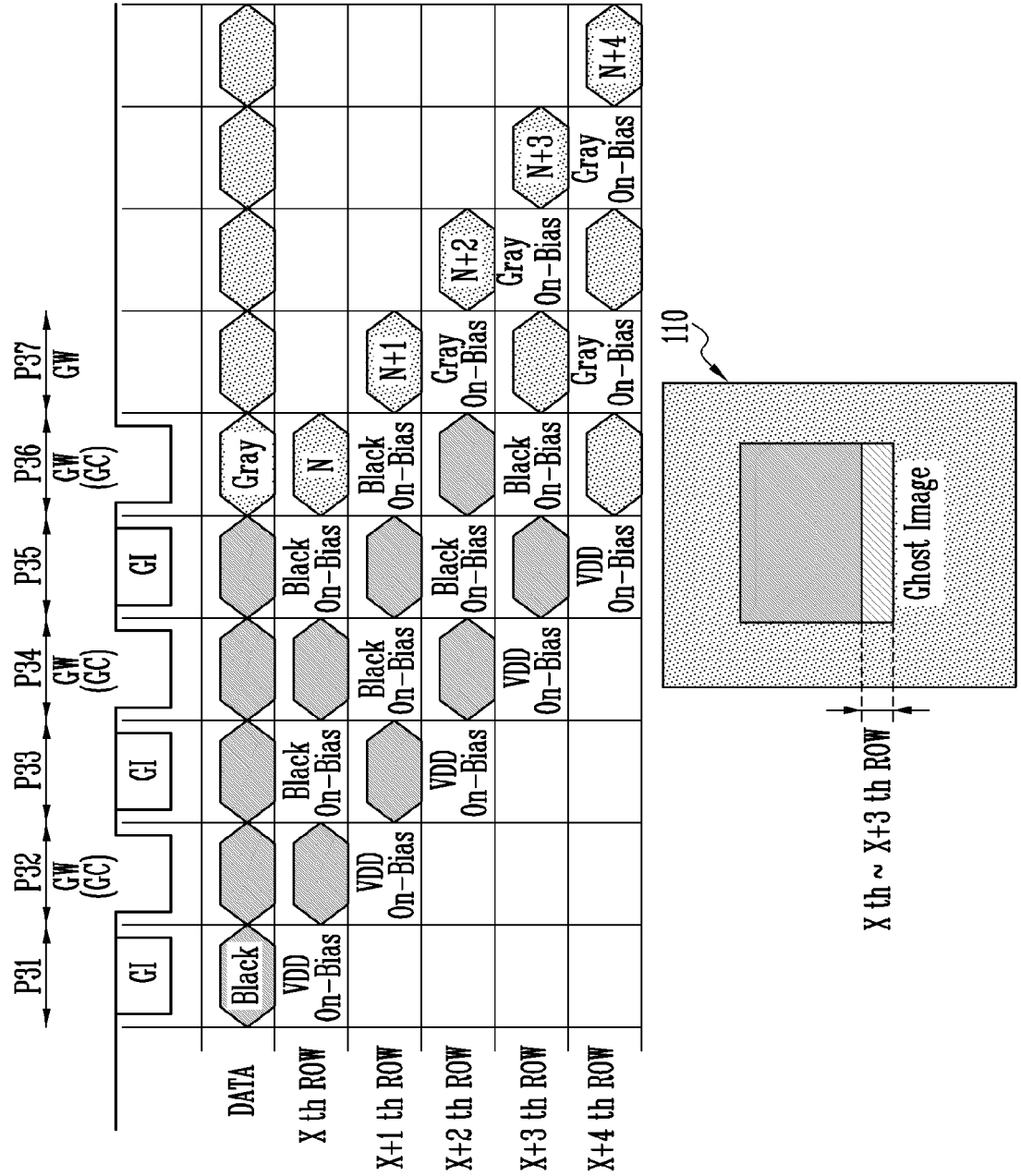

Referring to FIGS. 21, 22, and 25, in order to improve step efficiency, the initialization operation (and the compensation operation) of the pixel PXL_C shown in FIG. 21 may be performed plural times. The step efficiency may be a phenomenon in which, when the display device which displayed a black image in previous frames displays a white image in next frames, the luminance of the display device becomes lower than a desired luminance (i.e., a target luminance) in a first frame in which the white image is displayed. In other words, when the black image is changed to the white image, a luminance change does not immediately occur, and the luminance may be stepwisely changed throughout some frames. A ratio of the luminance in the first frame with respect to the desired luminance may be defined as the step efficiency. The step efficiency in case that the on-bias voltage (or on-bias amount, e.g., a voltage applied between the gate electrode and the source electrode of the first thin film transistor M1 in an initialization operation) of the first transistor T1 increases can be improved, and therefore, the initialization operation of the pixel PXL_C shown in FIG. 21 may be performed plural times.

The initialization gate signal G1 and the write gate signal GW (or the compensation gate signal GC) alternately have the gate-on voltage level (e.g., the logic low level), and the alternating operation may be repeated three times. That is, the eleventh period P11 and the twelfth period P12, which are shown in FIG. 22, may be repeated three times. In FIG. 25, an initialization gate signal G1 and a write gate signal GW for the pixel PXL_C on an Xth row are illustrated. The initialization gate signal G1 (and the write gate signal GW) may be sequentially shifted and provided to the pixels PXL_C on an (X+1)th row, an (X+2)th row, an (X+3)th row, and an (X+4)th row.

As shown in FIG. 25, it is assumed that a black image is displayed in a specific area and a gray image is displayed in the other area. Accordingly, data signal DATA may sequentially include a black signal corresponding to the black image and a gray signal corresponding to the gray image. An operation of the pixel PXL_C on the Xth row will be first described.

In a thirty-first period P31, the initialization gate signal G1 may have the gate-on voltage level, and the first initialization voltage VINIT may be applied to the gate electrode of the first thin film transistor M1. Since the pixel PXL_C emits light before the thirty-first period P31, the first power voltage VDD may be applied to the first electrode of the first thin film transistor M1 in the thirty-first period P31. In the thirty-first period P31, the source-gate voltage (i.e., a difference between a voltage of the first electrode and a voltage of the gate electrode) of the first thin film transistor M1 may be expressed as "VDD-VINIT." In the thirty-first period P31, it may be expressed that an on-bias voltage corresponding to the first power voltage VDD has been applied.

Subsequently, in a thirty-second period P32, the write gate signal GW (and the compensation gate signal GC) may have the gate-on voltage level, and a data signal DATA, e.g., a black signal may be applied to the first thin film transistor M1.

Subsequently, in the thirty-third period P33, the initialization gate signal G1 may have the gate-on voltage level, and the first initialization voltage VINIT may be applied to the gate electrode of the first thin film transistor M1. Since the black signal is applied to the first electrode of the first thin film transistor M1 in the thirty-second period P32, the source-gate voltage of the first thin film transistor M1 may be expressed as "DATA-VINIT" in the thirty-third period P33. In the thirty-third period P33, it may be expressed that on-bias voltage corresponding to the black signal has been applied.

An operation of the pixel PXL_C in a thirty-fourth period P34 and a thirty-fifth period P35 may be substantially identical to the operation of the pixel PXL_C in the thirty-second period P32 and the thirty-third period P33. In the thirty-fifth period P35, an on-bias voltage corresponding to the black signal may be applied.

Subsequently, in a thirty-sixth period P36, the write gate signal GW (and the compensation gate signal GC) may have the gate-on voltage level, and a data signal DATA, e.g., a gray signal may be applied to the gate electrode of the first thin film transistor M1. After the thirty-sixth period P36, the pixel PXL_C may emit light with a luminance corresponding to an accumulation amount of the on-bias voltage and the gray signal. The accumulation amount of the on-bias voltage with respect to the pixel PXL_C of the Xth row may be briefly expressed as "VDD+Black+Black."

Meanwhile, in the thirty-second period P32, the thirty-fourth period P34, and the thirty-sixth period P36, an on-bias voltage may be applied to the pixel PXL_C of the (X+1)th row. Since the first power voltage VDD is applied to the pixel PXL_C of the (X+1)th row before the thirty-second period P32, an on-bias voltage corresponding to the first power voltage VDD may be applied to the pixel PXL_C of the (X+1)th row in the thirty-second period P32. Since a black signal is applied to the first electrode of the first thin film transistor M1 of the pixel PXL_C of the (X+1)th row in the thirty-third period P33 and the thirty-fifth period P35, an on-bias voltage corresponding to the black signal may be applied in the thirty-fourth period P34 and the thirty-sixth period P36. That is, identically to the accumulation amount of the on-bias voltage with respect to the pixel PXL_C of the Xth row, the accumulation amount of the on-bias voltage with respect to the pixel PXL_C of the (X+1)th row may be briefly expressed as "VDD+Black+Black."

Meanwhile, in the thirty-third period P33, the thirty-fifth period P35, and a thirty-seventh period P37, an on-bias voltage may be applied to the pixel PXL_C of the (X+2)th row. Since data signal DATA has the gray signal instead of the black signal from the thirty-sixth period P36, an on-bias voltage corresponding to the gray signal may be applied in the thirty-seventh period P37. That is, an accumulation amount of the on-bias voltage with respect to the pixel PXL_C of the (X+2)th row is different from the accumulation amount of the on-bias voltage with respect to the pixel PXL_C of the (X+1)th row, and may be briefly expressed as "VDD+Black+Gray."

In this manner, an accumulation amount of the on-bias voltage with respect to the pixel PXL_C of the (X+3)th row may be briefly expressed as "VDD+Black+Gray," and an accumulation amount of the on-bias voltage with respect to the pixel PXL_C of the (X+4)th row may be briefly expressed as "VDD+Gray+Gray." An accumulation amount of the on-bias voltage with respect to the pixel PXL_C after the (X+4)th row may also be briefly expressed as "VDD+Gray+Gray."

That is, an accumulation amount of the on-bias voltage with respect to the pixels PXL_C included in the Xth to (X+3)th rows is different from an accumulation amount of the on-bias voltage of the pixel PXL_C of the (X+4)th row (or rows subsequent thereto). With respect to the same data signal DATA (e.g., the gray signal), the pixels PXL_C included in the (X+1)th to (X+3)th rows may emit light with a luminance different from a luminance of the pixel PXL_C of the (X+4)th row (or rows subsequent thereto). That is, an unintended ghost image may be displayed on the (X+1) to (X+3)th rows of the display unit 110.

Meanwhile, in the initialization operation (and the compensation operation) of the pixel PXL in accordance with the embodiments of the present disclosure, as shown in FIGS. 6 to 9, the first power voltage VDD is applied to the first electrode of the first transistor T1, and the source-gate voltage (i.e., a difference between a voltage of the first electrode and a voltage of the gate electrode) of the first transistor T1 may be expressed "VDD-VINIT." That is, regardless of the data signal DATA, a constant on-bias voltage is always applied to the pixel PXL, and any ghost image does not occur.

Referring to FIGS. 3, 5, 21, 22, and 26, the pixel PXL_C directly writes a data signal DATA to the gate electrode of the first thin film transistor M1 while performing the compensation operation, and therefore, the write gate signal GW having the gate-on voltage level is to be applied to the pixel PXL_C after the data signal DATA is changed to a normal state (e.g., a target voltage level). That is, the pulse width of the write gate signal GW for the pixel PXL_C is set by considering a transition time (or margin) of the data signal DATA. When the display device performs high speed driving (i.e., when the display device is driven at high speed), the write gate signal GW becomes smaller than 1 horizontal time 1 H by considering the transition time of the data signal, and therefore, the data signal DATA may not be appropriately written (or charged) in the pixel PXL_C. In other words, the high speed driving of the display device including the pixel PXL_C is impossible.

Meanwhile, in the pixel PXL, a data signal DATA may be indirectly written to the gate electrode of the first transistor T1 through the storage capacitor CST (see FIG. 10). Also, the written data signal DATA may be maintained by the hold capacitor CHOLD and the storage capacitor CST. That is, as compared with a previous frame, a pulse width of the write gate signal GW for the pixel PXL may be set regardless of the transition time (or margin) of the data signal DATA such that only a variation of a data signal DATA of a current frame is reflected. Thus, high speed driving of the display device 100 (see FIG. 1) including the pixel PXL is possible.

In some embodiments, a variation of the data signal DATA may not be reflected according to a slew rate of the data signal DATA. The pulse width of the write gate signal GW may be set greater than 1 horizontal time 1 H. For example, the pulse width of the write gate signal GW may be set to 2 horizontal times. Since only a variation of a data signal DATA of a current frame is reflected with respect to a data signal DATA of a previous frame (i.e., since only a finally changed state of the data signal DATA is considered, and any change of the data signal DATA for 2 horizontal times is not considered), a write gate signal GW of a current row may partially overlap with a write gate signal GW of a previous row. That is, although the pulse width of the write gate signal GW is set to 2 horizontal times, the write gate signal GW may be sequentially provided at an interval of 1 horizontal time to the write gate lines GWL1 to GWLn (see FIG. 1). Thus, the high speed driving of the display device 100 (see FIG. 1) including the pixel PXL is possible.

Referring to FIG. 27, a full white image may be displayed in the display unit 110 according to a third case CASE3. For example, an area Box in which the white image is displayed may be 100% of the display unit 110. A full white image may be partially displayed in the display unit 110 according to a fourth case CASE4. In other words, for example, an area Box in which the white image is displayed may be 50% of the display unit 110.

A luminance of the pixel PXL_C shown in FIG. 21, which corresponds to the white color according to the third case CASE3 may be different from a luminance of the pixel PXL_C shown in FIG. 21, which corresponds to the white color according to the fourth case CASE4.

A driving current flowing in the pixel PXL_C shown in FIG. 21 may be expressed as shown in the following Equation 2.

$$Id\_C = K\_C(Vgs - Vth)^2 = K\_C(VDD - DATA)^2 \quad \text{Equation 2}$$

Id_C may be a driving current, K_C may be a constant according to a characteristic (e.g., a channel width/length or the like) of the first thin film transistor M1, and Vgs may be a gate-source voltage.

A data signal DATA compensated for by a threshold voltage Vth may be applied to the gate electrode of the first thin film transistor M1 of the pixel PXL_C, and the first power voltage VDD is applied to the first electrode of the first thin film transistor M1 when the pixel PXL_C emits light. Therefore, a driving current Id_C flowing in the pixel PXL_C may be determined by the first power voltage VDD and the data signal DATA.

In the pixel PXL_C shown in FIG. 21, a driving current flows from the first power line PL1 to the second power line PL2 through the light emitting element LD, i.e., since a current flows in the first power line PL1, a voltage drop (i.e., an IR drop) may occur in the first power voltage VDD applied to the first power line PL1. In the third case CASE3, a relatively large current flows in the first power line PL1, corresponding to the full white image. Therefore, a relatively large voltage drop may occur in the first power voltage VDD, and the luminance of the pixel PXL_C may be relatively low. On the other hand, in the fourth case CASE4, a relatively small current flows in the first power line PL1, corresponding to the partial white image. Therefore, a relatively small voltage drop may occur in the first power voltage VDD, and the luminance of the pixel PXL_C may be relatively high. Accordingly, the luminance of the pixel PXL_C shown in FIG. 21 may be changed according to a load of the display unit 110, such as the third case CASE3 or the fourth case CASE4.

Alternatively, a driving current flowing in the pixel PXL shown in FIG. 3 may be expressed as shown in the above-described Equation 1, and a driving current flowing in the pixel PXL may be determined by the reference voltage VREF and the data signal DATA. As described with reference to FIG. 7, the reference voltage VREF of the third power line PL3 is merely applied to the fourth node N4, and any current does not flow in the third power line PL3. Therefore, the luminance of the pixel PXL shown in FIG. 3 may be constant or be equal to a target luminance, regardless of the load of the display unit 110, such as the third case CASE3 or the fourth case CASE4.

In addition, the driving current flowing in the pixel PXL shown in FIG. 3 is determined by the reference voltage VREF instead of the first power voltage VDD having a relatively high voltage level, and thus power consumption of the display device 100 can be reduced. For example, while a voltage range of a data signal in the pixel PXL_C shown in FIG. 21 is set to 3V to 6.5V with respect to the first power voltage VDD of 7V, a voltage range of a data signal in the pixel PXL shown in FIG. 3 may be set to 1.5V to 4V with respect to the reference voltage VREF of 4.5V. Thus, power consumption of the data driver 130 which provides the data signal to the pixel PXL can be reduced.

Referring to FIGS. 3, 5, 21, 22, and 28, the pixel PXL_C and the pixel PXL are briefly illustrated based on components related to on-bias of the first thin film transistor M1 and the first transistor T1.

In the eleventh period P11 described with reference to FIG. 22, the fourth thin film transistor M4 of the pixel PXL_C shown in FIG. 21 may be turned on in response to the initialization gate signal G1 having the gate-on voltage level, and the first initialization voltage VINIT may be applied to the first node N1. The fifth thin film transistor M5 and the sixth thin film transistor M6 may be turned off in response to the second emission control signal EM2 having the gate-off voltage level, and the first electrode of the first thin film transistor M1 may be floated. The voltage Vs (i.e., the source voltage) of the first electrode of the first thin film transistor M1 may be determined by a first parasitic capacitance Cse and a second parasitic capacitance Cgs. The first parasitic capacitance Cse may be a parasitic capacitance formed between the first electrode of the first thin film transistor M1 and the first power line PL1, and the second parasitic capacitance Cgs may be a parasitic capacitance formed between the gate electrode and the first electrode of the first thin film transistor M1.

The source-gate voltage applied between the first electrode and the gate electrode of the first thin film transistor M1 may be in proportion to a difference A Vg between the first power voltage VDD applied to the first power line PL1 and the voltage (e.g., the first initialization voltage VINIT) of the gate electrode of the first transistor T1 and the first parasitic capacitance Cse, and be in inverse proportion to the second parasitic capacitance Cgs (i.e., "Vsg=Cse/Cgs× ΔVg"). For example, the source-gate voltage Vsg (or on-bias voltage) of the first thin film transistor M1 may be about −4V.

Meanwhile, the first electrode of the first transistor T1 of the pixel PXL may be directly connected to the first power line PL1. That is, the first electrode of the first transistor T1 may be non-floated, and the voltage Vs (i.e., the source voltage) of the first electrode of the first transistor T1 may be equal to the first power voltage VDD.

In the first period P1 and the third period P3, which are described with reference to FIG. 5, the fourth transistor T4 may be turned on in response to the initialization gate signal GI having the gate-on voltage level, and the first initialization voltage VINIT may be applied to the first node N1. Therefore, the source-gate voltage Vsg applied between the first electrode and the gate electrode of the first transistor T1 may be equal to a difference between the first power voltage VDD applied to the first power line PL1 and the first initialization voltage VINIT (i.e., "Vsg=VDD-VINIT"). For example, the source-gate voltage Vsg (or on-bias voltage) of the first transistor T1 may be about −8V. When the on-bias voltage (or on-bias amount) of the first transistor T1 increases, the step efficiency can be improved or enhanced.

That is, since the first electrode of the first transistor T1 of the pixel PXL is directly connected to the first power line PL1 and is non-floated, the on-bias voltage (or on-bias amount) of the first transistor T1 increases, and the step efficiency can be improved or enhanced.

Figure 29:
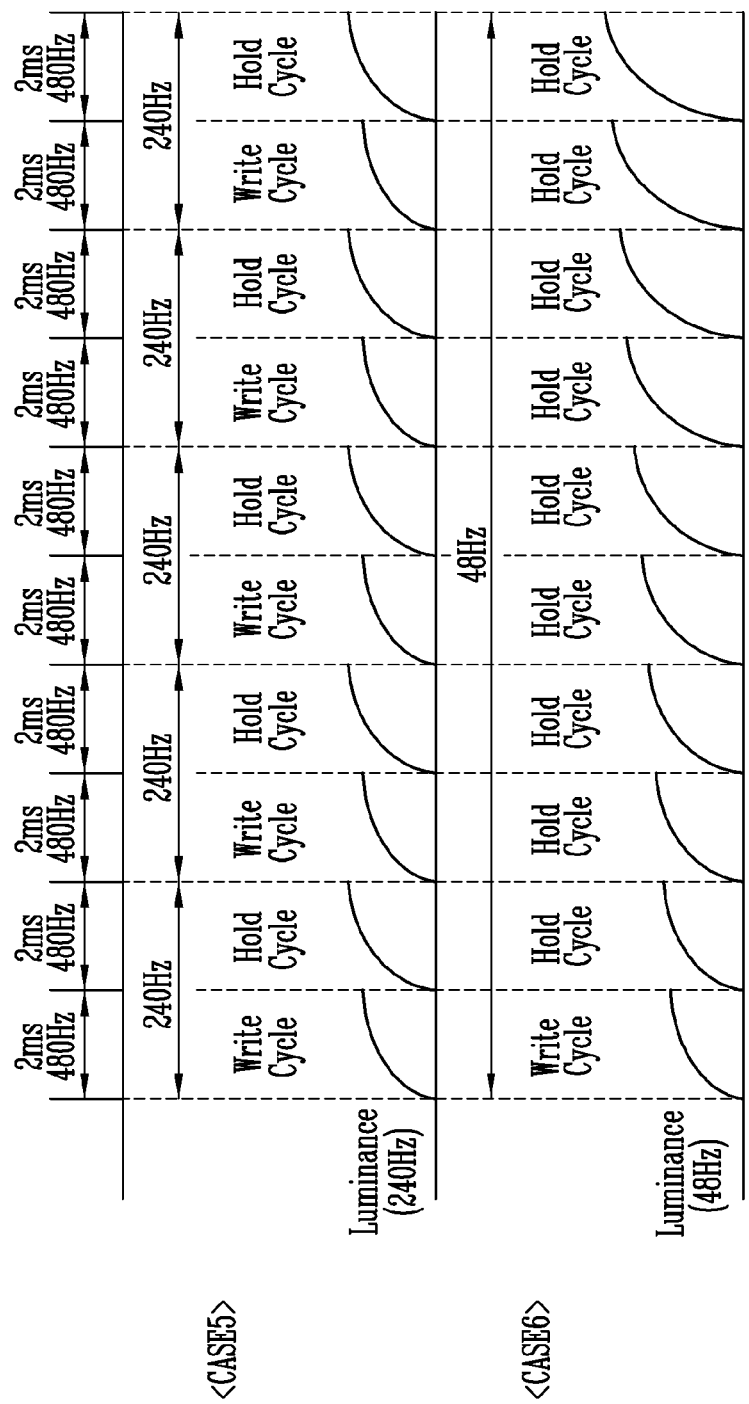
Figure 30:
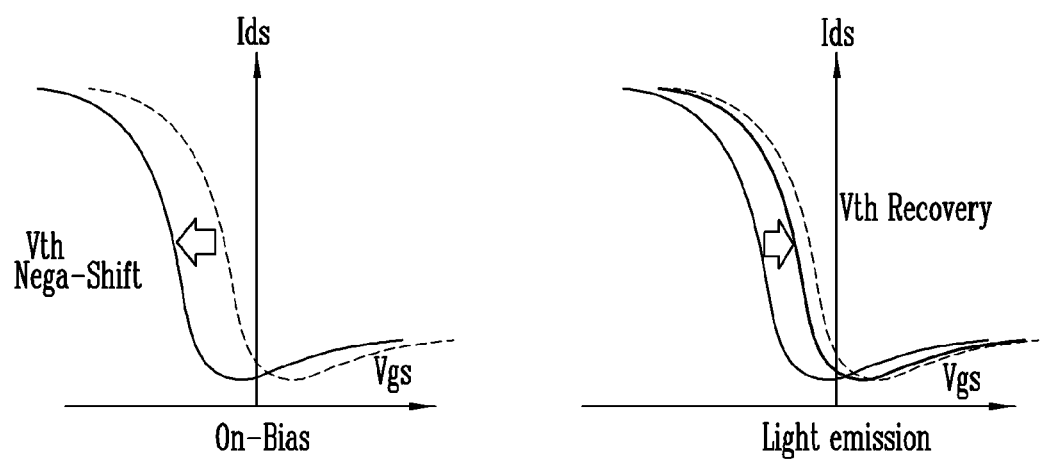

A luminance change of the display device is illustrated in FIG. 29, and a voltage-current characteristic of the first thin film transistor M1 or the first transistor T1 is illustrated in FIG. 30.

Referring to FIGS. 3, 5, 13, 21, 22, and 29, the display device 100 including the pixel PXL shown in FIG. 3 (or the pixel PXL_C shown in FIG. 21) may be driven or display an image with different driving frequencies. That is, the display device 100 may be driven at a variable driving frequency (or variable refresh rate (VRR)). For example, a fifth case CASE5 may represent a case where the display device 100 is driven at a frequency (or screen refresh rate) of 240 Hz, and a sixth case CASE6 may represent a case where the display device 100 is driven at a frequency (or screen refresh rate) of 48 Hz. Hereinafter, for convenience of description, it is assumed that one frame includes sub-frames corresponding to a frequency of 480 Hz (e.g., 2 ms).

One frame may include a write period (or Write Cycle) and a hold period (or Hold Cycle). The display device 100 (or the pixel PXL) may operate in the first mode (see FIG. 5) in the write period, and operate in the second mode (see FIG. 13) in the hold period. That is, a data signal is updated in the write period, and any data signal is not updated in the hold period. In the write period, a pre-updated data signal may be maintained. As described with reference to FIG. 13, in the hold period, the initialization operation, the compensation operation, and the data writing operation on the pixel PXL may be skipped.

As shown in FIG. 29, when an on-bias voltage is applied to the pixel PXL (or the pixel PXL_C), e.g., when the bias voltage VBIAS shown in FIG. 11 is applied (or when the on-bias voltage shown in FIG. 25 is applied to the pixel PXL_C), the threshold voltage Vth of the first transistor T1 (or the first thin film transistor M1) may be shifted in a specific direction, corresponding to the on-bias voltage. For example, the threshold voltage Vth of the first transistor T1 (or the first thin film transistor M1) may be shifted in a negative direction (i.e., Negative Shift; Nega-Shift). When the pixel PXL (or the pixel PXL_C) emits light, the threshold voltage Vth of the first transistor T1 (or the first thin film transistor M1) may be shifted in another direction, corresponding to the source-gate voltage of the first transistor T1 (or the first thin film transistor M1) of the pixel PXL (or the pixel PXL_C) in light emission. For example, the threshold voltage Vth of the first transistor T1 (or the first thin film transistor M1) of the pixel PXL (or the pixel PXL_C) emitting light may be shifted in a positive direction (i.e., Vth recovery). A value of a driving current Ids corresponding to the source-gate voltage of the first transistor T1 may increase, and the luminance of the pixel PXL may become high corresponding to the driving current Ids.

When the bias voltage VBIAS is not applied to the pixel PXL in the hold period shown in FIG. 29 (or the second mode), the voltage-current characteristic of the first transistor T1 of the pixel PXL is not initialized, and a luminance of the pixel PXL in the hold period may exhibit higher than a luminance of the pixel PXL in the write period (i.e., a luminance when the voltage-current characteristic of the first transistor T1 is initialized). When the display device 100 is driven at the frequency of 240 Hz according to the fifth case CASE5, a flicker phenomenon may occur as the luminance is changed by using two sub-frames as a cycle while the write period and the hold period (i.e., a hold period in which the bias voltage VBIAS is not applied to the pixel PXL) alternate. In particular, when the display device 100 is driven at the frequency of 48 Hz according to the sixth case CASE6, the luminance may continuously increase while the hold period (i.e., a hold period in which the bias voltage VBIAS is not applied to the pixel PXL) is continued during nine sub-frames, and a luminance change may be viewed by a user.

In order for such a luminance change (or flicker phenomenon) not to be viewed by the user, the display device 100 in accordance with the embodiments of the present disclosure may apply the bias voltage VBIAS to the pixel PXL in the hold period (or the second mode) (see FIG. 13). Since the voltage-current characteristic of the first transistor T1 is initialized by the bias voltage VBIAS even in the hold period in addition to the write period, the luminance may exhibit substantially equally in the write period and the hold period.

As described above, in the display device in accordance with the embodiments of the present disclosure, the compensation operation and the data writing operation are separated from each other, the capacitor component Cdynamic of the third transistor T3 is constantly maintained by applying a fixed voltage (e.g., the first power voltage VDD) to the active layer Active of the third transistor T3, the on-bias voltage (or on-bias amount) applied to the first transistor T1 is constantly maintained, only a variation of a data signal DATA is written to the gate electrode of the first transistor T1 by using a capacitor, an amount of driving current is controlled by using the reference voltage VREF at which no current flows, the on-bias voltage (or on-bias amount) of the first transistor T1 is increased by using the first power voltage VDD, and the bias voltage VBIAS is applied in the write period and the hold period. Accordingly, the display device 100 can sufficiently/accurately perform the compensation operation on the pixel PXL, and the high speed driving of the display device 100 is possible. In addition, a luminance change or flicker phenomenon can be prevented, which may occur in driving while varying a frequency.

FIGS. 31 to 38 are circuit diagrams illustrating other examples of the pixel included in the display device shown in FIG. 1.

Referring to FIGS. 1 to 3 and 31 to 38, each of pixels PXL_1 to PXL_8 shown in FIGS. 31 to 38 may be substantially identical or similar to the pixel PXL shown in FIG. 3, except a partial connection configuration of transistors T1 to T9. Therefore, overlapping descriptions will not be repeated.

Figure 31:
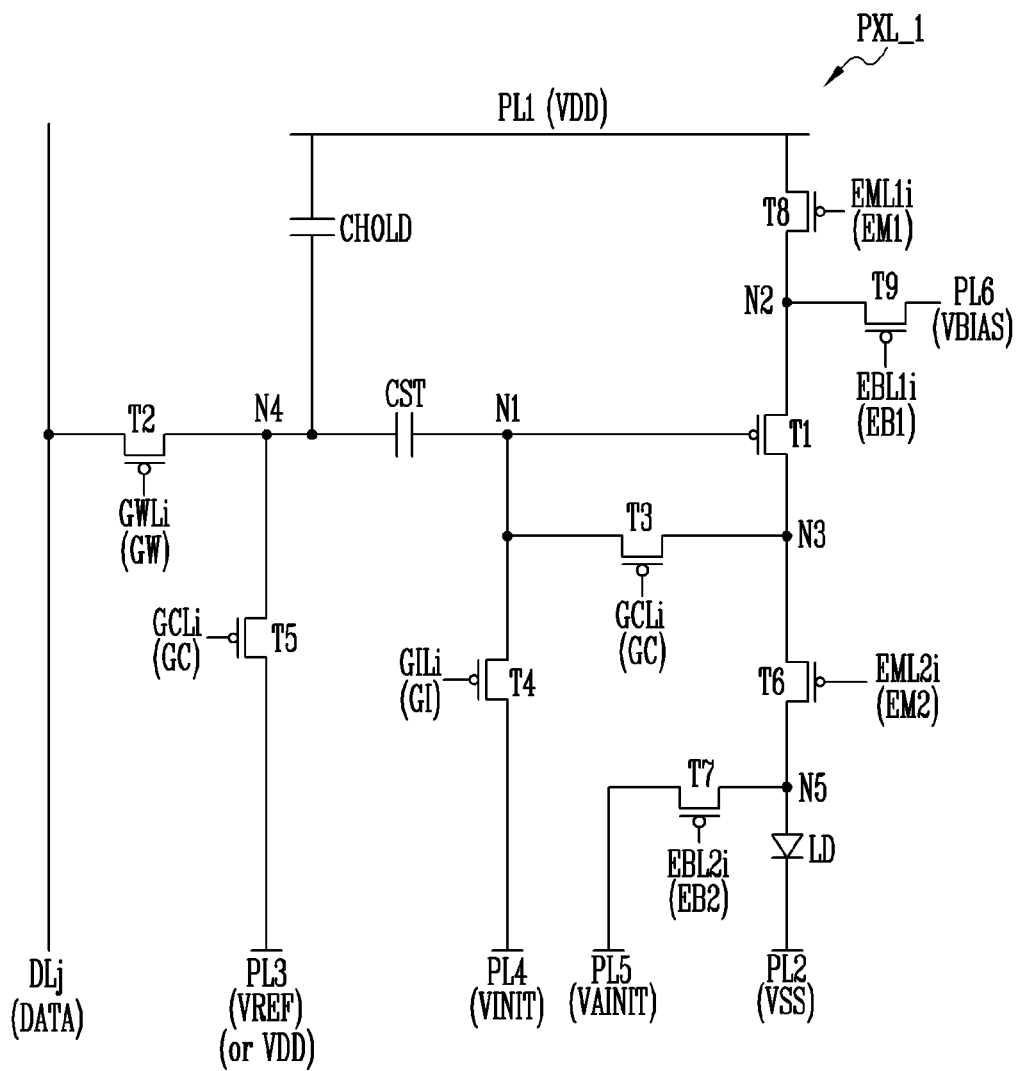
FIGS. 31, 32, 33, 34, 35, 36, 37, and 38 are circuit diagrams illustrating other examples of the pixel included in the display device shown in FIG. 1.

Referring to FIGS. 3 and 31, the first power voltage VDD instead of the reference voltage VREF may be applied to the third power line PL3 of the pixel PXL_1.

In addition, the gate electrode of the ninth transistor T9 may be connected to a first bias control line EBL1*i*, and the gate electrode of the seventh transistor T7 may be connected to a second bias control line EBL2*i*. The first bias control line EBL1*i* and the second bias control line EBL2*i* correspond to the bias control line EBLi shown in FIG. 3, but the second bias control line EBL2*i* may be different from the first bias control line EBL1*i*. The ninth transistor T9 may be operated in response to a first bias control signal EB1 applied to the first bias control line EBL1*i*, and the seventh transistor T7 may be operated in response to a second bias control signal EB2 applied to the second bias control line EBL2*i*. The first bias control signal EB1 and the second bias control signal EB2 correspond to the bias control signal EB shown in FIG. 5. However, the first bias control signal EB1 and the second bias control signal EB2 (or pulse widths or application timings thereof) may be different from each other.

The embodiment shown in FIG. 31 may be at least partially applied to embodiments shown in FIGS. 32 to 38.

Figure 32:
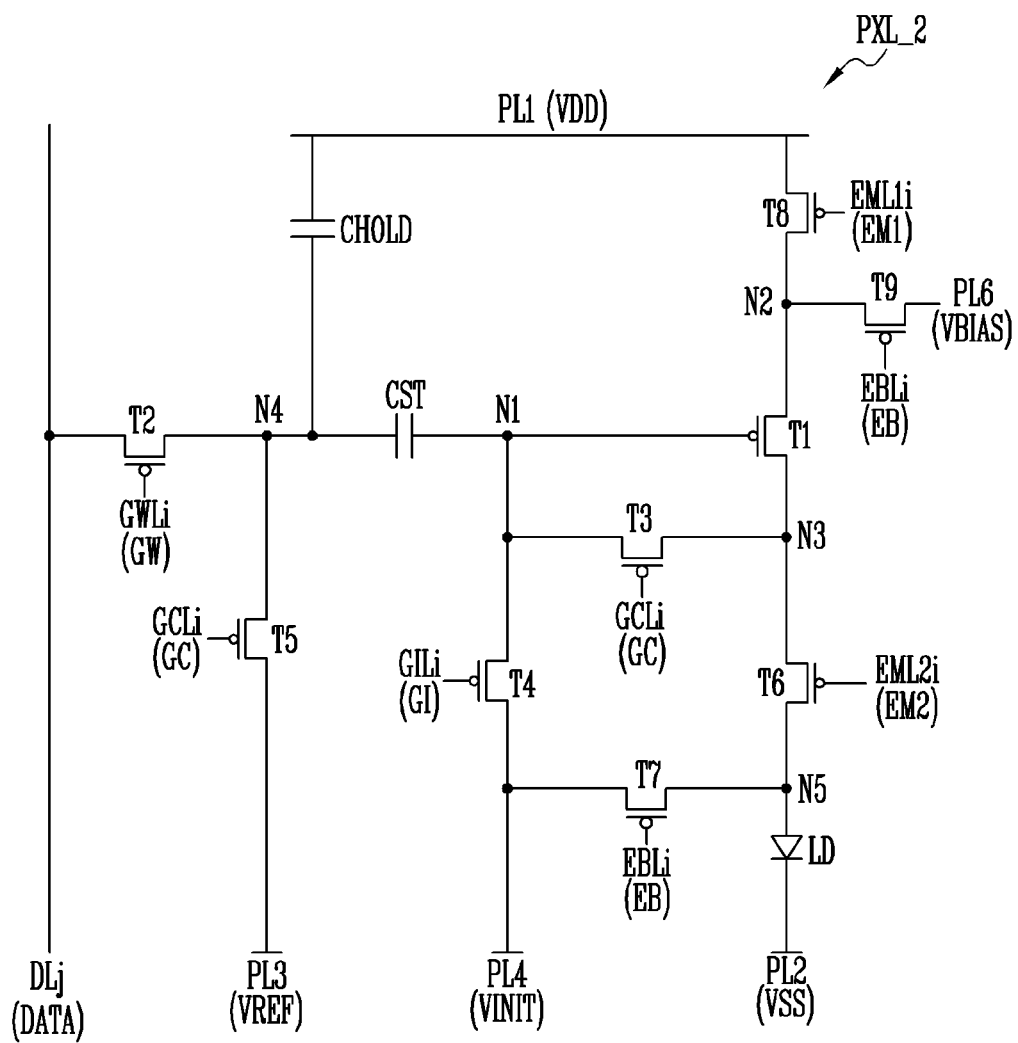

Referring to FIGS. 3 and 32, the second electrode of the seventh transistor T7 of the pixel PXL_2 may be connected to the fourth power line PL4. The fifth power line PL5 shown in FIG. 3 may be omitted.

Figure 33:
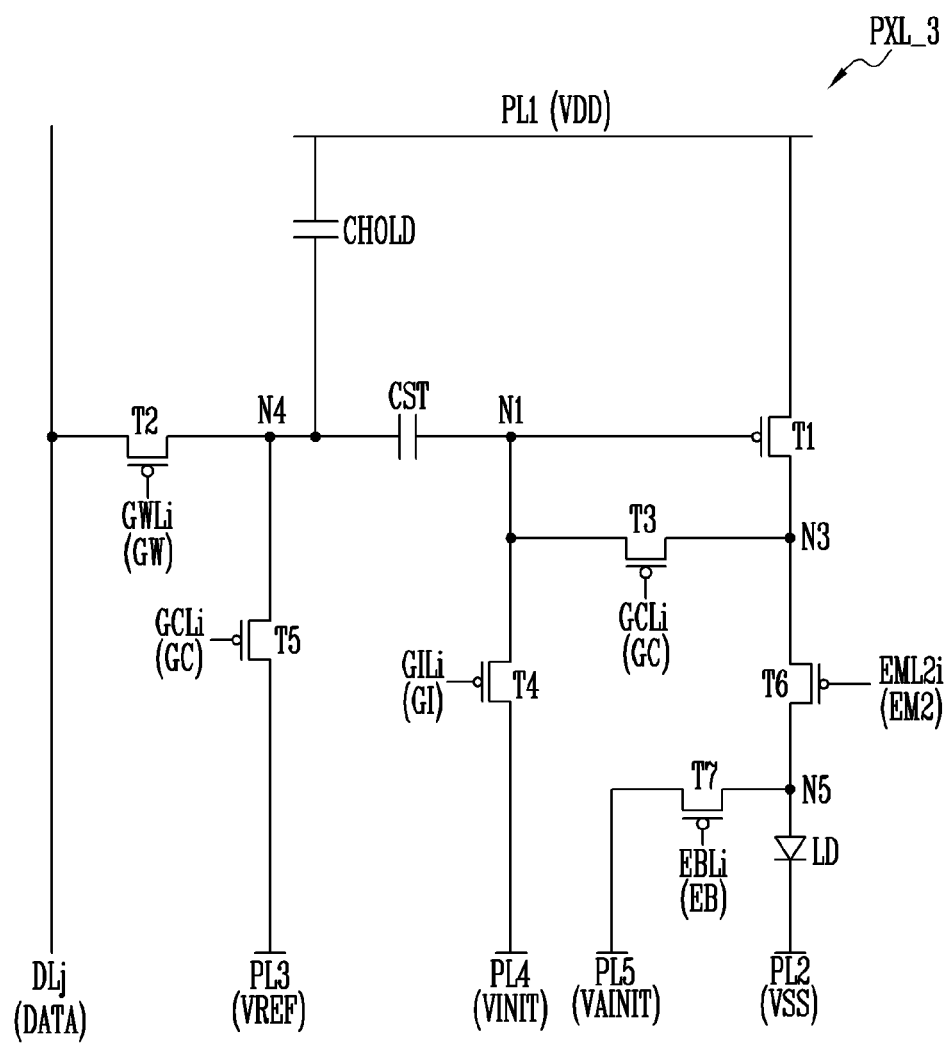

Referring to FIGS. 3 and 33, the pixel PXL_3 may not include the eighth transistor T8 and the ninth transistor T9. For example, when the display device 100 (see FIG. 1) does not use any variable driving frequency, the eighth transistor T8 and the ninth transistor T9 may be omitted.

Figure 34:
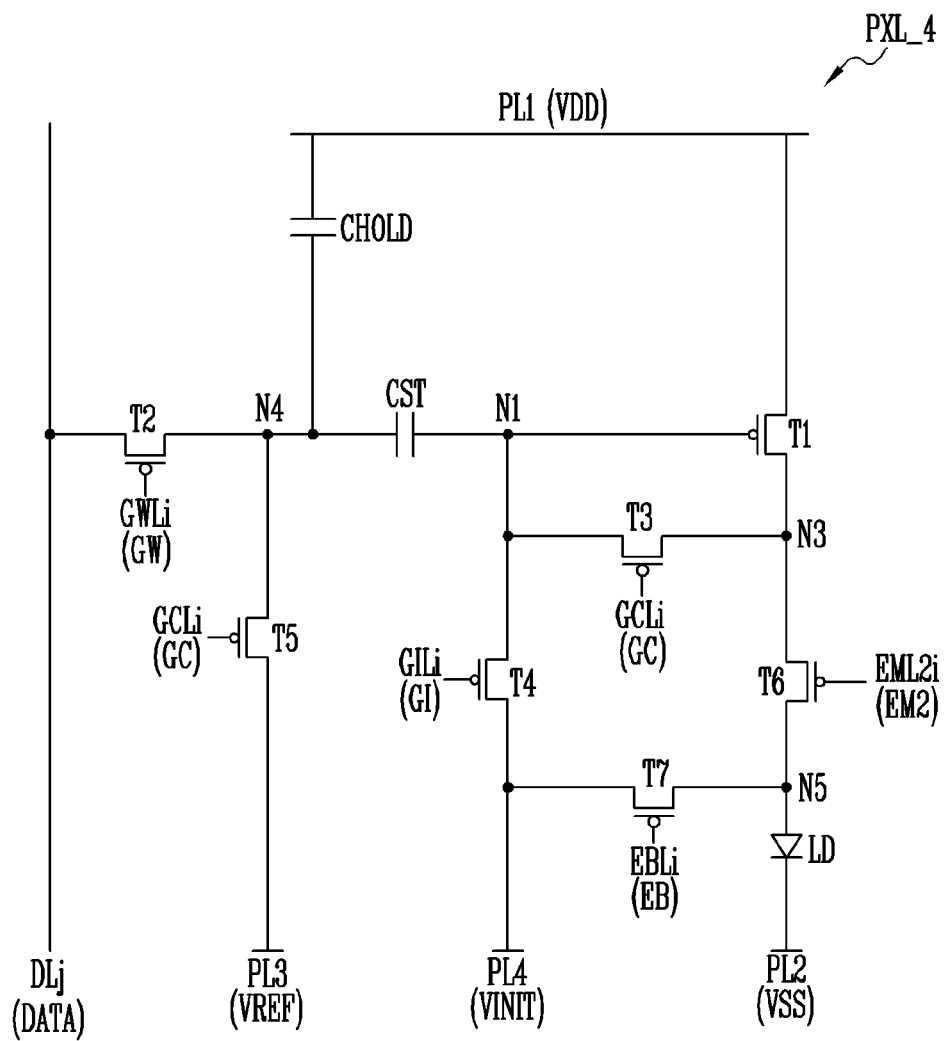

Referring to FIGS. 3 and 34, the second electrode of the seventh transistor T7 of the pixel PXL_4 may be connected to the fourth power line PL4. The fifth power line PL5, the eighth transistor T8, and the ninth transistor T9 shown in FIG. 3 may be omitted.

Figure 35:
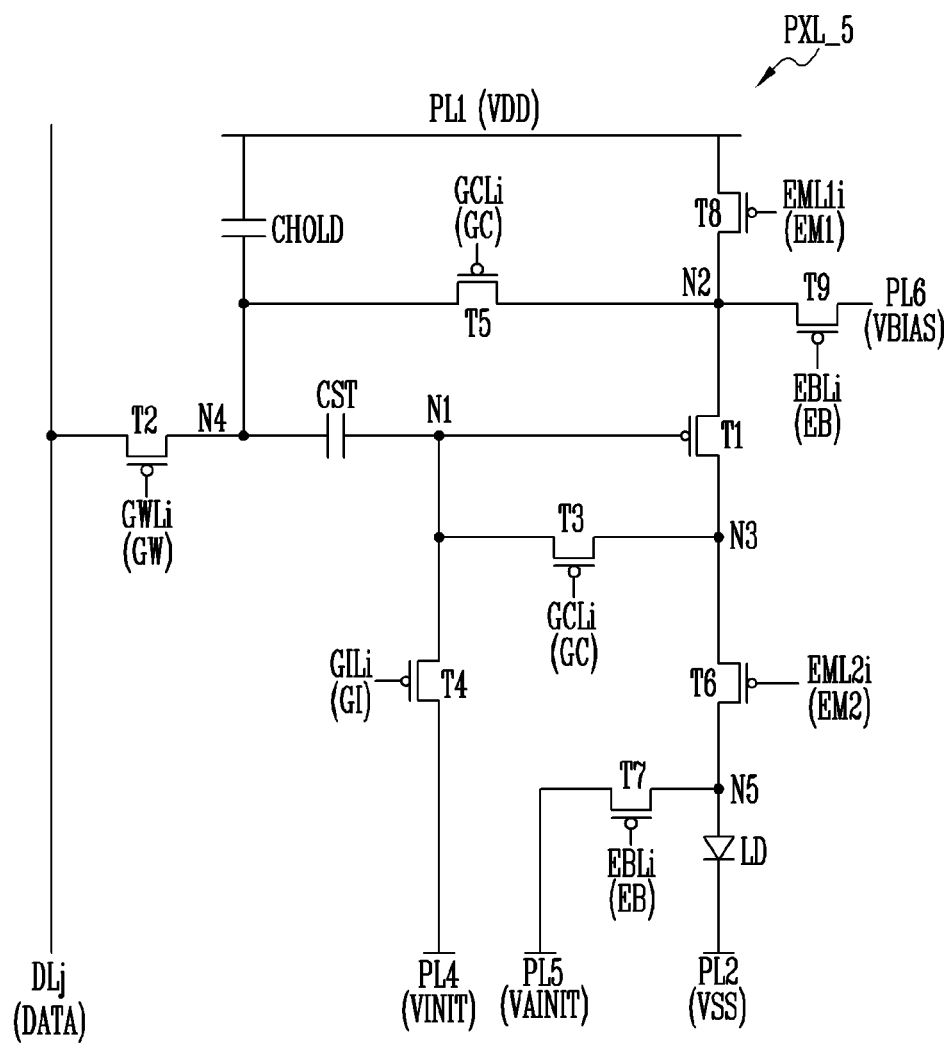

Referring to FIGS. 3 and 35, the second electrode of the fifth transistor T5 of the pixel PXL_5 may be connected to the second node N2. When the fifth transistor T5 is turned on, the first power voltage VDD instead of the reference voltage VREF may be applied to the fourth node N4. That is, the fourth node N4 may be initialized by the first power voltage VDD in the compensation operation described with reference to FIGS. 7 and 9.

Figure 36:
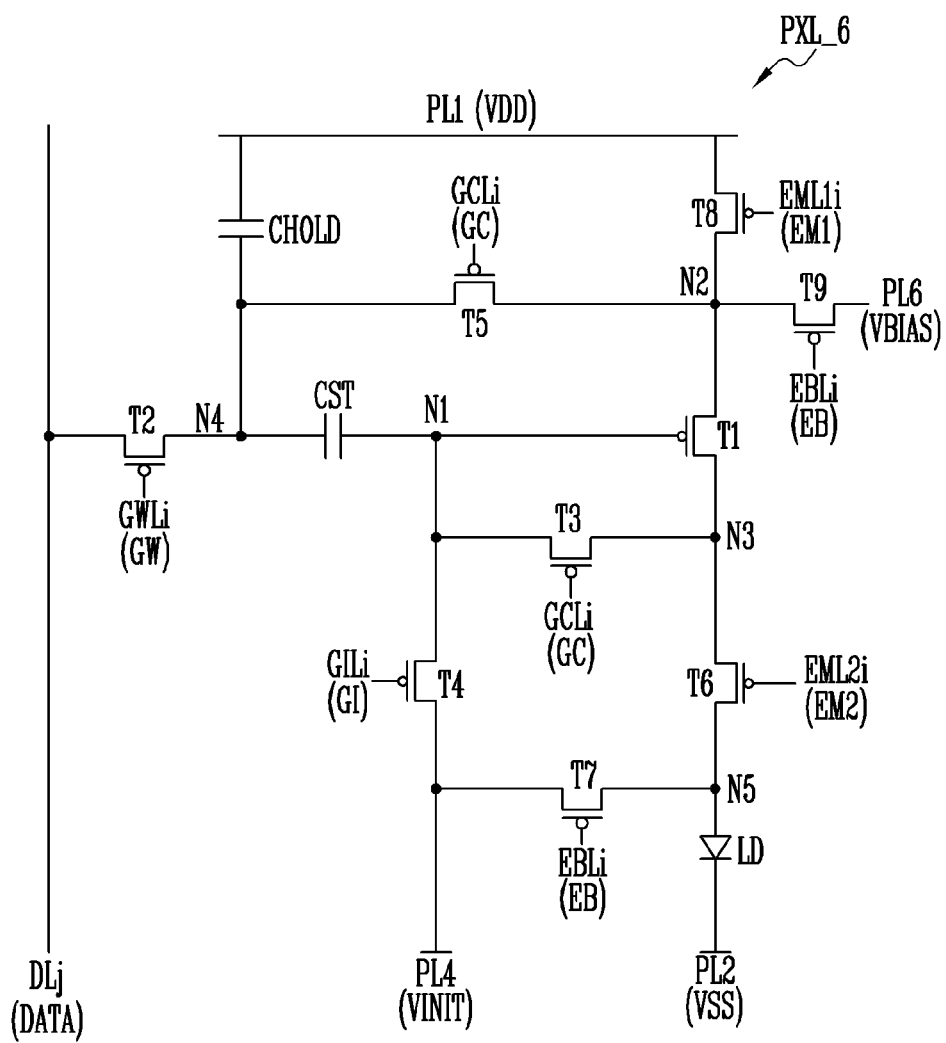

Referring to FIGS. 3, 35, and 36, the second electrode of the seventh transistor T7 of the pixel PXL_6 may be connected to the fourth power line PL4. The fifth power line PL5 shown in FIG. 35 may be omitted.

Figure 37:
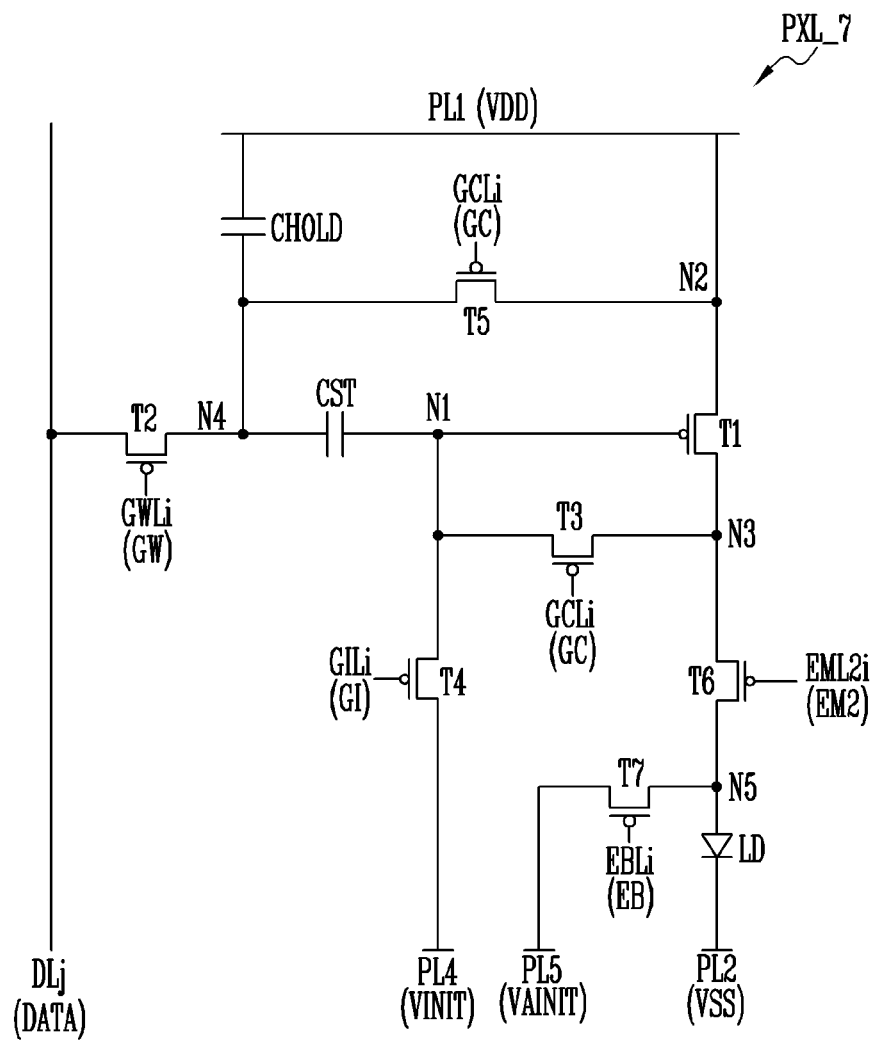

Referring to FIGS. 3, 35, and 37, the pixel PXL_7 may not include the eighth transistor T8 and the ninth transistor T9, which are shown in FIG. 35.

Figure 38:
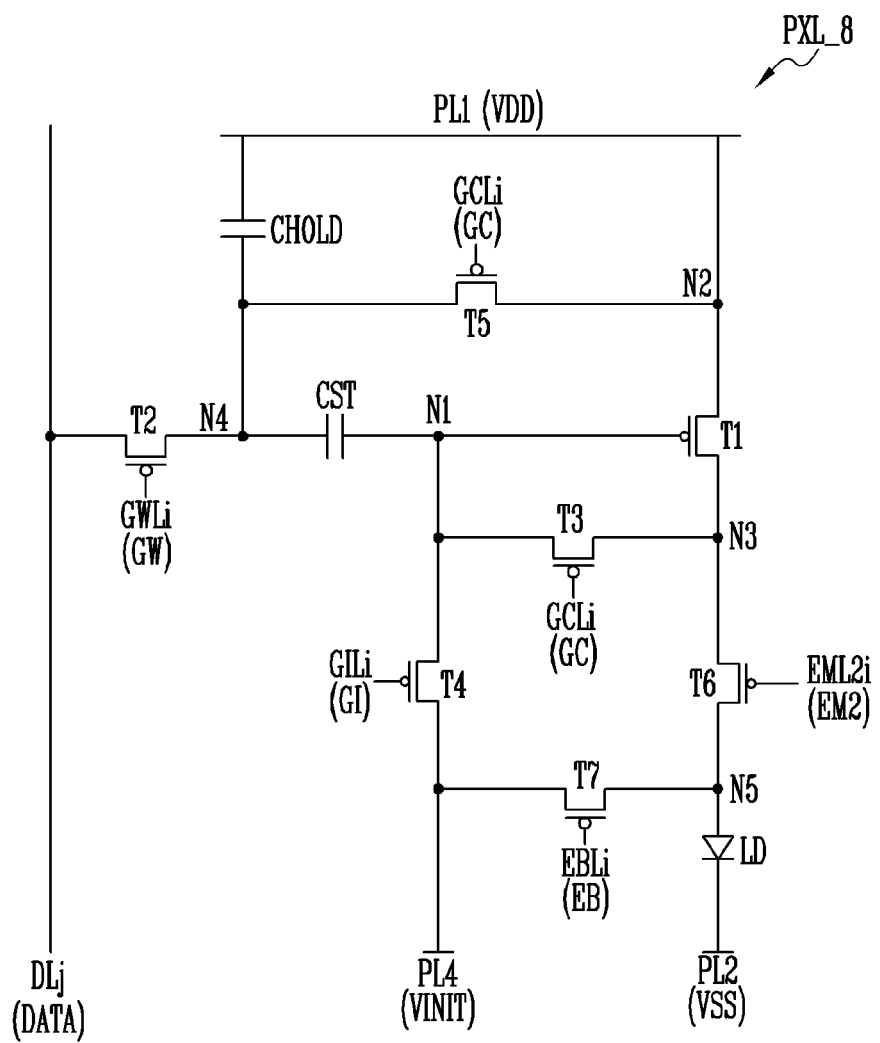

Referring to FIGS. 3, 37, and 38, the second electrode of the seventh transistor T7 of the pixel PXL_8 may be connected to the fourth power line PL4. The fifth power line PL5 shown in FIG. 37 may be omitted.

As described above, a partial configuration of each of the pixels PXL_1 to PXL_8 may be variously changed or omitted.

Figure 39:
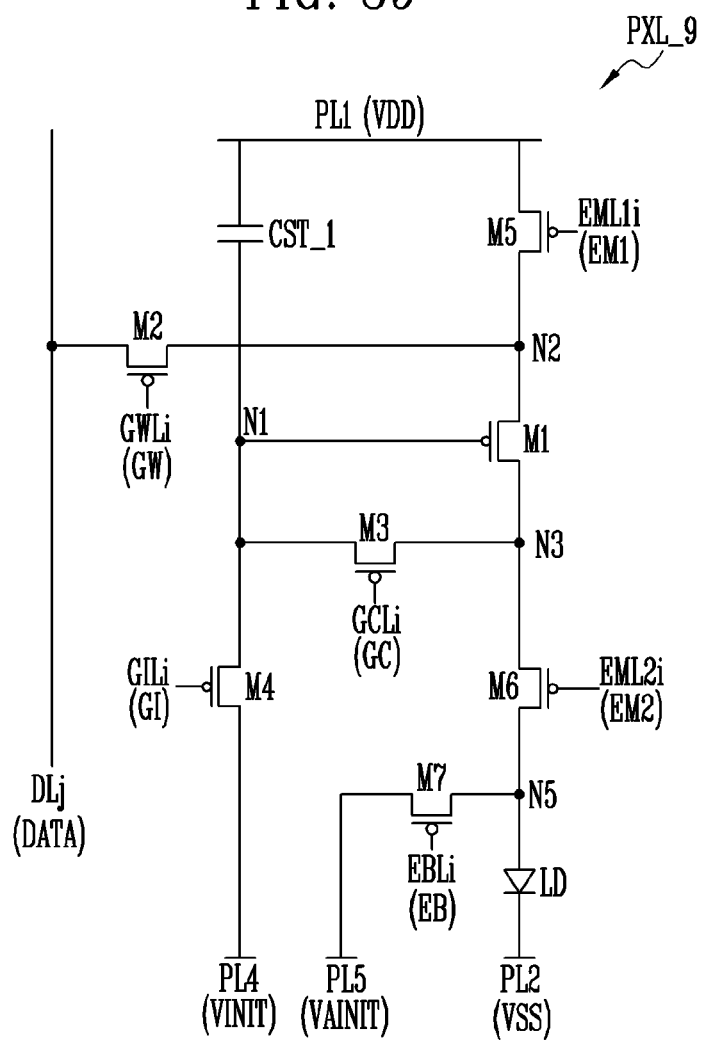
FIG. 39 is a circuit diagram illustrating still another example of the pixel included in the display device shown in FIG. 1.
Figure 40:
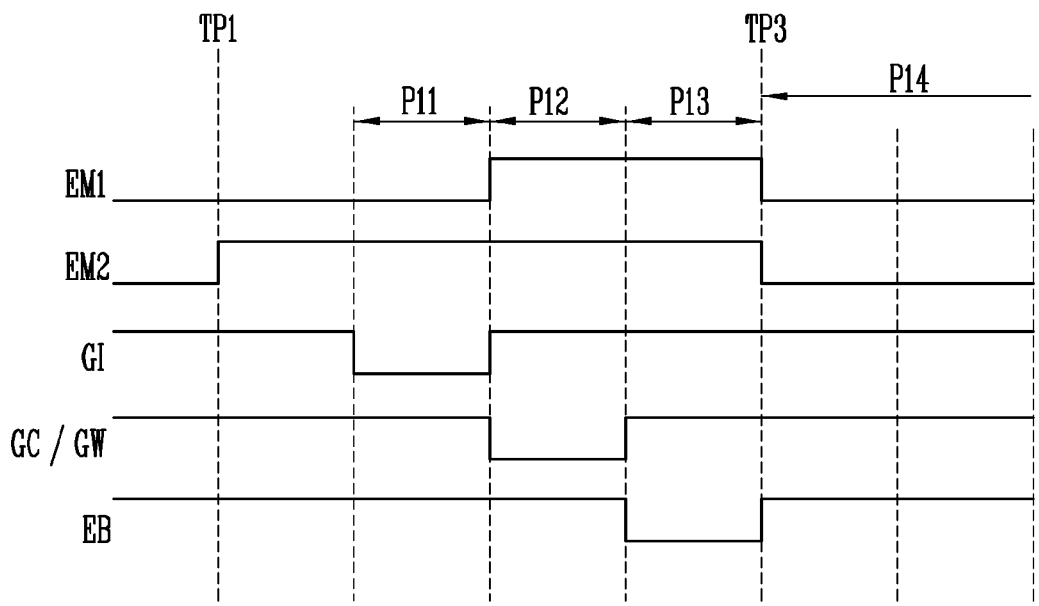
FIG. 40 is a waveform diagram illustrating an example of signals provided to a pixel shown in FIG. 39 in the first mode.
Figure 41:
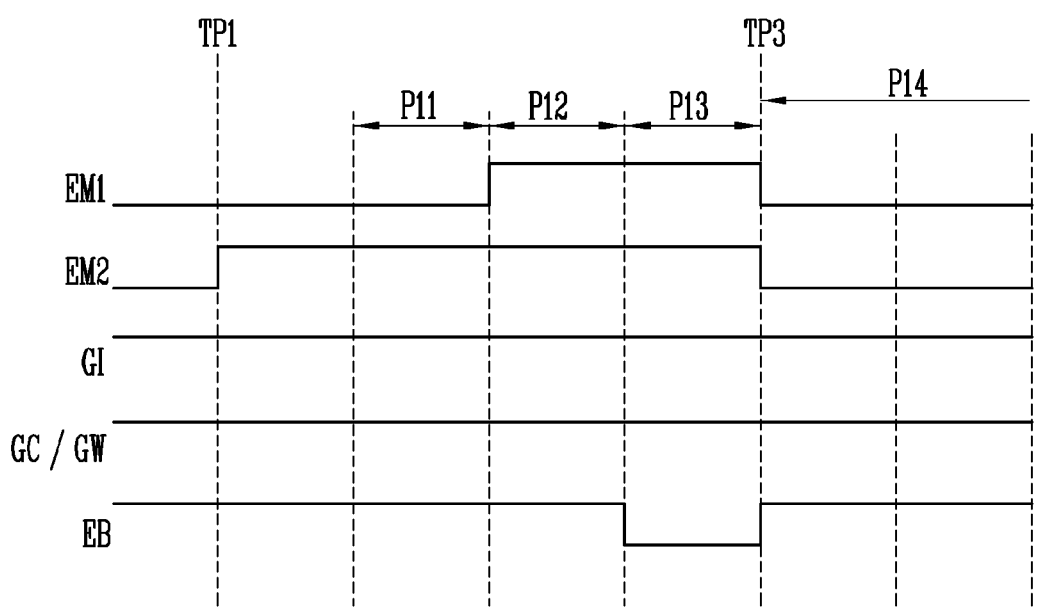
FIG. 41 is a waveform diagram illustrating an example of signals provided to the pixel shown in FIG. 39 in the second mode.

FIG. 39 is a circuit diagram illustrating still another example of the pixel included in the display device shown in FIG. 1. FIG. 40 is a waveform diagram illustrating an example of signals provided to a pixel shown in FIG. 39 in the first mode. FIG. 41 is a waveform diagram illustrating an example of signals provided to the pixel shown in FIG. 39 in the second mode.

Referring to FIGS. 21, 22, and 39 to 41, a pixel PXL_9 shown in FIG. 39 may be substantially identical or similar to the pixel PXL_C shown in FIG. 21, except the fifth thin film transistor M5. Signals shown in FIGS. 40 and 41 have been described with reference to FIG. 22, except the first emission control signal EM1. Therefore, overlapping description will not be repeated.

The gate electrode of the fifth thin film transistor M5 of the pixel PXL_9 may be connected to the first emission control line EML1*i*. The fifth thin film transistor M5 may be turned off when the first emission control signal EM1 having the gate-off voltage level is supplied to the first emission control line EML1*i*, and be turned on when the second emission control signal EM2 having the gate-on voltage level is supplied to the second emission control line EML2*i*.

As shown in FIGS. 40 and 41, the first emission control signal EM1 may have the gate-off voltage level in the twelfth period P12 and the thirteen period P13, and have the gate-on voltage level in the other period (e.g., the eleventh period P11 and the fourteenth period P14).

In the eleventh period P11 of the first mode, the fifth thin film transistor M5 may be turned on in response to the first emission control signal EM1 having the gate-on voltage level, and the first power voltage VDD may be applied to the first electrode of the first transistor T1. Similarly to as described with reference to FIG. 28, the first electrode of the first thin film transistor M1 of the pixel PXL_9 is directly connected to the first power line PL1 and is non-floated. Thus, the on-bias voltage (or on-bias amount) of the first thin film transistor M1 is increased, and the step efficiency can be improved or enhanced.

In the twelfth period P12 of the first mode, the fifth thin film transistor M5 may be turned off in response to the first emission control signal EM1 having the gate-off voltage level. Thus, a data signal transferred to the first electrode of the first thin film transistor M1 in response to the write gate signal GW can be prevented from colliding (or being short-circuited) with the first power voltage VDD. That is, in the twelfth period P12 of the first mode, the data writing operation (and the compensation operation) can be normally performed.

In the second mode, the initialization operation, the compensation operation, and the data writing operation may be skipped. To this end, in the non-emission period of the second mode, the initialization gate signal GI, the compensation gate signal GC, and the write gate signal GW may be maintained at the gate-off voltage level.

As described above, in the initialization operation on the pixel PXL_9, the first electrode of the first thin film transistor M1 is connected to the first power line PL1. Thus, the on-bias voltage (or on-bias amount) of the first thin film transistor M1 is increased, and the step efficiency can be improved or enhanced.

In the display device in accordance with the present disclosure, a compensation operation of compensating for a threshold voltage of a first transistor (or driving transistor) and a data writing operation of writing a data signal to a gate electrode of the first transistor are separately performed, and the compensation operation is repeated twice or more before the data signal is written. Thus, a component (or influence) of a previous data voltage can be removed from a voltage applied to the gate electrode of the first transistor, and the threshold voltage of the first transistor can be more accurately compensated.

Also, in the display device in accordance with the present disclosure, a fixed bias voltage is cyclically applied to the first transistor through a ninth transistor, and a voltage-current characteristic of the first transistor can be cyclically initialized. Even when the display device is driven at a low frequency, a luminance change (or flicker phenomenon) caused by a change in the voltage-current characteristic of the first transistor can be reduced, and the display device can display an image with a constant luminance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, or elements described in connection with a particular embodiment may be used singly or in combination with features, characteristics, or elements described in connection with other embodiments unless otherwise specifically indicated. Accordingly, it will be understood by those of skill in the art that various changes in form and details may be made without departing from the spirit and scope of the following claims.

What is claimed is:

1. A display device comprising a pixel,
wherein the pixel includes:
a first transistor configured to control an amount of driving current flowing thorough a light emitting element;
a first capacitor electrically connected to a gate electrode of the first transistor;
a second capacitor including a first electrode electrically connected to the first capacitor and a second electrode electrically connected to a first power line;
a second transistor configured to provide a data signal to the first capacitor in response to a signal of a first gate line;
a third transistor configured to electrically connect to the first transistor and the first power line in response to a first control signal;
a fourth transistor configured to electrically connect the first transistor and a bias power line in response to a second control signal;
a fifth transistor configured to electrically connect the first transistor and the light emitting element in response to a third control signal; and
the light emitting element;
wherein the third control signal is different from the first control signal.

2. The display device of claim 1, further comprising:
a sixth transistor configured to diode-connect the first transistor in response to a signal of a second gate line; and
a seventh transistor configured to electrically connect the first capacitor and a first initialization power line in response to a signal of a third gate line.

3. The display device of claim 2, further comprising an eighth transistor configured to electrically connect the first capacitor and a third power line in response to the signal of the second gate line.

4. The display device of claim 3, wherein the first power line and the third power line are operable to receive power voltages equal to or different from each other.

5. The display device of claim 3, further comprising a seventh transistor configured to electrically connect the light emitting element and a second initialization power line in response to the third control signal.

6. The display device of claim 3, wherein at least one of the second transistor, the sixth transistor, the seventh transistor, and the eighth transistor is implemented as a dual gate transistor including a plurality of sub-transistors connected in series.

7. The display device of claim 3, further comprising a gate driver,
wherein the gate driver is operable to alternately provide a gate-on voltage to the third gate line and the second gate line in a non-emission period of one frame, and provide the gate-on voltage to the second gate line twice or more in the non-emission period.

8. The display device of claim 7,
wherein the gate driver is operable to:
provide a gate-off voltage to a fourth gate line to which the third control signal is applied in the non-emission period;
provide a pulse of the gate-on voltage to the second gate line in each of a second period and a fourth period;
provide the pulse of the gate-on voltage to the third gate line in a third period; and
provide the pulse of the gate-on voltage to the first gate line in a fifth period
wherein the non-emission period includes a first period, the second period, the third period, the fourth period, the fifth period, and the sixth period, which do not overlap with each other and are sequentially arranged.

9. The display device of claim 8, wherein the gate driver is operable to provide the pulse of the gate-on voltage to the third gate line in the first period.

10. The display device of claim 8, wherein a pulse width of the signal of the second gate line and a pulse width of the signal of the third gate line are the same, and
wherein a pulse width of the signal of the first gate line is smaller than the pulse width of the signal of the second gate line.

11. The display device of claim 8, wherein the gate driver is operable to:
provide the gate-on voltage to a fifth gate line to which the first control signal is applied in the first to fourth periods; and
provide the gate-off voltage to the fifth gate line in the fifth period and the sixth period.

12. The display device of claim 11, wherein the gate driver is operable to provide the pulse of the gate-on voltage to a sixth gate line to which the second control signal is applied in the sixth period.

13. The display device of claim 12, wherein a pulse width of the second control signal is greater than the pulse width of the signal of the first gate line.

14. The display device of claim 12, wherein the second control signal has a plurality of pulses in the sixth period.

15. The display device of claim 8, wherein a pulse width of the signal of the first gate line is greater than 1 horizontal period.

16. The display device of claim 8, wherein a pulse width of the signal of the second gate line and a pulse width of the signal of the third gate line are different from each other.

17. The display device of claim 3, further comprising a ninth transistor configured to electrically connect the light emitting element and a second initialization power line in response to a fourth control signal different from the second control signal.

18. The display device of claim 3, further comprising a ninth transistor configured to electrically connect the light emitting element and the first initialization power line in response to the second control signal.

19. The display device of claim 2, further comprising an eighth transistor configured to electrically connect the first capacitor and a first electrode of the first transistor in response to the signal of the second gate line.

20. The display device of claim 19, further comprising a ninth transistor configured to electrically connect the light emitting element and a second initialization power line in response to the second control signal.

21. The display device of claim 19, further comprising a ninth transistor configured to electrically connect the light emitting element and the first initialization power line to the light emitting element in response to the second control signal.

22. A display device comprising a pixel,
wherein the pixel includes:
a first transistor configured to control an amount of driving current flowing thorough a light emitting element;
a first capacitor electrically connected to a gate electrode of the first transistor;
a second capacitor including a first electrode electrically connected to the first capacitor and a second electrode electrically connected to a first power line;
a second transistor configured to provide a data signal to the first capacitor in response to a signal of a first gate line;
a third transistor configured to diode-connect the first transistor in response to a signal of a second gate line;
a fourth transistor configured to electrically connect the first capacitor and a first initialization power line in response to a signal of a third gate line;
an emission transistor configured to electrically connect the first transistor and the light emitting element in response to a first control signal;
a fifth transistor configured to electrically connect the light emitting element and a second initialization power line in response to a second control signal; and
a light emitting element,
wherein the second initialization power line is different from the first initialization power line.

23. The display device of claim 22, further comprising a sixth transistor configured to electrically connect the first capacitor and a third power line in response to the signal of the second gate line.

24. The display device of claim 23, wherein the first power line and the third power line are operable to receive power voltages equal to or different from each other.

25. The display device of claim 22, further comprising a sixth transistor configured to electrically connect the first capacitor and a first electrode of the first transistor in response to the signal of the second gate line.

26. A display device comprising a pixel,
wherein the pixel includes:
a first transistor configured to control an amount of driving current flowing thorough a light emitting element;
a first capacitor including a first electrode electrically connected to a gate electrode of the first transistor and a second electrode electrically connected to a first power line;
a second transistor configured to write a data signal to the first capacitor in response to a signal of a first gate line;
a third transistor configured to diode-connect the first transistor in response to a signal of a second gate line;
a fourth transistor configured to electrically connect the first capacitor and a first initialization power line in response to a signal of a third gate line;
an fifth transistor configured to electrically connect the first transistor and the first power line in response to a first control signal;
a sixth transistor configured to electrically connect the first transistor and the light emitting element in response to a second control signal; and
a light emitting element,
wherein the second control signal is different from the first control signal.

27. The display device of claim 26, further comprising a seventh transistor configured to electrically connect the light emitting element and a second initialization power line in response to a third control signal.

28. The display device of claim 26, further comprising a gate driver,
wherein the gate driver is operable to:
provide a gate-off voltage to a fourth gate line to which the second control signal is applied in the non-emission period;
provide a pulse of a gate-on voltage to the third gate line and provides the gate-on voltage to a fifth gate line to which the first control signal in a first period; and
provide the pulse of the gate-on voltage to the second gate line, provides the pulse of the gate-on voltage to the first gate line, and provides the gate-off voltage to the fifth gate line in the second period,
wherein the non-emission period of a frame includes the first period, a second period, and a third period, which do not overlap with each other and are sequentially arranged.

* * * * *